United States Patent
Sato (12)

(10) Patent No.: US 9,494,876 B2
(45) Date of Patent: *Nov. 15, 2016

(54) EXPOSURE APPARATUS, EXPOSURE METHOD, METHOD OF MANUFACTURING DEVICE, PROGRAM, AND STORAGE MEDIUM

(71) Applicant: NIKON CORPORATION, Tokyo (JP)

(72) Inventor: Shinji Sato, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/141,429

(22) Filed: Apr. 28, 2016

(65) Prior Publication Data

US 2016/0238952 A1 Aug. 18, 2016

Related U.S. Application Data

(62) Division of application No. 13/552,140, filed on Jul. 18, 2012, now Pat. No. 9,329,496.

(60) Provisional application No. 61/653,032, filed on May 30, 2012, provisional application No. 61/514,243, filed on Aug. 2, 2011.

(30) Foreign Application Priority Data

Jul. 21, 2011 (JP) .................................. 2011-159999
May 22, 2012 (JP) .................................. 2012-116713

(51) Int. Cl.
*G03B 27/32* (2006.01)
*G03B 27/52* (2006.01)
(Continued)

(52) U.S. Cl.
CPC ....... *G03F 7/70716* (2013.01); *G03F 7/70341* (2013.01)

(58) Field of Classification Search
CPC ........... G03F 7/70341; G03F 7/70716; H01L 21/682
USPC ............................. 310/12.06; 355/30, 72, 77
See application file for complete search history.

(56) References Cited

U.S. PATENT DOCUMENTS 6,208,407 B1  3/2001  Loopstra
6,262,796 B1  7/2001  Loopstra et al.
(Continued)

FOREIGN PATENT DOCUMENTS

EP  1 641 028 A1  3/2006
EP  1 699 073 A1  9/2006
(Continued)

OTHER PUBLICATIONS

Aug. 28, 2015 Office Action issued in Chinese Application No. 201280042481.1.
(Continued)

*Primary Examiner* — Colin Kreutzer
(74) *Attorney, Agent, or Firm* — Oliff PLC

(57) ABSTRACT

An exposure apparatus exposes an upper surface of a substrate with exposure light through liquid, and includes an optical member that has an emitting surface from which the exposure light is emitted; and a substrate holding apparatus having a holding portion that releasably holds a lower surface of the substrate, and an upper surface provided around the holding portion. The upper surface of the substrate holding apparatus is configured such that the upper surface of the substrate holding apparatus and the upper surface of the substrate held by the holding portion are substantially in a plane. The upper surface of the substrate holding apparatus has a jagged edge portion. The substrate is held by the holding portion such that an edge portion of the substrate held by the holding portion is located along the jagged edge portion of the upper surface of the substrate holding apparatus.

52 Claims, 33 Drawing Sheets

(51) Int. Cl.
*G03B 27/58* (2006.01)
*G03F 7/20* (2006.01)

(56) References Cited

U.S. PATENT DOCUMENTS

| | | |
|---|---|---|
| 6,341,007 B1 | 1/2002 | Nishi et al. |
| 6,452,292 B1 | 9/2002 | Binnard |
| 6,611,316 B2 | 8/2003 | Sewell |
| 6,778,257 B2 | 8/2004 | Bleeker et al. |
| 6,897,963 B1 | 5/2005 | Taniguchi et al. |
| 7,292,313 B2 | 11/2007 | Poon et al. |
| 7,483,119 B2 | 1/2009 | Owa et al. |
| 7,982,857 B2 | 7/2011 | Nishii et al. |
| 9,329,496 B2 | 5/2016 | Sato |
| 2005/0219488 A1 | 10/2005 | Nei et al. |
| 2006/0023186 A1 | 2/2006 | Binnard |
| 2006/0139614 A1 | 6/2006 | Owa et al. |
| 2007/0109521 A1 | 5/2007 | Nishii et al. |
| 2007/0127006 A1 | 6/2007 | Shibazaki |
| 2007/0132976 A1 | 6/2007 | Nagasaka |
| 2007/0177125 A1 | 8/2007 | Shibazaki |
| 2007/0288121 A1 | 12/2007 | Shibazaki |
| 2008/0043211 A1 | 2/2008 | Poon et al. |
| 2008/0049209 A1 | 2/2008 | Nagasaka et al. |
| 2008/0100812 A1 | 5/2008 | Poon et al. |
| 2010/0277709 A1 | 11/2010 | Stavenga et al. |

FOREIGN PATENT DOCUMENTS

| | | |
|---|---|---|
| EP | 1 713 113 A1 | 10/2006 |
| EP | 1 768 170 A1 | 3/2007 |
| JP | 2005-101488 A | 4/2005 |
| JP | 2005-191344 A | 7/2005 |
| JP | 2006-202825 A | 8/2006 |
| JP | 2010-040702 A | 2/2010 |
| JP | 2010-219525 A | 9/2010 |
| WO | 01/35168 A1 | 5/2001 |
| WO | 2004/019128 A2 | 3/2004 |
| WO | 2004/112108 A1 | 12/2004 |
| WO | 2005/057636 A1 | 6/2005 |

OTHER PUBLICATIONS

Feb. 23, 2016 Office Action issued in Chinese Patent Application No. 201280042481.1.
Sep. 2, 2014 Office Action issued in Japanese Application No. 2013-524742.
Oct. 23, 2012 Search Report issued in International Patent Application No. PCT/JP2012/068316.
Oct. 23, 2012 Written Opinion issued in International Patent Application No. PCT/JP2012/068316.
Aug. 21, 2012 "Invitation to pay additional fees and, where applicable, protest fee" issued in International Application No. PCT/JP2012/068316.
Oct. 5, 2015 Restriction Requirement issued in U.S. Appl. No. 13/552,140.
Dec. 14, 2015 Notice of Allowance issued in U.S. Appl. No. 13/552,140.
May 10, 2016 Office Action issued in Japanese Patent Application No. 2015-075639.

EXPOSURE APPARATUS, EXPOSURE METHOD, METHOD OF MANUFACTURING DEVICE, PROGRAM, AND STORAGE MEDIUM

CROSS-REFERENCE TO RELATED APPLICATION

This is a Divisional of U.S. application Ser. No. 13/552,140 filed Jul. 18, 2012 (now U.S. Pat. No. 9,329,496) which claims priority to and the benefit of U.S. Provisional Application No. 61/514,243, filed Aug. 2, 2011, and U.S. Provisional Application No. 61/653,032 filed on May 30, 2012. U.S. application Ser. No. 13/552,140 also claims priority to Japanese Patent Application No. 2011-159999 filed on Jul. 21, 2011 and Japanese Patent Application No. 2012-116713 filed on May 22, 2012. The entire contents of each of the applications identified above are incorporated herein by reference.

BACKGROUND

1. Field of the Invention

The present invention relates to an exposure apparatus, an exposure method, a device manufacturing method, a program, and a storage medium.

2. Description of Related Art

In a process of manufacturing a micro device such as a semiconductor device, and an electronic device, a liquid immersion exposure apparatus is used which exposes a substrate with exposure light with liquid in between, as disclosed in the United States Patent Application, Publication No. 2008/0043211, United States Patent Application, Publication No. 2008/0100812 and the like. The exposure apparatus includes a movable substrate stage holding a substrate, and exposes the substrate held by the substrate stage.

SUMMARY

In a liquid immersion exposure apparatus, there is a likelihood that an exposure defect occurs, for example, if liquid remains behind on at least one of an upper surface of a substrate and an upper surface of a substrate stage. As a result, a defective device may occur.

An object of aspects of the present invention is to provide an exposure apparatus for and an exposure method of suppressing an occurrence of an exposure defect. Another object of aspects of the present invention is to provide a device manufacturing method of, a program for, and a storage medium for suppressing an occurrence of a defective device.

According to a first aspect of the present invention, there is provided an exposure apparatus for exposing a substrate with exposure light through liquid, including: an optical member that has an emitting surface from which exposure light is emitted; a substrate holding apparatus that includes: a first holding portion that holds a lower surface of the substrate in such a manner that the lower surface of the substrate can be released, and a first member that defines an opening where the substrate can be arranged, and that has an upper surface which is arranged at a vicinity of an upper surface of the substrate in a state in which the substrate is held by the first holding portion; and a porous member of which at least a part is arranged at a gap between the substrate and the first member, and which has an upper surface liquid-repellent with respect to the liquid, wherein at least a part of the liquid which flows into the gap is recovered through the porous member.

According to a second aspect of the present invention, there is provided an exposure apparatus for exposing a substrate with exposure light through liquid, including: an optical member that has an emitting surface from which exposure light is emitted; a substrate holding apparatus that includes: a first holding portion that holds a lower surface of the substrate in such a manner that the lower surface of the substrate can be released, and a first member that defines an opening where the substrate can be arranged, and that has an upper surface which is arranged at a vicinity of an upper surface of the substrate in a state in which the substrate is held by the first holding portion; and a plurality of recovery ports, arranged at a vicinity of at least one of the substrate and the first holding member, through which at least a part of the liquid which flows into a gap between the substrate and the first member is recovered, wherein the substrate and the first member are moved in a state in which a liquid immersion space of the liquid is formed at an emitting surface side of the optical member, and recovery of the liquid through some of recovery ports among a plurality of recovery ports is performed, based on any one of or both of a position of the gap with respect to the liquid immersion space and a movement condition of the gap with respect to the liquid immersion space.

According to a third aspect of the present invention, there is provided an exposure apparatus for exposing a substrate with exposure light through liquid, including: an optical member that has an emitting surface from which exposure light is emitted; a substrate holding apparatus that includes: a first holding portion that holds a lower surface of the substrate in such a manner that the lower surface of the substrate can be released, and a first member that defines an opening where the substrate can be arranged, and that has an upper surface which is arranged at a vicinity of an upper surface of the substrate in a state in which the substrate is held by the first holding portion; and a recovery port, arranged in such a manner as to face a side surface of the substrate, and recovers at least a part of the liquid which flows into a gap between the substrate and the first member.

According to a fourth aspect of the present invention, there is provided an exposure apparatus for exposing a substrate with exposure light through liquid, including: an optical member that has an emitting surface from which exposure light is emitted, and a substrate holding apparatus that includes: a first holding portion that holds a lower surface of the substrate in such a manner that the lower surface of the substrate can be released, and a first member that defines an opening where the substrate can be arranged, and that has an upper surface which is arranged at a vicinity of an upper surface of the substrate in a state in which the substrate is held by the first holding portion, wherein an opening of the first member includes: a first area, positioned at a first distance from a center of the first holding member, where a side surface of the substrate held by the first holding portion can face, and a second area, arranged adjacent to the first area, positioned at a second distance longer than the first distance from the center of the first holding member.

According to a fifth aspect of the present invention, there is provided an exposure apparatus for exposing a substrate with exposure light through liquid, including: an optical member that has an emitting surface from which exposure light is emitted; and a substrate holding apparatus that includes: a first holding portion that holds a lower surface of the substrate in such a manner that the lower surface of the substrate can be released, and a first member that defines an opening where the substrate can be arranged, and that has an upper surface which is arranged at a vicinity of an upper surface of the substrate in a state in which the substrate is held by the first holding portion, wherein an inside surface of the first member includes: a first inside surface, and a second inside surface, arranged above of the first inside surface, which at least a part of a side surface of the substrate faces, of which a lower end is linked to the first inside surface and of which an upper end is linked to an upper surface of the first member, the first inside surface and the second inside surface are not in parallel, and in relation to a normal direction of the upper surface of the first member, a dimension of the second inside surface is greater than a dimension of the first inside surface, and at least the second inside surface is inclined upward in an outside direction with respect to a center of the first holding portion.

According to a sixth aspect of the present invention, there is provided an exposure apparatus for exposing an upper surface of a substrate with exposure light through liquid, including: an optical member that has an emitting surface from which exposure light is emitted; and a substrate holding apparatus that includes: a first holding portion that holds a lower surface of the substrate in such a manner that the lower surface of the substrate can be released, and a first member that has an edge portion defining an upper surface and a part of an outer edge of the upper surface, wherein the edge portion of the first member extends in a predetermined direction in such a manner that an edge portion of the substrate held by the first holding portion runs along, and a plurality of protruding portions are formed at the edge portion of the first member along in the predetermined direction.

According to a seventh aspect of the present invention, there is provided an exposure apparatus for exposing a substrate with exposure light through liquid, including: an optical member that has an emitting surface from which exposure light is emitted; and a substrate holding apparatus that includes: a first holding portion that holds a lower surface of the substrate in such a manner that the lower surface of the substrate can be released, and a first member that defines an opening where the substrate can be arranged, and that has an upper surface which is arranged at a vicinity of an upper surface of the substrate in a state in which the substrate is held by the first holding portion, wherein an inside surface of the first member includes: a first inside surface which a side surface of the substrate can face; and a second inside surface, arranged below of the first inside surface, further separated than the first inside surface with respect to the first holding portion, the exposure apparatus further includes a porous member of which at least a part is arranged in such a manner as to face the second inside surface, and at least a part of the liquid which flows into a gap between the substrate and the first member is recovered through the porous member.

According to an eighth aspect of the present invention, there is provided exposure apparatus for exposing a substrate with exposure light through liquid, including: an optical member that has an emitting surface from which exposure light is emitted; and a substrate holding apparatus that includes: a first holding portion that holds a lower surface of the substrate in such a manner that the lower surface of the substrate can be released, and a first member that defines an opening where the substrate can be arranged, and that has an upper surface which is arranged at a vicinity of an upper surface of the substrate in a state in which the substrate is held by the first holding portion, wherein the first member includes a first inside surface which a side surface of the substrate can face, a second inside surface, arranged below of the first inside surface, further separated than the first inside surface with respect to the first holding portion, and a lower surface, linked to a lower end of the first inside surface and an upper end of the second inside surface, which faces toward an opposite direction to an upper surface of the first member.

According to a ninth aspect of the present invention, there is provided an exposure apparatus for exposing a substrate with exposure light through liquid in a liquid immersion space, including: an optical member that has an emitting surface from which exposure light is emitted; a substrate holding apparatus that includes: a first holding portion that holds a lower surface of the substrate in such a manner that the lower surface of the substrate can be released, a measurement member arranged at at least a part of a vicinity of the first holding portion, and a first member, provided adjacent to the measurement member, that has an upper surface where the liquid immersion space can be formed; and a porous member of which at least a part is arranged at a gap between the measurement member and the first member, and which has an upper surface liquid-repellent with respect to the liquid, wherein at least a part of the liquid which flows into the gap is recovered through the porous member.

According to a tenth aspect of the present invention, there is provided an exposure apparatus for exposing a substrate with exposure light through liquid in a light immersion space, including: an optical member that has an emitting surface from which exposure light is emitted; a substrate holding apparatus that includes: a first holding portion that holds a lower surface of the substrate in such a manner that the lower surface of the substrate can be released, a measurement member, arranged at at least a part of a vicinity of the first holding portion, and a first member, provided adjacent to the measurement member, that has an upper surface where a liquid immersion space can be formed; and a plurality of recovery ports that can recover at least a part of the liquid which flows into a gap between the measurement member and the first member, wherein the measurement member and the first member are moved in a state in which the liquid immersion space is formed at the side of the emitting surface of the optical member, and a recovery of the liquid through some of recovery port among the plurality of recovery ports is performed, based on any or both of a position of the gap with respect to the liquid immersion space and a movement condition of the gap with respect to the liquid immersion space.

According to an eleventh aspect of the present invention, there is provided an exposure apparatus for exposing a substrate with exposure light through liquid, including: an optical member that has an emitting surface from which exposure light is emitted; a substrate holding apparatus that includes: a first holding portion that holds a lower surface of the substrate in such a manner that the lower surface of the substrate can be released, a measurement member, arranged at at least a part of a vicinity of the first holding portion, that has an upper surface where a liquid immersion space can be formed, and a first member, provided adjacent to the measurement member, that has an upper surface where the liquid immersion space can formed; and a recovery port, arranged in such a manner as to face a side surface of the measurement member, that recovers at least a part of the liquid which flows into a gap between the measurement member and the first member.

According to a twelfth aspect of the present invention, there is provided an exposure apparatus for exposing a substrate with exposure light through liquid, including: an optical member that has an emitting surface from which exposure light is emitted; and a substrate holding apparatus that includes: a first holding portion that holds a lower surface of the substrate in such a manner that the lower surface of the substrate can be released, a measurement member, arranged at at least a part of a vicinity of the first holding portion, that has an upper surface where a liquid immersion space can be formed, and a first member, provided adjacent to the measurement member, having an upper surface where the liquid immersion space can be formed, wherein a side surface of the first member forming a gap between the side surface of the first member and the measurement member includes: a first area, positioned at a first distance from a center of the measurement member, where a side surface of the measurement member can face, and a second area, arranged adjacent to the first area, positioned at a second distance longer than the first distance from the center of the measurement member.

According to a thirteenth aspect of the present invention, there is provided an exposure apparatus for exposing a substrate with exposure light through liquid, including: an optical member that has an emitting surface from which exposure light is emitted; a first member, movable below of the optical member, that has a first upper surface where a liquid immersion space can be formed; and a second member, movable below of the optical member in a state being adjacent to the first member, having a second upper surface where the liquid immersion space is formed, wherein a side surface of the second member forming a gap between the side surface of the second member and a side surface of the first member includes: a first area, positioned at a first distance from the side surface of the first member, where the side surface of the first member can face, and a second areas, arranged adjacent to the first area, positioned at a second distance longer than the first distance from the side surface of the first member.

According to a fourteenth aspect of the present invention, there is provided an exposure apparatus for exposing a substrate with exposure light through liquid, including: an optical member that has an emitting surface from which exposure light is emitted; and a substrate holding apparatus that includes: a first holding portion that holds a lower surface of the substrate in such a manner that the lower surface of the substrate can be released, a measurement member, arranged at at least a part of a vicinity of the first holding portion, that has an upper surface where a liquid immersion space can be formed, and a first member, provided adjacent to the measurement member, having an upper surface where the liquid immersion space can be formed, wherein an inside surface of the first member includes: a first inside surface, and a second inside surface, arranged above of the first inside surface, which at least a part of a side surface of the measurement member faces, of which a lower end is linked to the first inside surface, and of which an upper end is linked to the upper surface of the first member, the first inside surface and the second inside surface are not in parallel, and in relation to a normal direction of the upper surface of the first member, a dimension of the second inside surface is greater than a dimension of the first inside surface, and at least the second inside surface is inclined upward in an outside direction with respect to a center of the measurement member.

According to a fifteenth aspect of the present invention, there is provided an exposure apparatus for irradiating an upper surface of a substrate with exposure light through liquid in a liquid immersion space formed at a side of an emitting surface of an optical member, including: a first member that has a first upper surface and a first edge portion defining a part of an outer edge of the first upper surface, and which is moved below of the optical member in such a manner that at least a part of the first upper surface comes into contact with the liquid immersion space, and a second member having a second upper surface and a second edge portion defining a part of an outer edge of the second upper surface, which is moved below of the optical member, wherein the first edge portion and the second edge portion extend in a predetermined direction, a gap is formed between the first edge portion and the second edge portion, and a plurality of protruding portions is formed at the first edge portion along in the predetermined direction.

According to a sixteenth aspect of the present invention, there is provided a method of device manufacturing, including: exposing a substrate by using the exposure apparatus according to any one of aspects in the first to fifteenth embodiments; and developing the exposed substrate.

According to a seventeenth aspect of the present invention, there is provided an exposure method of exposing a substrate with exposure light through liquid, including: exposing the substrate, in a state in which a liquid immersion space is formed with the liquid between an optical member that has an emitting surface from which the exposure light is emitted, and at least one of an upper surface of the substrate, held by a first holding portion that holds a lower surface of the substrate in such a manner that the lower surface of the substrate can be released, and an upper surface of a first member which defines an opening where the substrate can be arranged and of which at least a part is arranged at a vicinity of the substrate in a state in which the substrate is held by the first holding portion; and recovering at least a part of the liquid which flows into a gap, through a porous member of which at least a part is arranged at the gap between the substrate and the first member, and which has an upper surface liquid-repellent with respect to the liquid.

According to an eighteenth aspect of the present invention, there is provided an exposure method of exposing a substrate with exposure light through liquid, including: exposing the substrate while moving the substrate held by a first holding portion which holds a lower surface of the substrate in such a manner that the lower surface of the substrate can be released, and a first member which defines an opening where the substrate can be arranged and of which at least a part is arranged at a vicinity of the substrate in a state in which the substrate is held by the first holding portion, in a state in which a liquid immersion space of the liquid is formed at a side of the emitting surface of an optical member that has an emitting surface from which the exposure light is emitted; and recovering at least a part of the liquid which flows into a gap, through some of recovery ports among a plurality of recovery ports arranged at a vicinity of at least any of the substrate and the first holding portion, based on any one of or both of a position of the gap between the substrate and the first member with respect to the liquid immersion space and a movement condition of the gap with respect to the liquid immersion space.

According to a nineteenth aspect of the present invention, there is provided an exposure method of exposing a substrate with exposure light through liquid, including: exposing the substrate, in a state in which a liquid immersion space is formed with the liquid between an optical member that has an emitting surface from which the exposure light is emitted, and at least one of an upper surface of the substrate, held by a first holding portion that holds a lower surface of the substrate in such a manner that the lower surface of the substrate can be released, and an upper surface of a first member which defines an opening where the substrate can be arranged and of which at least a part is arranged at a vicinity of the substrate in a state in which the substrate is held by the first holding portion; and recovering at least a part of the liquid which flows into a gap between the substrate and the first member, through a recovery port arranged at such a manner as to face a side surface of the substrate.

According to a twentieth aspect of the present invention, there is provided an exposure method of exposing a substrate with exposure light through liquid, including: exposing the substrate, in a state in which a liquid immersion space is formed with the liquid between an optical member that has an emitting surface from which the exposure light is emitted, and at least one of an upper surface of the substrate, held by a first holding portion that holds a lower surface of the substrate in such a manner that the lower surface of the substrate can be released, and an upper surface of a first member which defines an opening where the substrate can be arranged and of which at least a part is arranged at a vicinity of the substrate in a state in which the substrate is held by the first holding portion, wherein an opening of the first member includes a first area, positioned at a first distance from a center of the first holding portion, where a side surface of the substrate held by the first holding portion can face, and a second area, arranged adjacent to the first area, positioned at a second distance longer than the first distance from the center of the first holding portion.

According to a twenty-first aspect of the present invention, there is provided an exposure method of exposing a substrate with exposure light through liquid, including: exposing the substrate, in a state in which a liquid immersion space is formed with the liquid between an optical member that has an emitting surface from which the exposure light is emitted, and at least one of an upper surface of the substrate, held by a first holding portion that holds a lower surface of the substrate in such a manner that the lower surface of the substrate can be released, and an upper surface of a first member which defines an opening where the substrate can be arranged and of which at least a part is arranged at a vicinity of the substrate in a state in which the substrate is held by the first holding portion, wherein an inside surface of the first member includes: a first inside surface, and a second inside surface, arranged above of the first inside surface, which at least a part of a side surface of the substrate faces, of which a lower end is linked to the first inside surface and of which an upper end is linked to an upper surface of the first member, the first inside surface and the second inside surface are not in parallel, and in relation to a normal direction of the upper surface of the first member, a dimension of the second inside surface is greater than a dimension of the first inside surface, and at least the second inside surface is inclined upward in an outside direction with respect to a center of the first holding portion.

According to a twenty-second aspect of the present invention, there is provided an exposure method of irradiating an upper surface of a substrate with exposure light through liquid, including: exposing the substrate, in a state in which a liquid immersion space of the liquid is formed between an optical member that has an emitting surface from which the exposure light is emitted, and at least one of an upper surface of the substrate held by a first holding portion that holds a lower surface of the substrate in such a manner that the lower surface of the substrate can be released and an upper surface of a first member which has an upper surface and an edge portion defining a part of an outer edge of the upper surface, wherein the edge portion of the first member extends in a predetermined direction in such a manner that an edge portion of the substrate held by the first holding portion runs along, and a plurality of protruding portions are formed at the edge portion of the first member along in the predetermined direction.

According to a twenty-third aspect of the present invention, there is provided an exposure method of exposing a substrate with exposure light through liquid, including: exposing the substrate, in a state in which a liquid immersion space is formed with the liquid between an optical member that has an emitting surface from which the exposure light is emitted, and at least one of an upper surface of the substrate, held by a first holding portion that holds a lower surface of the substrate in such a manner that the lower surface of the substrate can be released, and an upper surface of a first member which defines an opening where the substrate can be arranged and of which at least a part is arranged at a vicinity of the upper surface of the substrate in a state in which the substrate is held by the first holding portion, wherein an inside surface of the first member includes: a first inside surface which a side surface of the substrate can face; and a second inside surface, arranged below of the first inside surface, further separated than the first inside surface with respect to the first holding portion, and at least a part of the liquid which flows into a gap between the substrate and the first member is recovered, through a porous member of which at least a part is arranged in such a manner as to face the second inside surface.

According to a twenty-fourth aspect of the present invention, there is provided an exposure method of exposing a substrate with exposure light through liquid in a liquid immersion space, including: exposing the substrate, in a state in which the liquid immersion space is formed between an optical member that has an emitting surface from which exposure light is emitted, and at least one of an upper surface of the substrate held by a first holding portion that holds a lower surface of the substrate in such a manner that the lower surface of the substrate can be released, an upper surface of a measurement member arranged at at least a part of a vicinity of the first holding portion, and an upper surface of a first member provided adjacent to the measurement member; and recovering at least a part of the liquid which flows into a gap, through a porous member of which at least a part is arranged at the gap between the measurement member and the first member, and which has an upper surface liquid-repellent with respect to the liquid.

According to a twenty-fifth aspect of the present invention, there is provided an exposure method of exposing a substrate with exposure light through liquid in a liquid immersion space, including: exposing the substrate while moving an optical member that has an emitting surface from which the exposure light is emitted, the substrate held by a first holding portion which holds a lower surface of the substrate in such a manner that the lower surface of the substrate can be released, a measurement member arranged at at least a part of a vicinity of the first holding portion, and a first member provided adjacent to the measurement member, in a state in which the liquid immersion space is formed at the side of the emitting surface of the optical member; and recovering at least a part of the liquid which flows into a gap, through some of recovery ports among a plurality of recovery ports arranged at the gap, based on any or both of a position of the gap between the measurement member and the first member with respect to the liquid immersion space and a movement condition of the gap with respect to the liquid immersion space.

According to a twenty-sixth aspect of the present invention, there is provided an exposure method of exposing a substrate with exposure light through liquid, including: exposing the substrate, in a state in which a liquid immersion space is formed with the liquid between an optical member that has an emitting surface from which the exposure light is emitted and at least one of an upper surface of the substrate held by a first holding portion that holds a lower surface of the substrate in such a manner that the lower surface of the substrate can be released, an upper surface of a measurement member arranged at at least a part of a vicinity of the first holding portion, and an upper surface of a first member provided at a vicinity of the measurement member; and recovering at least a part of the liquid which flows into a gap between the measurement member and the first member, through a recovery port arranged in such a manner as to face a side surface of the measurement member.

According to a twenty-seventh aspect of the present invention, there is provided an exposure method of exposing a substrate with exposure light through liquid, including: exposing the substrate, in a state in which a liquid immersion space is formed with the liquid between an optical member that has an emitting surface from which the exposure light is emitted and at least one of an upper surface of the substrate held by a first holding portion that holds a lower surface of the substrate in such a manner that the lower surface of the substrate can be released, an upper surface of a measurement member arranged at at least a part of a vicinity of the first holding portion, and an upper surface of a first member provided at a vicinity of the measurement member, wherein a side surface of the first member forming a gap between the side surface of the first member and the measurement member includes: a first area, positioned at a first distance from a center of the measurement member, where a side surface of the measurement member can face, and a second area, arranged adjacent to the first area, positioned at a second distance longer than the first distance from the center of the measurement member.

According to a twenty-eighteenth aspect of the present invention, there is provided an exposure method of exposing a substrate with exposure light through liquid, including: exposing the substrate, in a state in which a liquid immersion space is formed with the liquid between an optical member that has an emitting surface from which the exposure light is emitted and at least one of an upper surface of the substrate held by a first holding portion that holds a lower surface of the substrate in such a manner that the lower surface of the substrate can be released, an upper surface of a measurement member arranged at at least a part of a vicinity of the first holding portion, and an upper surface of a first member provided at a vicinity of the measurement member, wherein an inside surface of the first member includes: a first inside surface, and a second inside surface, arranged above of the first inside surface, which at least a part of a side surface of the measurement member faces, of which a lower end is linked to the first inside surface, and of which an upper end is linked to the upper surface of the first member, the first inside surface and the second inside surface are not in parallel, and in relation to a normal direction of the upper surface of the first member, a dimension of the second inside surface is greater than a dimension of the first inside surface, and at least the second inside surface is inclined upward in an outside direction with respect to a center of the measurement member.

According to a twenty-ninth aspect of the present invention, there is provided an exposure method of irradiating an upper surface of a substrate with exposure light through liquid in a liquid immersion space formed at a side of an emitting surface of an optical member, including: moving a first member that has a first upper surface and a first edge portion, which defines a part of an outer edge of the first upper surface in such a manner that at least a part of the first upper surface comes into contact with the liquid immersion space, at below of the optical member; and moving a second member that has a second upper surface and a second edge portion, which defines a part of an outer edge of the second upper surface, at below of the optical member, wherein the first edge portion and the second edge portion extend in a predetermined direction, a gap is formed between the first edge portion and the second edge portion, and a plurality of protruding portions are formed at the first edge portion along in the predetermined direction.

According to a thirtieth aspect of the present invention, there is provided a device manufacturing method, including: exposing a substrate using the exposure method according to any one of aspects in the seventieth to twenty ninth embodiments; and developing the exposed substrate.

According to a thirty-first aspect of the present invention, there is provided a program for causing a computer to perform control of an exposure apparatus exposing a substrate with exposure light through liquid, including: exposing the substrate, in a state in which a liquid immersion space is formed with the liquid between an optical member that has an emitting surface from which the exposure light is emitted and at least one of an upper surface of the substrate held by a first holding portion that holds a lower surface of the substrate in such a manner that the lower surface of the substrate can be released and an upper surface of a first member which defines an opening where the substrate can be arranged and of which at least a part is arranged at a vicinity of the substrate in a state in which the substrate is held by the first holding portion; and recovering at least a part of the liquid which flows into a gap, through a porous member of which at least a part is arranged at the gap between the substrate and the first member, and which has an upper surface liquid-repellent with respect to the liquid.

According to a thirty-second aspect of the present invention, there is provided a program that causes a computer to control an exposure apparatus exposing a substrate with exposure light through liquid, including: exposing the substrate while moving the substrate held by a first holding portion which holds a lower surface of the substrate in such a manner that the lower surface of the substrate can be released, and a first member which defines an opening where the substrate can be arranged and of which at least a part is arranged at a vicinity of the substrate in a state in which the substrate is held by the first holding portion, in a state in which a liquid immersion space of the liquid is formed at a side of the emitting surface of an optical member that has an emitting surface from which the exposure light is emitted; and recovering at least a part of the liquid which flows into a gap, through some of recovery ports among a plurality of recovery ports arranged at a vicinity of at least any of the substrate and the first holding portion, based on any one of or both of a position of the gap between the substrate and the first member with respect to the liquid immersion space and a movement condition of the gap with respect to the liquid immersion space.

According to a thirty-third aspect of the present invention, there is provided a program that causes a computer to control an exposure apparatus exposing a substrate with exposure light through liquid, including: exposing the substrate, in a state in which a liquid immersion space is formed with the liquid between an optical member that has an emitting surface from which the exposure light is emitted, and at least one of an upper surface of the substrate, held by a first holding portion that holds a lower surface of the substrate in such a manner that the lower surface of the substrate can be released, and an upper surface of a first member which defines an opening where the substrate can be arranged and of which at least a part is arranged at a vicinity of the substrate in a state in which the substrate is held by the first holding portion; and recovering at least a part of the liquid which flows into a gap between the substrate and the first member, through a recovery port arranged at such a manner as to face a side surface of the substrate.

According to a thirtieth-fourth aspect of the present invention, there is provided a program that causes a computer to control an exposure apparatus exposing a substrate with exposure light through liquid, including: exposing the substrate, in a state in which a liquid immersion space is formed with the liquid between an optical member that has an emitting surface from which the exposure light is emitted, and at least one of an upper surface of the substrate, held by a first holding portion that holds a lower surface of the substrate in such a manner that the lower surface of the substrate can be released, and an upper surface of a first member which defines an opening where the substrate can be arranged and of which at least a part is arranged at a vicinity of the substrate in a state in which the substrate is held by the first holding portion, wherein an opening of the first member includes a first area, positioned at a first distance from a center of the first holding portion, where a side surface of the substrate held by the first holding portion can face, and a second area, arranged adjacent to the first area, positioned at a second distance longer than the first distance from the center of the first holding portion.

According to a thirty-fifth aspect of the present invention, there is provided a program that causes a computer to control an exposure apparatus exposing a substrate with exposure light through liquid, including: exposing the substrate, in a state in which a liquid immersion space is formed with the liquid between an optical member that has an emitting surface from which the exposure light is emitted, and at least one of an upper surface of the substrate, held by a first holding portion that holds a lower surface of the substrate in such a manner that the lower surface of the substrate can be released, and an upper surface of a first member which defines an opening where the substrate can be arranged and of which at least a part is arranged at a vicinity of the substrate in a state in which the substrate is held by the first holding portion, wherein an inside surface of the first member includes: a first inside surface, and a second inside surface, arranged above of the first inside surface, which at least a part of a side surface of the substrate faces, of which a lower end is linked to the first inside surface and of which an upper end is linked to an upper surface of the first member, the first inside surface and the second inside surface are not in parallel, and in relation to a normal direction of the upper surface of the first member, a dimension of the second inside surface is greater than a dimension of the first inside surface, and at least the second inside surface is inclined upward in an outside direction with respect to a center of the first holding portion.

According to a thirty-sixth aspect of the present invention, there is provided a program that causes a computer to control an exposure apparatus irradiating an upper surface of a substrate with exposure light through liquid, including: exposing the substrate, in a state in which a liquid immersion space of the liquid is formed between an optical member that has an emitting surface from which the exposure light is emitted, and at least one of an upper surface of the substrate held by a first holding portion that holds a lower surface of the substrate in such a manner that the lower surface of the substrate can be released and an upper surface of a first member which has an upper surface and an edge portion defining a part of an outer edge of the upper surface, wherein the edge portion of the first member extends in a predetermined direction in such a manner that an edge portion of the substrate held by the first holding portion runs along, and a plurality of protruding portions are formed at the edge portion of the first member along in the predetermined direction.

According to a thirty-seventh aspect of the present invention, there is provided a program that causes a computer to control an exposure apparatus exposing a substrate with exposure light through liquid, including: exposing the substrate, in a state in which a liquid immersion space is formed with the liquid between an optical member that has an emitting surface from which the exposure light is emitted, and at least one of an upper surface of the substrate, held by a first holding portion that holds a lower surface of the substrate in such a manner that the lower surface of the substrate can be released, and an upper surface of a first member which defines an opening where the substrate can be arranged and of which at least a part is arranged at a vicinity of the upper surface of the substrate in a state in which the substrate is held by the first holding portion, wherein an inside surface of the first member includes: a first inside surface which a side surface of the substrate can face; and a second inside surface, arranged below of the first inside surface, further separated than the first inside surface with respect to the first holding portion, and at least a part of the liquid which flows into a gap between the substrate and the first member is recovered, through a porous member of which at least a part is arranged in such a manner as to face the second inside surface.

According to a thirty-eighth aspect of the present invention, there is provided a program that causes a computer to control an exposure apparatus exposing a substrate with exposure light through liquid in a liquid immersion space, including: exposing the substrate, in a state in which the liquid immersion space is formed between an optical member that has an emitting surface from which exposure light is emitted, and at least one of an upper surface of the substrate held by a first holding portion that holds a lower surface of the substrate in such a manner that the lower surface of the substrate can be released, an upper surface of a measurement member arranged at at least a part of a vicinity of the first holding portion, and an upper surface of a first member provided adjacent to the measurement member; and recovering at least a part of the liquid which flows into a gap, through a porous member of which at least a part is arranged at the gap between the measurement member and the first member, and which has an upper surface liquid-repellent with respect to the liquid.

According to a thirty-ninth aspect of the present invention, there is provided a program that causes a computer to control an exposure apparatus exposing a substrate with exposure light through liquid in a liquid immersion space, including: exposing the substrate while moving the substrate held by a first holding portion which holds a lower surface of the substrate in such a manner that the lower surface of the substrate can be released, a measurement member arranged at at least a part of a vicinity of the first holding portion, and a first member provided adjacent to the measurement member, in a state in which the liquid immersion space is formed at the side of the emitting surface of an optical member that has an emitting surface from which the exposure light is emitted; and recovering at least a part of the liquid which flows into a gap, through some of recovery ports among a plurality of recovery ports arranged at the gap, based on any or both of a position of the gap between the measurement member and the first member with respect to the liquid immersion space and a movement condition of the gap with respect to the liquid immersion space.

According to a fortieth aspect of the present invention, there is provided a program that causes a computer to control an exposure apparatus exposing a substrate with exposure light through liquid, including: exposing the substrate, in a state in which a liquid immersion space is formed with the liquid between an optical member that has an emitting surface from which the exposure light is emitted and at least one of an upper surface of the substrate held by a first holding portion that holds a lower surface of the substrate in such a manner that the lower surface of the substrate can be released, an upper surface of a measurement member arranged at at least a part of a vicinity of the first holding portion, and an upper surface of a first member provided at a vicinity of the measurement member; and recovering at least a part of the liquid which flows into a gap between the measurement member and the first member, through a recovery port arranged in such a manner as to face a side surface of the measurement member.

According to a forty-first aspect of the present invention, there is provided a program that causes a computer to control an exposure apparatus exposing a substrate with exposure light through liquid, including: exposing the substrate, in a state in which a liquid immersion space is formed with the liquid between an optical member that has an emitting surface from which the exposure light is emitted and at least one of an upper surface of the substrate held by a first holding portion that holds a lower surface of the substrate in such a manner that the lower surface of the substrate can be released, an upper surface of a measurement member arranged at at least a part of a vicinity of the first holding portion, and an upper surface of a first member provided at a vicinity of the measurement member, wherein a side surface of the first member forming a gap between the side surface of the first member and the measurement member includes: a first area, positioned at a first distance from a center of the measurement member, where a side surface of the measurement member can face, and a second area, arranged adjacent to the first area, positioned at a second distance longer than the first distance from the center of the measurement member.

According to a forty-second aspect of the present invention, there is provided a program that causes a computer to control an exposure apparatus exposing a substrate with exposure light through liquid, including: exposing the substrate, in a state in which a liquid immersion space is formed with the liquid between an optical member that has an emitting surface from which the exposure light is emitted and at least one of an upper surface of the substrate held by a first holding portion that holds a lower surface of the substrate in such a manner that the lower surface of the substrate can be released, an upper surface of a measurement member arranged at at least a part of a vicinity of the first holding portion, and an upper surface of a first member provided at a vicinity of the measurement member, wherein an inside surface of the first member includes: a first inside surface, and a second inside surface, arranged above of the first inside surface, which at least a part of a side surface of the measurement member faces, of which a lower end is linked to the first inside surface, and of which an upper end is linked to the upper surface of the first member, the first inside surface and the second inside surface are not in parallel, and in relation to a normal direction of the upper surface of the first member, a dimension of the second inside surface is greater than a dimension of the first inside surface, and at least the second inside surface is inclined upward in an outside direction with respect to a center of the measurement member.

According to a fortieth-third aspect of the present invention, there is provided a program that causes a computer to control an exposure apparatus irradiating an upper surface of a substrate with exposure light through liquid in a liquid immersion space formed at the direction of an emitting surface of an optical member, including: moving a first member that has a first upper surface and a first edge portion, which defines a part of an outer edge of the first upper surface, in such a manner that at least a part of the first upper surface comes into contact with the liquid immersion space, at below of the optical member; and moving a second member that has a second upper surface and a second edge portion, which defines a part of an outer edge of the second upper surface, at below of the optical member, wherein the first edge portion and the second edge portion extend in a predetermined direction, a gap is formed between the first edge portion and the second edge portion, and a plurality of protruding portions are formed at the first edge portion along in the predetermined direction.

According to a forty-fourth aspect of the present invention, there is provided a computer-readable storage medium storing any one of the programs in the thirty-first to forty-third embodiments.

According to aspects of the present invention, an occurrence of an exposure defect may be suppressed. Furthermore, according to the aspects of the present invention, an occurrence of a defective device can be suppressed.

DESCRIPTION OF EMBODIMENTS

Figure 1:
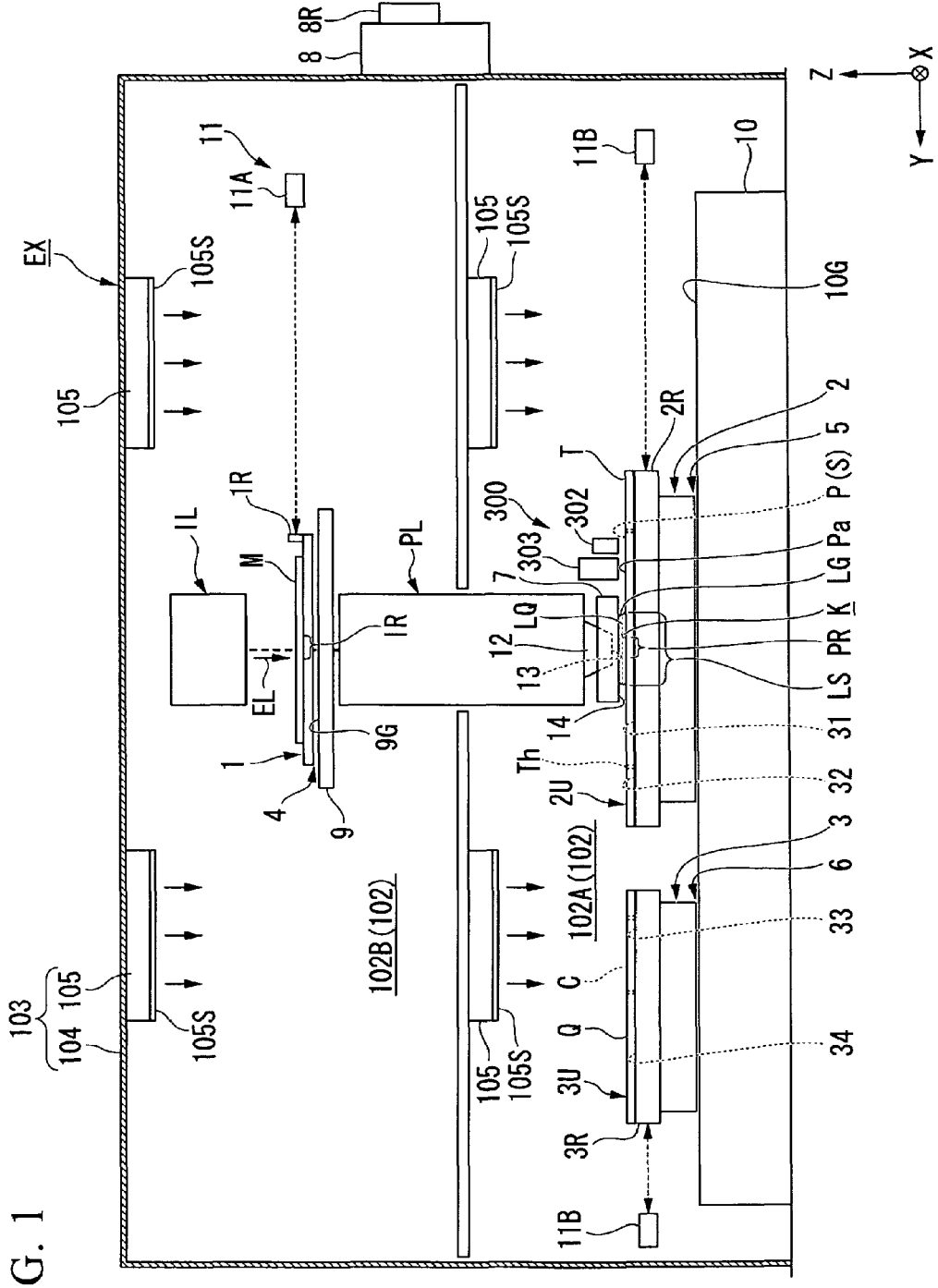
FIG. 1 is a schematic configuration view illustrating one example of an exposure apparatus relating to a first embodiment.

Embodiments of the present invention are below described referring to the drawings, but the present invention is not limited to these. In the below-written description, an XYZ coordinate system is established, and a position relation of each unit is described referring to this XYZ right angle coordinate system. A predetermined direction on the horizontal plane is defined as an X axis direction, a direction intersecting the X axis direction on the horizontal plane as an Y axis direction, and a direction intersecting each of the X axis direction and the Y axis direction as a Z axis direction (that is, the vertical direction). Furthermore, rotation (inclination) directions of rotation about the X axis, the Y axis and the Z axis are defined as $\theta X$, $\theta Y$, and $\theta Z$ directions, respectively.

First Embodiment

A first embodiment is described. FIG. 1 is a schematic configuration view illustrating one example of an exposure apparatus EX relating to the first embodiment. The exposure apparatus EX of the present embodiment is a liquid immersion exposure apparatus exposing a substrate P with exposure light EL through liquid LQ. In the present embodiment, a liquid immersion space LS is formed in such a manner that at least a part of the light path of the exposure light EL is filled with the liquid LQ. The liquid immersion space is a part (a space, or an area) which is filled with liquid. The substrate P is exposed by the exposure light EL through the liquid LQ in the liquid immersion space LS. In the present embodiment, water (purified water) is used as the liquid LQ.

Furthermore, the exposure apparatus EX of the present embodiment is an exposure apparatus equipped with a substrate stage and a measurement stage, for example, as disclosed in the specification of U.S. Pat. No. 6,897,963, and in the specification of European Patent Application, Publication No. 1713113.

In FIG. 1, the exposure apparatus EX includes a mask stage 1, movable holding a mask M, a substrate stage 2, movable holding a substrate P, a measurement stage 3, movable equipped with a measurement member C and a measurement instrument measuring exposure light EL without holding the substrate P, a drive system 4 moving the mask stage 1, a drive system 5 moving the substrate stage 2, a drive system 6 moving the measurement stage 3, an illumination system IL illuminating the mask M with the exposure light EL, an optical projection system PL projecting an image of a pattern of the mask M irradiated with the exposure light EL onto the substrate P, a liquid immersion member 7 capable of forming a liquid immersion space LS in such a manner as to fill at least a part of the light path of the exposure light EL with liquid LQ, a control apparatus 8 controlling all operations of the exposure apparatus EX, and a storage apparatus 8R storing a variety of information on exposure, connected to the control apparatus 8. The storage apparatus 8R includes, for example, a storage medium, memory such as RAM, a hard disk, CD-ROM, and the likes. In the storage apparatus 8R, an operating system (OS) controlling a computer system is installed, and a program for controlling the exposure apparatus EX is stored.

Furthermore, the exposure apparatus EX includes an interferometer system 11 measuring positions of the mask stage 1, the substrate stage 2, and the measurement stage 3, and a detection system 300. The detection system 300 includes an alignment system 302 detecting an alignment mark on the substrate P and a surface position detection system 303 detecting a position of an upper surface (a surface) Pa of the substrate P. Furthermore, the detection system 300 may include, for example, an encoder system detecting a position of the substrate stage 2, as disclosed in the specification of United States Patent Application, Publication No. 2007/0288121.

The mask M includes a reticle on which a device pattern to be projected onto the substrate P is formed. The mask M includes, for example, a transparent substrate such as a glass substrate, and a transparency type mask having a pattern which is formed on the transparent substrate using a light blocking material such as chrome. Furthermore, as the mask M, a reflection type mask may be used.

The substrate P is a substrate for manufacturing a device. The substrate P includes, for example, a base material such as a semiconductor wafer, and a photo-sensitive film formed on the base material. The photo-sensitive film is a film of photo-sensitive material (a photoresist). Furthermore, the substrate P may include a separate film in addition to the photo-sensitive film. For example, the substrate P may include a reflection prevention film, and may include a protection film (a top coat film) protecting a photo-sensitive film.

Furthermore, the exposure apparatus EX includes a chamber apparatus 103 for adjusting an environment (at least one of temperature, humidity, pressure, and cleanness) for a space 102 where the exposure light EL advances. A chamber apparatus 103 has a chamber member 104 forming the space 102, and an air conditioning system 105 adjusting an environment for the space 102.

The space 102 includes a space 102A and a space 102B. The space 102A is a space where the process is performed on the substrate P. The substrate stage 2 and the measurement stage 3 move the space 102A.

The air conditioning system 105 includes an air supply unit 105S supplying gas to the space 102A and 102B, and supplies the gas from the air supply unit 105S to the space 102A and 102 B, and thus adjusts environments for the space 102A and 102B. In the present embodiment, at least the substrate stage 2, the measurement stage 3 and a last optical element 12 of the optical projection system PL are arranged at the space 102A.

The illumination system IL irradiates a predetermined illumination area IR with the exposure light EL. The illumination area IR includes a position which the exposure light EL emitted from the illumination system IL can irradiate. The illumination system IL irradiates at least a part of the mask M arranged at the illumination area IR with the exposure light EL with a uniform illumination distribution. As the exposure light EL emitted from the illumination system IL, for example, deep ultraviolet light (DUV light) such as bright line (g line, h line, and i line) emitted from a mercury lamp, and KrF excimer laser light (wavelength 248 nm), and vacuum ultraviolet light (VUV light), such as ArF excimer laser light (wavelength 193 nm) and $F_2$ laser light (wavelength 157 nm), and the like are used. In the present embodiment, as the exposure light EL, ArF excimer laser light, which is ultraviolet light (vacuum ultraviolet light), is used.

The mask stage 1 is movable above a guide surface 9G of a base member 9 including the illumination area IR, in a state of holding the mask M. The drive system 4 includes a plane motor for moving the mask stage 1 on a guide surface 9G. The plane motor has a rotor arranged at the mask stage 1, and a stator arranged at the base member 9, for example, as is disclosed in the specification of U.S. Pat. No. 6,452, 292. In the present embodiment, the mask stage 1 is movable in the six directions, that is, X axis, Y axis, Z axis, θX, θY, and θZ directions, on the guide surface 9G, by operation through the drive system 4.

The optical projection system PL irradiates the predetermined projection area PR with the exposure light EL. The projection area PR includes a position from which the exposure light EL emitted from the optical projection system PL may irradiate. The optical projection system PL projects the image of the pattern of the mask M onto at least a part of substrate P arranged at the projection area PR, at given projection magnification. The optical projection system PL of the present embodiment is a reduction system of which the projection magnification is, for example, ¼, ⅕, or ⅛. Furthermore, the optical projection system PL may be any of an equal-size magnification system and an enlargement magnification system. In the present embodiment, the optical axis of the optical projection system PL is in parallel with the Z axis. Furthermore, the optical projection system PL may be any of a refraction system not including a reflection optical device, a reflection system not including a refraction optical device, and a reflection refraction system including the refraction optical device and the reflection optical device. Furthermore, the optical projection system PL may form any of an inversion image and an erected image.

The substrate stage 2 is movable to the position (the projection area PR) from which the exposure light EL emitted from the optical projection system PL may irradiate. The substrate stage 2 is movable to on a guide surface 10G of a base member 10 including the projection area PR, in a state of holding the substrate P. The measurement stage 3 is movable to the position (the projection area PR) from which the exposure light EL emitted from the optical projection system PL may irradiate. The measurement stage 3 is movable above the guide surface 10G of the base member 10 including the projection area PR, in a state of holding the measurement member C. The substrate stage 2 and the measurement stage 3 are independently movable to on the guide surface 10G.

The drive system 5 for moving the substrate stage 2 includes the plane motor for moving the substrate stage 2 on the guide surface 10G. The plane motor has a rotor arranged at the substrate stage 2, and a stator arranged at the base member 10, for example as is disclosed in the specification of U.S. Pat. No. 6,452,292. Likewise, the drive system 6 for moving the measurement stage 3 includes the plane motor, and has the rotor arranged at the measurement stage 3 and the stator arranged at the base member 10.

In the present embodiment, the substrate stage 2 has a first holding portion 31 holding the lower surface Pb of the substrate P in such a manner that the lower surface Pb of the substrate P can be released, and an upper surface which defines an opening Th where the substrate P can be arranged, and which is arranged in the vicinity of an upper surface Pa of the substrate P in a state in which the substrate P is held by the first holding portion 31.

In the present embodiment, for example, the substrate stage 2 is arranged in the vicinity of the first holding portion 31, and has a second holding portion 32 holding a lower surface Tb of a cover member T in such a manner that the lower surface Tb of the cover member T can be released, for example, as is disclosed in the specification of United States Patent Application, Publication No. 2007/0177125, in the specification of United States Patent Application, Publication No. 2008/0049209 and the like. The cover member T is arranged in the vicinity of the substrate P held by the first holding portion 31. In the present embodiment, the cover member T has the opening Th where the substrate P held by the first holding portion 31 is arranged. In the present embodiment, the cover member T has an upper surface 2U.

In the present embodiment, the first holding portion 31 holds the substrate P, in such a manner that the upper surface Pa of the substrate P and the XY plane are substantially parallel with each other. The second holding portion 32 holds the cover member T, in such a manner that the upper surface 2U of the cover member T and the XY plane are substantially parallel with each other. In the present embodiment, an upper surface Pa of the substrate P held by the first holding portion 31 and an upper surface 2U of the cover member T held by the second holding portion 32 are arranged in the substantially same plane (is substantially flush with each other).

Furthermore, the cover member T may be integrally formed on the substrate stage 2. For example, at least a member, a part, of the substrate stage 2 may have the upper surface 2U.

In the present embodiment, the measurement stage 3 has a third holding portion 33 holding the measurement member C in such a manner that the measurement member C can be released, and a fourth holding portion 34, arranged at the vicinity of the third holding portion 33, and holding a cover member Q in such a manner that the cover member Q can be released. The third and fourth holding portions 33 and 34 have a pin chuck mechanism. The cover member Q is arranged at the vicinity of the measurement member C held by the third holding portion 33. Furthermore, a holding mechanism which is used in at least one of the third holding portion 33 and the fourth holding portion 34 is not limited to the pin chuck mechanism. Furthermore, at least one of the measurement member C and the cover member Q may be integrally formed on the measurement stage 3.

In the present embodiment, the third holding portion 33 holds measurement member C, in such a manner that an upper surface of the measurement member C and the XY plane are substantially parallel with each other. The fourth holding portion 34 holds the cover member Q, in such a manner that an upper surface of the cover member Q and the XY plane are substantially parallel with each other. In the present embodiment, the upper surface of the measurement member C held by the third holding portion 33 and the upper surface of the cover member Q held by the fourth holding portion 34 are arranged at the substantially same plane (is substantially flush with each other).

At this point, in the below-written description, the upper surface 2U of the cover member T held by the second holding portion 32 is properly referred to as the upper surface 2U of the substrate stage 2, and the upper surface of the measurement member C held by the third holding portion 33 and the upper surface of the cover member Q held by the fourth holding portion 34 are properly collectively referred to as an upper surface 3U of the measurement stage 3.

An interferometer system 11 includes a laser interferometer unit 11A measuring a position of the mask stage 1, and a laser interferometer unit 11B measuring positions of the substrate stage 2 and the measurement stage 3. The laser interferometer unit 11A can measure the position of the mask stage 1, using a measurement mirror 1R arranged at the mask stage 1. The laser interferometer unit 11B can measure a position of each of the substrate stage 2 and the measurement stage 3, using a measurement mirror 2R arranged at the substrate stage 2 and a measurement mirror 3R arranged at the measurement stage 3.

The alignment system 302 detects the alignment mark of the substrate P, and thus detects a position of a shot area S on the substrate P. The alignment system 302 has a lower surface which the substrate stage 2 (the substrate P) can face. The upper surface 2U of the substrate stage 2 and the upper surface (the surface) Pa of the substrate P held by the substrate stage 2 can face the lower surface of the alignment system 302 which is toward the negative Z direction.

The surface position detection system 303 is also called, for example, an autofocus leveling system, and irradiates the upper surface (the surface) Pa of the substrate P held by the substrate stage 2 with detection light, and thus detects a position of the upper surface Pa of the substrate P. The surface position detection system 303 has a lower surface which the substrate stage 2 (the substrate P) can face. The upper surface 2U of the substrate stage 2 and the upper surface Pa of the substrate P held by the substrate stage 2 can face a lower surface of the surface position detection system 303 which faces toward the negative Z direction.

When performing an exposure process on the substrate P, or performing a predetermined measurement operation, the control apparatus 8 operates the drive systems 4, 5, and 6, based on the measurement result obtained by the interferometer system 11 and the detection result obtained by the detection system 300, and thus performs position control on the mask stage 1 (the mask M), the substrate stage 2 (the substrate P), and the measurement stage 3 (the measurement member C).

The liquid immersion member 7 can form the liquid immersion space LS in such a manner that at least a part of the light path of the exposure light EL is filled with the liquid LQ. The liquid immersion member 7 is arranged at the vicinity of the last optical element 12 which is the closest to an image surface of the optical projection system PL, among a plurality of optical devices of the optical projection system PL. In the present embodiment, the liquid immersion member 7 is a ring-shaped member, and is arranged at the vicinity of the light path of the exposure light EL. In the present embodiment, at least a part of the liquid immersion member 7 is arranged at the vicinity of the last optical element 12.

The last optical element 12 has an emitting surface 13 from which to emit the exposure light EL toward the image surface of the optical projection system PL. In the present embodiment, the liquid immersion space LS is formed at the emitting surface 13 side. The liquid immersion space LS is formed, in such a manner that the light path K of the exposure light EL emitted from the emitting surface 13 is filled with the liquid LQ. The exposure light EL emitted from the emitting surface 13 advances in the negative Z direction. The emitting surface 13 faces toward the direction (the negative Z direction) in which the exposure light EL advances. In the present embodiment, the emitting surface 13 is a plane surface which is substantially parallel with the XY plane. Furthermore, the emitting surface 13 may be inclined with respect to the XY plane, and may include a curved surface.

The liquid immersion member 7 has a lower surface 14 of which at least a part faces toward the negative Z direction. In the present embodiment, the emitting surface 13 and the lower surface 14 can hold the liquid LQ between the emitting surface 13 and the lower surface 14 and an object arranged at the position (the projection area PR) which the exposure light EL emitted from the emitting surface 13 can irradiate. The liquid immersion space LS is formed by the liquid LQ held between at least a part of each of the emitting surface 13 and the lower surface 14, and the object arranged at the projection area PR. The liquid immersion space LS is formed, in such a manner that the light path K of the exposure light EL between the emitting surface 13 and the object arranged at the projection area PR is filled with the liquid LQ. The liquid immersion member 7 can hold the liquid LQ between the liquid immersion member 7 and the object, in such a manner that the light path K of the exposure light EL between the last optical element 12 and the object is filled with the liquid LQ.

In the present embodiment, the object which can be arranged at the projection area PR includes an object, movable with respect to the projection area PR in the side of the image surface of the optical projection system PL (in the side of the emitting surface 13 of the last optical element 12). The object is movable with respect to the last optical element 12 and the liquid immersion member 7. The object has the upper surface (the surface) which can face at least one of the emitting surface 13 and the lower surface 14. The upper surface of the object can form the liquid immersion space LS between the upper surface of the object and the emitting surface 13. The object is movable in the plane (in the XY plane) perpendicular to the optical axis (the Z axis) of the last optical element 12. In the present embodiment, an upper surface of the object can form the liquid immersion space LS between the upper surface of the object and at least a part of each of the emitting surface 13 and the lower surface 14. By the liquid LQ being held between the emitting surface 13 and the lower surface 14 to one side and the upper surface (the surface) of the object to the other side, the liquid immersion space LS is formed, in such a manner that the light path K of the exposure light EL between the last optical element 12 and the object is filled with the liquid LQ.

In the present embodiment, the object includes at least one of the substrate stage 2, the substrate P held by the substrate stage 2, the measurement stage 3, and the measurement member C held by the measurement stage 3. For example, the upper surface 2U of the substrate stage 2, and the surface (the upper surface) Pa of the substrate P held by the substrate stage 2 can face the emitting surface 13 of the last optical element 12 which faces toward the negative Z direction and the lower surface 14 of the liquid immersion member 7 which faces toward the negative Z direction. Of course, the object which can be arranged at the projection area PR is not limited to at least one of the substrate stage 2, the substrate P held by the substrate stage 2, the measurement stage 3, and the measurement member C held by the measurement stage 3. Furthermore, the object can face at least a part of the detection system 300.

In the present embodiment, the liquid immersion space LS is formed, in such a manner that an area of a part of the surface of the substrate P including the projection area PR is covered with the liquid LQ when the exposure light EL irradiates the substrate P. At the time of exposing the substrate P, the liquid immersion member 7 can hold the liquid LQ between the liquid immersion member 7 and the substrate P, in such a manner that the light path K of the exposure light EL between the last optical element 12 and the substrate P is filled with the liquid LQ. At least a part of an interface LG (a meniscus, or an edge) of the liquid LQ is formed between the lower surface 14 of the liquid immersion member 7 and the surface of the substrate P. That is, in the exposure apparatus EX of the present embodiment, a local liquid immersion method is employed.

Figure 2:
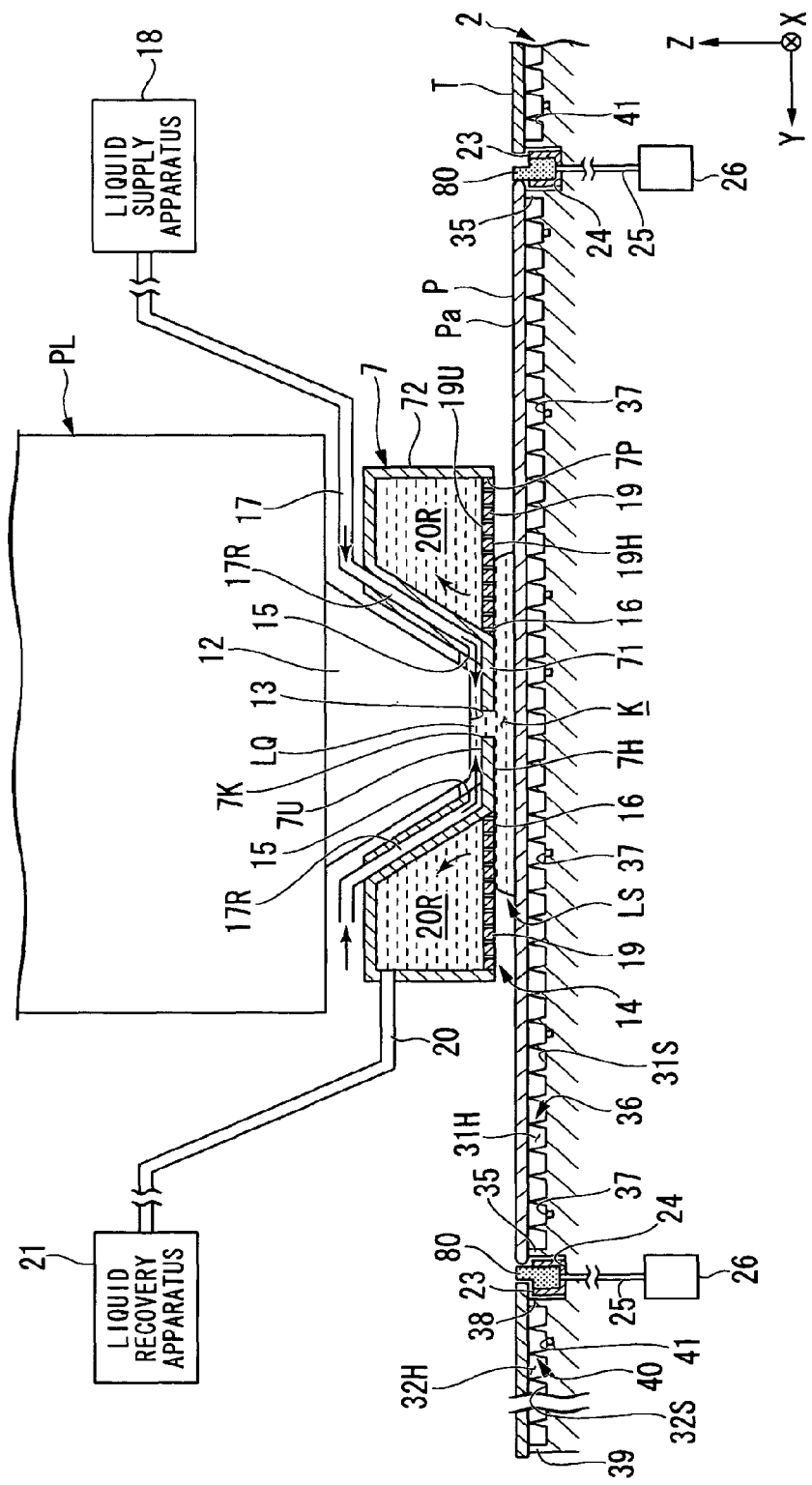
FIG. 2 is a view illustrating one example of a liquid immersion member and a substrate stage relating to the first embodiment.
Figure 3:
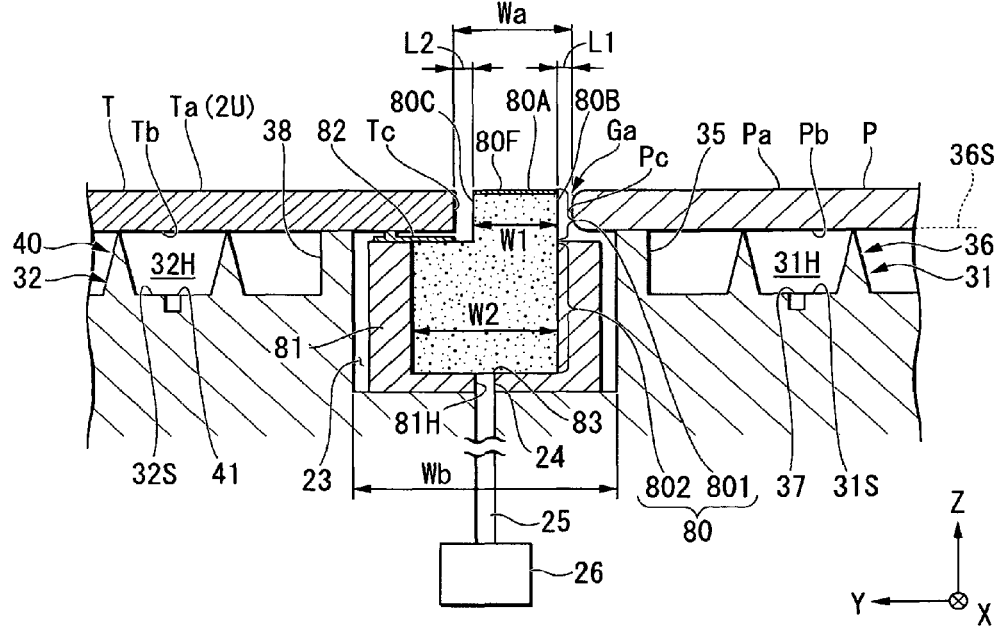
FIG. 3 is a view illustrating a part of the substrate stage relating to the first embodiment.

FIG. 2 is a sectional side view illustrating one example of the liquid immersion member 7 and the substrate stage 2 relating to the present embodiment. FIG. 3 is a magnified view of a part of the FIG. 2. Furthermore, in FIG. 2 the substrate P is arranged at the projection area PR (the position facing the last optical element 12 and the liquid immersion member 7), but, as described above, the substrate stage 2 (the cover member T) and the measurement stage 3 (the cover member Q and the measurement member C) can be arranged.

As shown in FIG. 2, the liquid immersion member 7 includes a facing portion 71 of which at least a part faces the emitting surface 13 of the last optical element 12, and a main body portion 72 of which at least a part is arranged at the vicinity of the last optical element 12. A facing portion 71 has a hole 7K (an opening) in the position facing the emitting surface 13. The facing portion 71 has an upper surface 7U of which at least a part faces the emitting surface 13 through a gap, and a lower surface 7H which the substrate P (the object) can face. The hole 7K is formed in such a manner as to link the upper surface 7U and the lower surface 7H together. The upper surface 7U is arranged at the vicinity of the upper end of the hole 7K, and the lower surface 7H is arranged at the vicinity of the lower end of the hole 7K. The exposure light EL emitted from the emitting surface 13 passes through the hole 7K, and can irradiate the substrate P.

In the present embodiment, each of the upper surface 7U and the lower surface 7H is arranged at the vicinity of the light path K. In the present embodiment, the lower surface 7H is a plane surface. The lower surface 7H can hold the liquid LQ between the lower surface 7H and the substrate P (the object). In the below-written description, the lower surface 7H is properly referred to as a holding surface 7H.

Furthermore, the liquid immersion member 7 has a supply port 15 through which the liquid LQ can be supplied, and a recovery port 16 through which the liquid LQ can be recovered. Through the supply port 15, the liquid LQ is supplied, for example, at the time of exposing the substrate P.

Through the recovery port 16, the liquid LQ is recovered, for example, at the time of exposing the substrate P. Furthermore, through the supply port 15, the liquid LQ can be supplied at any one of the time of exposure of the substrate P and the time of non-exposure, or at both of them. Furthermore, through the recovery port 16, the liquid LQ can be recovered at any one of the time of exposure of the substrate P and the time of non-exposure, or at both of them.

The supply port 15 is arranged at the vicinity of the light path K of the exposure light EL emitted from the emitting surface 13, and is arranged in such a manner as to face the light path K. Furthermore, the supply port 15 may face one of a space between the emitting surface 13 and an opening 7K and a side surface of the last optical element 12, or both of them. In the present embodiment, through the supply port 15, the liquid LQ is supplied to a space between the upper surface 7U and the emitting surface 13. The liquid LQ supplied through the supply port 15 flows through the space between the upper surface 7U and the emitting surface 13, and then is supplied to on the substrate P (the object) through the opening 7K.

The supply port 15 is connected to a liquid supply apparatus 18 through a channel 17. The liquid supply apparatus 18 can send the liquid LQ which is cleanly temperature-adjusted. The channel 17 includes a supply channel 17R formed inside of the channel 17, and a channel formed with a supply pipe connecting between a supply channel 17R and a liquid supply apparatus 18. The liquid LQ sent from the liquid supply apparatus 18 is supplied to the supply port 15 via the channel 17. Through the supply port 15, the liquid LQ is supplied at least during the exposure of the substrate P.

Through the recovery port 16, at least a part of the liquid LQ on the object facing a lower surface 14 of the liquid immersion member 7 can be recovered. The recovery port 16 is arranged at at least a part of the vicinity of an opening 7K through which the exposure light EL passes. In the present embodiment, the recovery port 16 is arranged at at least a part of the vicinity of the holding surface 7H. The recovery port 16 is arranged at a predetermined position in the liquid immersion member 7 facing the surface of the object. The substrate P faces the recovery port 16 at least during the exposure of the substrate P. During the exposure of the substrate P, through the recovery port 16, the liquid LQ on the substrate P is recovered.

In the present embodiment, the main body portion 72 has an opening 7P facing the substrate P (the object). The opening 7P is arranged at at least a part of the vicinity of the holding surface 7H. In the present embodiment, the liquid immersion member 7 has a porous member 19 arranged at the opening 7P. In the present embodiment, the porous member 19 is a member in the form of a plate including a plurality of pores (openings or pores). Furthermore, at the opening 7P, a mesh filter may be arranged which is the porous member in which a plurality of small pores are formed in the form of a mesh.

In the present embodiment, the porous member 19 has a lower surface 19H which the substrate P (the object) can face, an upper surface 19U which faces toward the opposite direction to the lower surface 19H, and a plurality of pores linking the upper surface 19U and the lower surface 19H together. The lower surface 19H is arranged at at least a part of the vicinity of the holding surface 7H. In the present embodiment, at least a part of the lower surface 14 of the liquid immersion member 7 includes the holding surface 7H and the lower surface 19H.

In the present embodiment, the recovery port 16 includes the pores of the porous member 19. In the present embodiment, the liquid LQ on the substrate P (the object) is recovered through the pores of the porous member 19 (the recovery port 16).

Furthermore, the porous member 19 may not be arranged.

The recovery port 16 is connected to a liquid recovery apparatus 21 via a channel 20. A liquid recovery apparatus 21 can enable the recovery port 16 to be connected to a vacuum system, and thus can suction the liquid LQ through the recovery port 16. The channel 20 includes a recovery channel 20R formed inside of the liquid immersion member 7, and a channel which is formed with a recovery pipe connecting between the recovery channel 20R and the liquid recovery apparatus 21. The liquid LQ recovered through the recovery port 16 is recovered by the liquid recovery apparatus 21 through the channel 20.

In the present embodiment, by concurrently performing a supply operation of supplying the liquid LQ through the supply port 15 and a recovery operation of recovering the liquid LQ through the recovery port 16, the control apparatus 8 can form the liquid immersion space LS with the liquid LQ between the last optical element 12 and the liquid immersion member 7 to one side and the object to the other side.

Furthermore, the liquid immersion member (the nozzle member), for example, as disclosed in the specification of United States Patent Application, Publication No. 2007/0132976 and in the specification of European Patent Application, Publication No. 1768170 can be used as the liquid immersion member 7.

As shown in FIGS. 2 and 3, the substrate stage 2 includes a porous member 80 of which at least a part is arranged at a gap Ga between the substrate P and the cover member T (the substrate stage 2). In the present embodiment, at least a part of the liquid LQ which flows into the gap Ga is recovered through the porous member 80.

In the present embodiment, the porous member 80 includes an upper surface 80A which at least one of the emitting surface 13 and the lower surface 14 can face, a first side surface 80B which a side surface Pc of the substrate P held by the first holding portion 31 can face, and a second side surface 80C which an inside surface Tc of the cover member T held by the second holding portion 32 can face. The side surface Pc of the substrate P links an upper surface Pa of the substrate P, and a lower surface Pb of the substrate P which faces toward the opposite direction to the upper surface Pa together. The inside surface Tc of the cover member T links an upper surface Ta of the cover member T and a lower surface Tb of the cover member T which faces toward the opposite direction to the upper surface Ta together. The upper surface Ta of the cover member T includes the upper surface 2U of the substrate stage 2. In a state in which the porous member 80 is not arranged, the side surface Pc of the substrate P and the inside surface Tc of the cover member T can face each other.

In the present embodiment, the porous member 80 is made of, for example, titanium. The porous member 80 can be formed using, for example, a sintering method.

In the present embodiment, an upper surface 80A of the porous member 80 is liquid-repellent with respect to the liquid LQ.

In the present embodiment, a contact angle of the upper surface 80A to the liquid LQ is greater than, for example, 90 degrees. The contact angle of the upper surface 80A to the liquid LQ may be equal to, or greater than, for example, 100 degrees and may be equal to, or greater than 110 degrees.

In the present embodiment, the upper surface 80A of the porous member 80 is coated with a liquid-repellent material including fluorine. That is, in the upper surface 80A, a film 80F including the liquid-repellent material is arranged. The liquid-repellent material may be, for example, PFA (Tetra fluoro ethylene-perfluoro alkylvinyl ether copolymer), PTFE (Poly tetra fluoro ethylene), PEEK (polyetheretherketone), or Teflon (registered trademark).

In the present embodiment, a contact angle of the upper surface 80A of the porous member 80 with respect to the liquid LQ is greater than a contact angle of the first side surface 80B. Furthermore, in the present embodiment, the contact angle of the upper surface 80A of the porous member 80 with respect to the liquid LQ is greater than a contact angle of a second side surface 80C.

Furthermore, the contact angle of the upper surface 80A of the porous member 80 with respect to the liquid LQ may be smaller than the contact angle of the first side surface 80B, and may be substantially the same as the contact angle of the first side surface 80B. Furthermore, the contact angle of the upper surface 80A of the porous member 80 with respect to the liquid LQ may be smaller than a contact angle of a second side surface 80C, and may be substantially the same as the contact angle of the second side surface 80C.

In the present embodiment, the contact angle of the upper surface Pa of the substrate P with respect to the liquid LQ and the contact angle of the upper surface Ta of the cover member T are greater than the contact angle of the first side surface 80B. Furthermore, in the present embodiment, the contact angle of the upper surface Pa of the substrate P with respect to the liquid LQ and the contact angle of the upper surface Ta of the cover member T are greater than the contact angle of the second side surface 80C.

Furthermore, the contact angle of the upper surface Pa of the substrate P with respect to the liquid LQ and the contact angle of the upper surface Ta of the cover member T may be smaller than the contact angle of the first side surface 80B, and may be substantially the same as the contact angle of the first side surface 80B. Furthermore, the contact angle of the upper surface Pa of the substrate P with respect to the liquid LQ and the contact angle of the upper surface Ta of the cover member T may be smaller than the contact angle of the second side surface 80C, and may be substantially the same as the contact angle of the second side surface 80C.

Furthermore, in the present embodiment, the upper surface 80A of the porous member 80 is substantially flush with the upper surface Pa of the substrate P held by the first holding portion 31 and the upper surface Ta of the cover member T held by the second holding portion 32.

Furthermore, the upper surface 80A of the porous member 80 may be arranged at the lower position (the position in the negative Z direction) than the upper surface Pa of the substrate P and the upper surface Ta of the cover member T, and may be arranged at the higher position (the position in the positive Z direction).

In the present embodiment, a distance L1 between the side surface Pc of the substrate P held by the first holding portion 31 and the first side surface 80B of the porous member 80 is greater than a distance L2 between the inside surface Tc of the cover member T held by the second holding portion 32 and the second side surface 80C of the porous member 80.

Furthermore, the distance L1 between the side surface Pc and the first side surface 80B may be smaller than the distance L2 between the inside surface Tc and the second side surface 80C, and may be substantially the same as the distance L2.

In the present embodiment, the substrate stage 2 has a space portion 23 communicating with the gap Ga. The space portion 23 is positioned below the gap Ga. In the present embodiment, at least a part of the porous member 80 is arranged at the space portion 23. In the present embodiment, the porous member 80 includes a first part 801 arranged at the gap Ga, and a second part 802 arranged at the space portion 23.

In the present embodiment, in relation to a radial direction with respect to the center of the first holding portion 31, a dimension Wa of the gap Ga is smaller than a dimension Wb of the space portion 23. Furthermore, a dimension Wa may be greater than a dimension Wb, and may be substantially the same as the dimension Wb.

Furthermore, in the present embodiment, in relation to the radial direction with respect to the center of the first holding portion 31, a dimension W2 of a second part 802 is also greater than a dimension W1 of a first part 801. Furthermore, the dimension W2 may be smaller than the dimension W1, and may be substantially the same as the dimension W1.

Furthermore, a dimension of the radial direction with respect to the center of the first holding portion 31 is a dimension in relation to the radial direction in the XY plane.

In the present embodiment, the porous member 80 is held by a case 81. The case 81 is arranged at the space portion 23, in such a manner as to come into contact with at least a part of the second part 802. In the present embodiment, the case 81 is arranged in such a manner as to come into contact with at least a part of each of a lower surface and a side surface of the second part 802. In the present embodiment, the case 81 is made of, for example, ceramic. Furthermore, the case 81 may be made of metal.

Furthermore, in the present embodiment, a support member 82 is arranged between the porous member 80 and the case 81, and the cover member T. The support member 82 is supported by at least a part of each of the porous member 80 (the second part 802) and the case 81. The support member 82 can face at least a part of a lower surface Tb of the cover member T. The support member 82 supports at least a part of the lower surface Tb of the cover member T.

In the present embodiment, the substrate stage 2 has a suction port 24 arranged at the space portion 23. In the present embodiment, the suction port 24 is formed at at least a part of an inside surface of the substrate stage 2 forming the space portion 23. The suction port 24 suctions at least a part of a fluid in the space portion 23, in such a manner that the space portion 23 becomes under negative pressure. The suction port 24 can suction any one of the liquid and a gas, or both of them, in the space portion 23.

The suction port 24 is connected to a fluid suction apparatus 26 through the channel 25. A fluid suction apparatus 26 can enable the suction port 24 to be connected to the vacuum system, and thus can suction any one of the liquid and the gas, or both of them through the suction port 24. At least a part of a channel 25 is formed inside of the substrate stage 2. The fluid (at least one of the liquid and the gas) suctioned through the suction port 24 is suctioned by the fluid suction apparatus 26 through the channel 25.

In the present embodiment, the case 81 has a hole (an opening) 81H linking an outside surface and an inside surface of the case 81 together. An opening 83 in the upper end of the hole 81H faces the lower surface of the porous member 80. An opening in the lower end of the hole 81H is linked to the suction port 24. The suction port 24 can suction the fluid in the space inside of the case 81 through the hole 81H, in such a manner that the space inside of the case 81 is under negative pressure In the present embodiment, the first holding portion 31 has, for example, the pin chuck mechanism. The first holding portion 31 has a peripheral wall portion 35, arranged at a support surface 31S of the substrate stage 2, which the lower surface Pb of the substrate P can face, and a support portion 36, arranged at a support surface 31S inside of a peripheral wall portion 35, which includes a plurality of pin members, and a suction port 37, arranged at the support surface 31S, which suctions the fluid. The suction port 37 is connected to the fluid suction apparatus. The fluid suction apparatus is controlled by the control apparatus 8. An upper surface of the peripheral wall portion 35 can face the lower surface Pb of the substrate P. The peripheral wall portion 35 can form a negative pressure space in at least a part of a space between the peripheral wall portion 35 and the lower surface Pb of the substrate P. Furthermore, in the supporting surface 31, the peripheral wall portion 35 is substantially in the form of a circle, and, as described above and below, the center of the first holding portion 31 is the center of the peripheral wall portion 35. Furthermore, in the present embodiment, in the XY plane, the peripheral wall portion 35 is substantially in the form of a circle (a circular ring shape). By a suction operation of the suction port 37 being performed in a state in which the lower surface Pb of the substrate P and the upper surface of the peripheral wall portion 35 come into contact with each other, the control apparatus 8 can cause a space 31H formed with the peripheral wall portion 35, the lower surface Pb of the substrate P, and the support surface 31S to be under negative pressure. As a result, the substrate P is held by the first holding portion 31. Furthermore, by the suction operation of the suction port 37 being stopped, the substrate P is released from the first holding portion 31.

In the present embodiment, by causing the space 31H to be under negative pressure, the lower surface of the substrate P is held by the upper end of a support portion 36 (the plurality of pin members). That is, at least a part of a holding surface 36S holding the substrate P is defined by the upper end of the support portion 36 (the plurality of pin members).

In the present embodiment, the second holding portion 32 has, for example, the pin chuck mechanism. A second holding portion 32 has a peripheral wall portion 38 which is arranged in such a manner as to surround the peripheral wall portion 35, in a support surface 32S of the substrate stage 2, and which the lower surface Tb of the cover member T can face, a peripheral wall portion 39 which is arranged in such as manner to surround the peripheral wall portion 38, in the support surface 32S, and which the lower surface Tb of the cover member T can face, a support portion 40 which is arranged at the support surface 32S between the peripheral wall portion 38 and the peripheral wall portion 39 and which includes the plurality of pin members, and a suction port 41, arranged at the supporting surface 32S, through which the fluid is suctioned. The suction port 41 is connected to the fluid suction apparatus. The fluid suction apparatus is controlled by the control apparatus 8. The upper surfaces of the peripheral wall portions 38 and 39 can face the lower surface Tb of the cover member T. The peripheral wall portions 38 and 39 can form a negative pressure space in at least a part of a space between the peripheral wall portions 38 and 39 and the lower surface Tb of the cover member T, respectively. By the suction operation through the suction port 41 being performed in a state in which the lower surface Tb of the cover member T and the upper surfaces of the peripheral wall portions 38 and 39 come into contact with each other, the control apparatus 8 can cause a space 32H formed with the peripheral wall portion 38, peripheral wall portion 39, the lower surface Tb of the cover member T, and a support surface 32S to be under negative pressure. As a result, the cover member T is held by the second holding portion 32. Furthermore, by the suction operation of the suction port 41 being stopped, the cover member T is released from the second holding portion 32.

The space portion 23 includes a space in the vicinity of the peripheral wall portion 35. In the present embodiment, the space portion 23 includes a space between the peripheral wall portion 35 and the peripheral wall portion 38.

Figure 4:
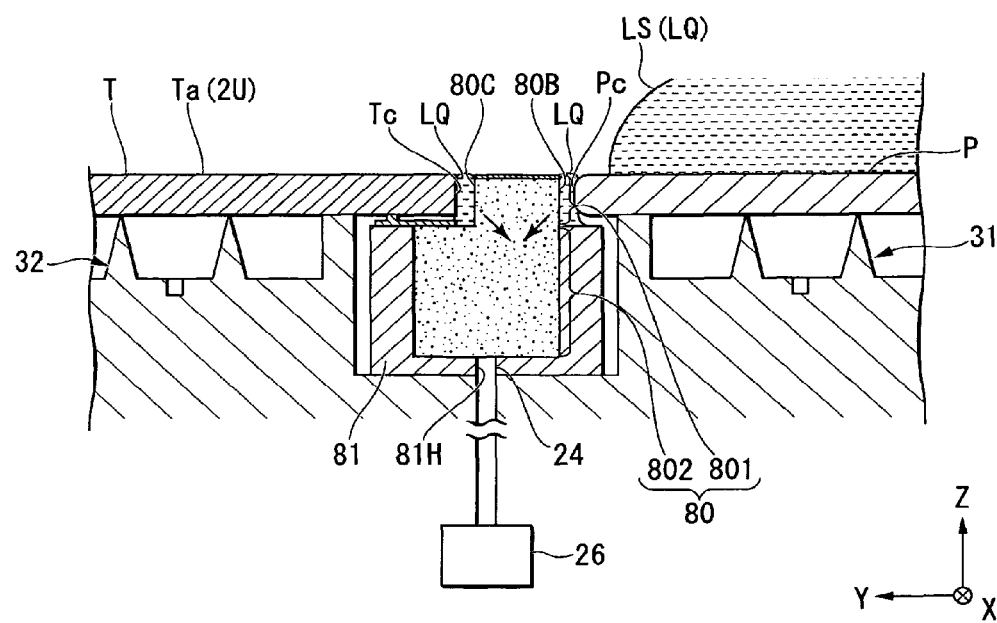
FIG. 4 is a view illustrating a part of the substrate stage relating to the first embodiment.

FIG. 4 is a view illustrating one example of a state in which at least a part of the liquid LQ which flows into the gap Ga is recovered through the porous member 80. In the present embodiment, a liquid immersion space LS is formed between the last optical element 12 and the liquid immersion member 7, and at least one of the substrate P held by the first holding portion 31 and the cover member T held by the second holding portion 32. Furthermore, the liquid immersion space LS can be formed above the gap Ga. At least a part of the liquid LQ in the liquid immersion space LS can flow into the gap Ga.

In the present embodiment, the control apparatus 8 recovers at least a part of the liquid LQ which flows into the gap Ga through the porous member 80. When recovering the liquid LQ which flows into the gap Ga, the control apparatus 8 connects the suction port 24 to the vacuum system by controlling the fluid suction apparatus 26. As a result, the fluid in the space portion 23 is suctioned through the suction port 24, and thus the space portion 23 is made under negative pressure.

As described above, the suction port 24 can suction the fluid in a space inside of a case 81, through a hole 81H. By the suction operation of the suction port 24 being performed, a space inside of the case 81 and pores at the porous member 80 which is arranged at the space inside of the case 81 are made under negative pressure. As a result, the fluid in the vicinity of the porous member 80 is suctioned through the pores in the porous member 80.

As shown in FIG. 4, by the suction operation of the suction port 24 being performed, the liquid LQ which flows into between the first side surface 80B of the porous member 80 and the side surface Pc of the substrate P is suctioned by the pores in the first side surface 80B. That is, the porous member 80 recovers the liquid LQ which flows into between the first side surface 80B and the side surface Pc of the substrate P through the pores in the first side surface 80B facing the side surface Pc of the substrate P.

Furthermore, as shown in FIG. 4, by the suction operation through the suction port 24 being performed, the liquid LQ which flows into between the second side surface 80C of the porous member 80 and the inside surface Tc of the cover member T is suctioned by the pores in the second side surface 80C. That is, the porous member 80 recovers the liquid LQ which flows into between the second side surface 80C and the inside surface Tc of the cover member T through the pores at the second side surface 80C facing the inside surface Tc of the cover member T.

At least a part of the liquid LQ recovered through the porous member 80 is suctioned through the suction port 24. In the present embodiment, at least a part of the liquid LQ recovered through the first and second side surfaces 80B and 80C flows through the inside of the porous member 80 and then is suctioned through the suction port 24. As a result, the liquid LQ is removed from the gap Ga and the space portion 23.

In the present embodiment, a lower surface and a side surface of the second part 802 are covered by the case 81. The first and second side surfaces 80B and 80C of the first part 801 is not covered by the case 81. The first and second side surfaces 80B and 80C of the first part 801 can come into contact with the liquid LQ which flows into the gap Ga. Accordingly, by the suction operation through the suction port 24 being performed, the liquid LQ which flows into the gap Ga is smoothly recovered through the first and second side surfaces 80B and 80C.

As described above, in the present embodiment, the contact angle of the upper surface 80A of the porous member 80 with respect to the liquid LQ is greater than the contact angles of the first and second side surfaces 80B and 80C. In the present embodiment, the flowing of the liquid LQ into the pores at the upper surface 80A is suppressed more than the flowing of the liquid LQ into the pores at the first and second side surfaces 80B and 80C. For example, the porous member 80 may not recover the liquid LQ through the pores in the upper surface 80A.

Furthermore, the flowing of the liquid LQ into the pores in the upper surface 80A may not be suppressed more than the flowing into the pores in the first and second side surfaces 80B and 80C. That is, the porous member 80 may recover the liquid LQ through the upper surface 80A.

Figure 5:
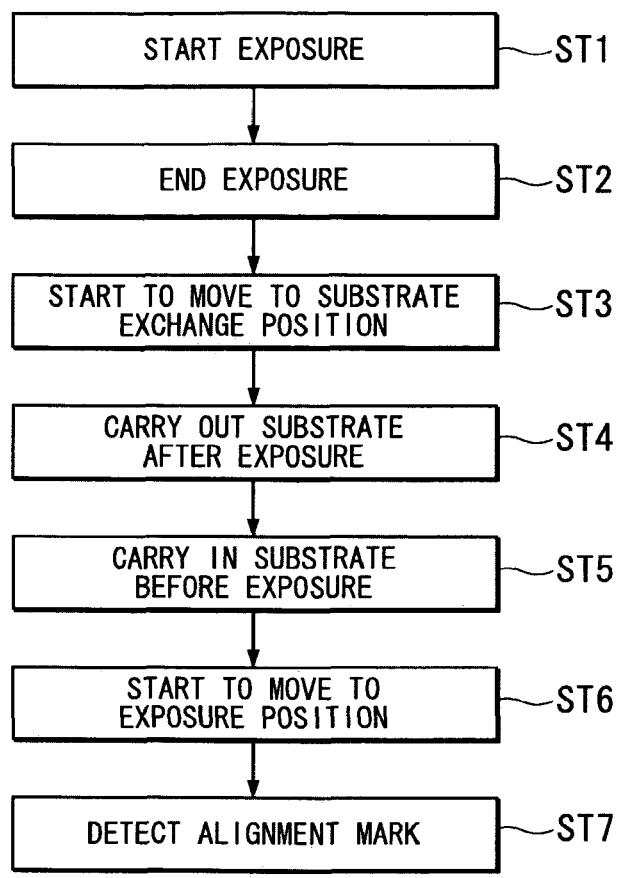
FIG. 5 is a flow chart illustrating one example of an exposure method relating to the first embodiment.
Figure 6:
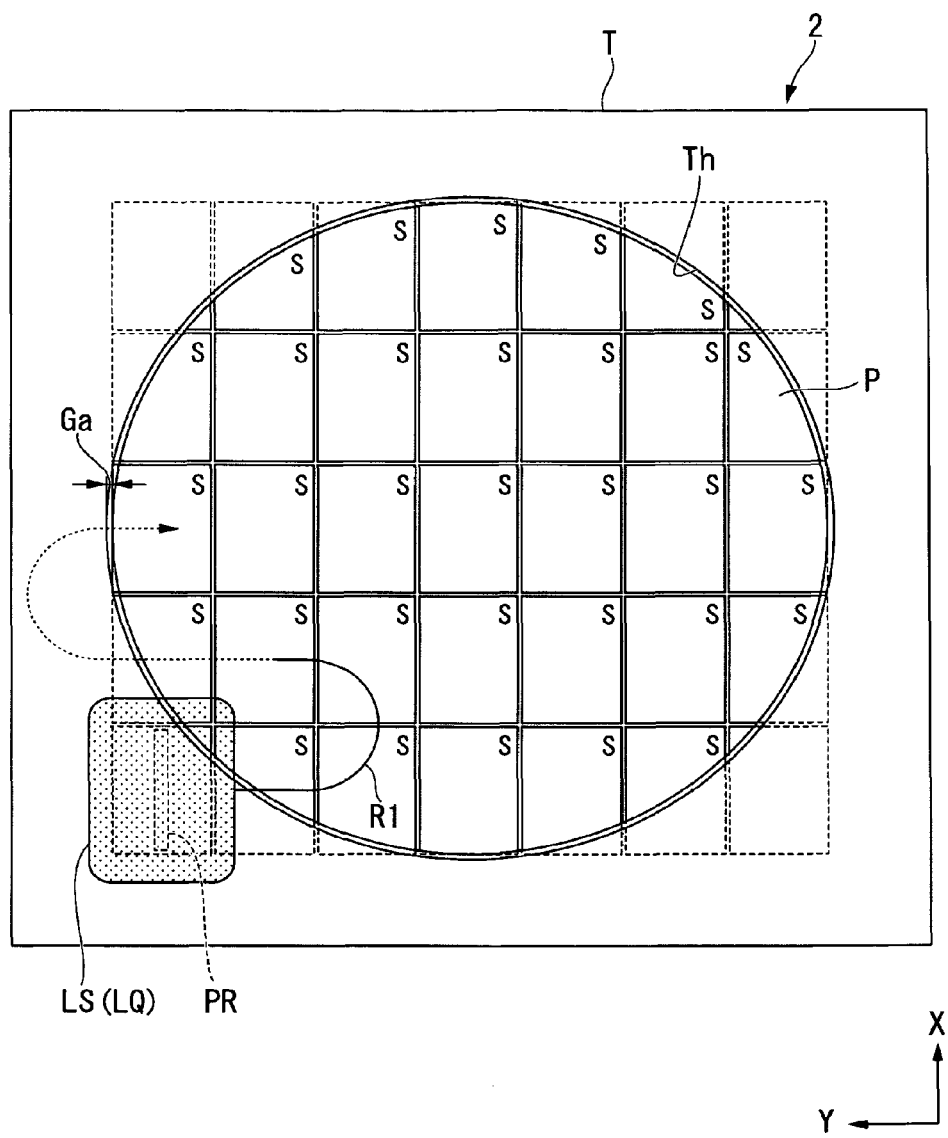
FIG. 6 is a view to describe one example of the exposure method relating to the first embodiment.
Figure 7:
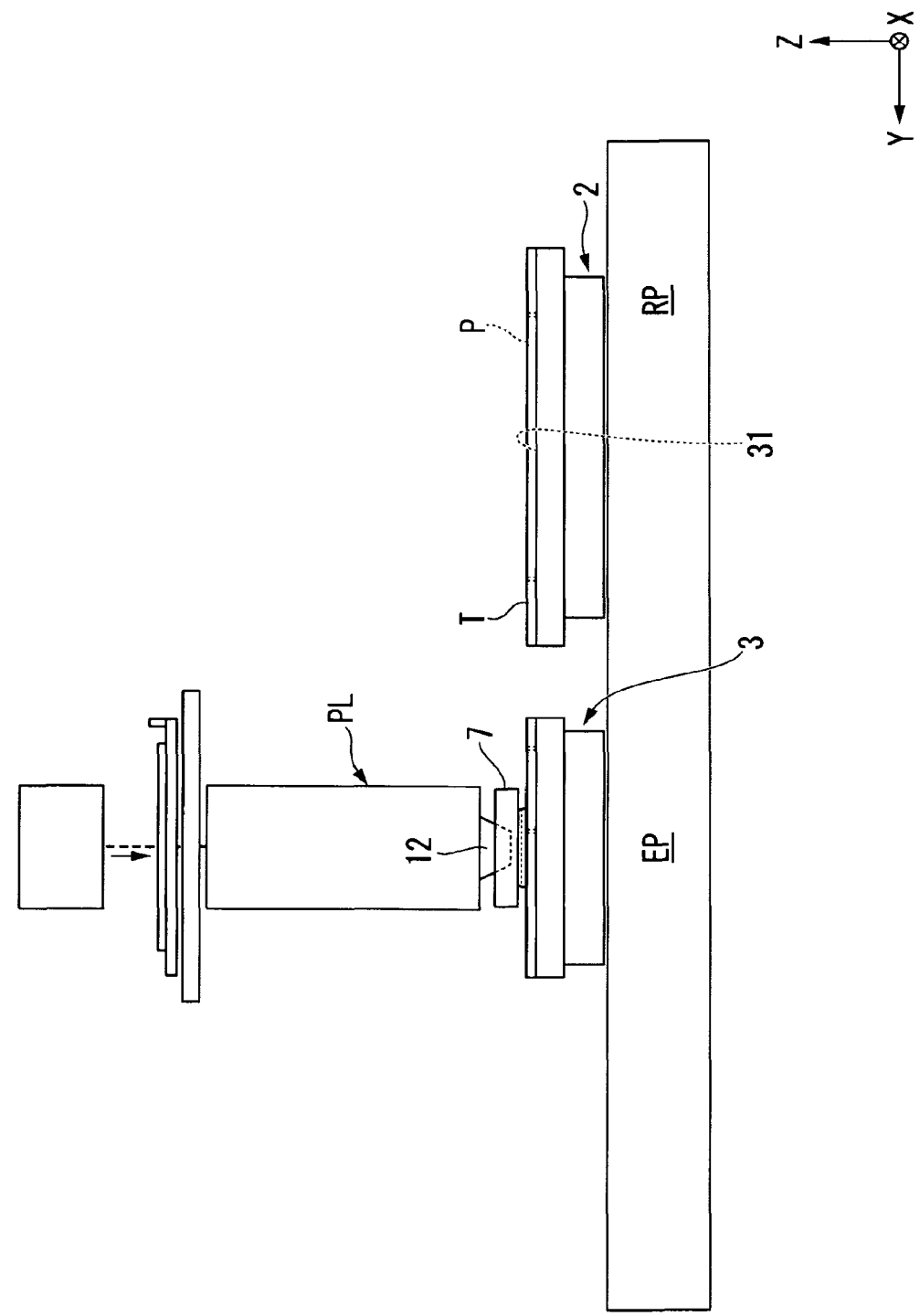
FIG. 7 is a view to describe one example of the exposure method relating to the first embodiment.

Next, one example of operation of the exposure apparatus EX is described referring to FIGS. 5, 6, and 7. FIG. 5 is a flow chart illustrating one example of the operation of the exposure apparatus EX relating to the present embodiment. FIG. 6 is a view illustrating one example of the substrate P held by the first holding portion 31 (the substrate stage 2). FIG. 7 is a view illustrating one example of operation of the substrate stage 2 and the measurement stage 3.

In the present embodiment, the substrate stage 2 is movable between at least a first position EP and a second position RP. The first position EP is a position where the liquid immersion space LS can be formed between the last optical element 12 and the liquid immersion member 7, and at least one of the upper surface Pa of the substrate P held by the first holding portion 31 and the upper surface 2U (Ta) of the substrate stage 2. In other words, the first position EP is a position where the last optical element 12 and the liquid immersion member 7 face each other.

The second position RP is a position where the liquid immersion space LS cannot be formed between the last optical element 12 and the liquid immersion member 7, and at least one of the upper surface Pa of the substrate P held by the first holding portion 31 and the upper surface 2U of the substrate stage 2.

The first position EP is a position where the substrate P held by the first holding portion 31 can be exposed. In the present embodiment, the second position RP is, for example, a substrate exchange position where at least one of an operation of carrying the exposed substrate P from the first holding portion 31 and an operation of carrying the substrate P before the exposure to the first holding portion 31 is performed.

Furthermore, the second position EP is not limited to the substrate exchange position.

In the below-written description, the first position EP is properly referred to as an exposure position EP and the second position RP is properly referred to as a substrate exchange position RP.

Furthermore, in the below-written description, in the substrate exchange position RP, the process of carrying the substrate P before the exposure to the first holding portion 31, and the process of carrying the exposed substrate P from the first holding portion 31 are properly referred to as a substrate exchange process.

To expose the substrate P held by the first holding portion 31, after moving the substrate stage 2 to the exposure position EP, and forming the liquid immersion space LS with the liquid LQ between the last optical element 12 and the liquid immersion member 7, and the substrate stage 2 (the substrate P), the control apparatus 8 starts to perform the exposure process on the substrate P (Step ST1).

The exposure apparatus EX of the present embodiment is a scanning-type exposure apparatus (so-called scanning stepper) which projects an image of a pattern of the mask M onto the substrate P, while causing synchronized movements of the mask M and the substrate P in a predetermined scanning direction. In the present embodiment, the direction of scanning the substrate P (the direction of synchronized movement) is defined as the Y axis direction, and also the direction of scanning the mask M (the direction of synchronized movement) is defined as the Y axis direction. The control apparatus 8 irradiates the substrate P with the exposure light EL through the optical projection system PL and the liquid LQ at the liquid immersion space LS on the substrate P, while moving the substrate P with respect to the projection area PR of the optical projection system PL in the Y axis direction and moving the mask M with respect to the illumination area IR of the illumination system IL in the Y axis direction by synchronizing the mask M with the movement of the substrate P in the Y axis direction. As a result, the substrate P is exposed by the exposure light EL through the liquid LQ, and the image of the pattern of the mask M is projected on the substrate P through the optical projection system PL and the liquid LQ.

As shown in FIG. 6, in the present embodiment, a plurality of shot areas S which are exposure object areas on the substrate P are arranged at the form of a matrix. The control apparatus 8 sequentially exposes the plurality of shot areas S determined on the substrate P.

When the shot area S on the substrate P is exposed, the last optical element 12 and liquid immersion member 7, and the substrate P face each other, and the liquid immersion space LS is formed in such a manner that the light path K of the exposure light EL between the last optical element 12 and the substrate P is filled with the liquid LQ. When the plurality of shot areas S on the substrate P are sequentially exposed, the substrate stage 2 is moved by the drive system 5 in the XY plane, in a state in which the liquid immersion space LS is formed with the liquid LQ between the last optical element 12 and the liquid immersion member 7, and at least one of the upper surface Pa of the substrate P and the upper surface 2U of the substrate stage 2. The control apparatus 8 performs the exposure on the substrate P, moving the substrate stage 2, in a state in which the liquid immersion space LS is formed with the liquid LQ between the last optical element 12 and the liquid immersion member 7, and at least one of the upper surface Pa of the substrate P and the upper surface 2U of the substrate stage 2.

For example, to expose the initial shot area S (the first shot area S) among the plurality of shot areas S on the substrate P, the control apparatus 8 moves the first shot area S to an exposure start position. The control apparatus 8 irradiates the first shot area S with the exposure light EL, while moving the first shot area S (the substrate P) with respect to the projection area PR of the optical projection system PL in the Y axis direction in a state in which the liquid immersion space LS is formed.

After finishing the exposure of the first shot area S, to expose the next second shot area S, the control apparatus 8 moves the substrate P in the X axis direction (or, the direction inclined with respect to the X axis direction in the XY plane) and moves the second shot area S to the exposure start position, in a state in which the liquid immersion space LS is formed. The control apparatus 8 exposes the second shot area S in the same way as it exposes the first shot area S.

The control apparatus 8 sequentially exposes the plurality of shot areas S on the substrate P through the optical projection system PL and the liquid LQ in the liquid immersion space LS, repeating the operation (the scan exposure process) that irradiates the shot area S with the exposure light EL, while moving the shot area S with respect to the projection area PR in the Y axis direction, and the operation (the stepping operation) that moves the next shot area S to the exposure start position after finishing the exposure of the shot area S. The exposure light EL sequentially irradiates the plurality of the shot areas S on the substrate P.

In the present embodiment, the control apparatus 8 sequentially exposes the plurality of shot areas S on the substrate P with the exposure light EL through the liquid LQ, by illuminating the projection area PR with the exposure light EL, moving the substrate stage 2 in such a manner that the projection area PR of the optical projection system PL and the substrate P relatively move along a movement trail indicated by an arrow R1 in FIG. 6. At least a part of the time period during the movement of the substrate stage 2 in the exposure of the substrate P, the liquid immersion space LS is formed over the gap Ga.

By the exposure of the last shot area S among the plurality of shot areas S on the substrate P being finished, in other words, by the irradiation of the plurality of shot areas S by the exposure light EL being finished, the exposure of the substrate P is finished (Step ST2).

After finishing the irradiation of the plurality of shot area S by the exposure light EL (after finishing the exposure of the substrate P), the control apparatus 8 moves the substrate stage 2 to the substrate exchange position RP to perform the substrate exchange process (Step ST3).

As shown in FIG. 7, after the substrate stage 2 is arranged at the substrate exchange position RP, the control apparatus 8 carries (unloads) the exposed substrate P from the first holding portion 31 by using a substrate conveying apparatus (not shown) (Step ST4).

After the exposed substrate P is carried (unloaded) from the first holding portion 31, the control apparatus 8 carries (loads) the substrate P before the exposure to the first holding portion 31 by using the substrate conveying apparatus (not shown) (Step ST5).

Furthermore, as shown in FIG. 7, when the substrate exchange process is performed, the measurement stage 3 is arranged at the exposure position EP. The control apparatus 8 performs a predetermined measurement operation using the measurement stage 3 (the measurement member C and the measurement instrument), when necessary. The substrate P before the exposure is loaded to the first holding portion 31, and after the measurement operation using the measurement stage 3 is finished, the control apparatus 8 moves the substrate stage 2 to the exposure position EP (Step ST6).

In the present embodiment, the control apparatus 8 detects the alignment mark of the substrate P held by the substrate stage 2 (the first holding portion 31) using an alignment system 302, when moving the substrate stage 2 from the substrate exchange position RP to the exposure position EP (Step ST7). Furthermore, the control apparatus 8 detects the position of the upper surface Pa of the substrate P held by the substrate stage 2 (the first holding portion 31) by using a surface position detection system 303, when moving the substrate stage 2 from the substrate exchange position RP to the exposure position EP.

After the detection of the alignment mark of the substrate P and the detection of the position of the upper surface Pa of the substrate is terminated, the control apparatus 8 starts the exposure of the substrate P, while adjusting the position of the substrate P based on the detection result. In the below-written description, the same process is repeated, and a plurality of substrates P is sequentially exposed.

In the present embodiment, the suction operation through the suction port 24 (the porous member 80) is performed during each of at least a part of a first period during which the exposure of the substrate P is performed, and at least a part of a second period during which the exposure of the substrate P is not performed.

In the present embodiment, the first period includes a period during which the substrate stage 2P is arranged at the exposure position EP. Furthermore, the first period includes a period from the time when the exposure of the substrate P is started (Step ST1) to the time when the exposure of the substrate P is ended (Step ST2).

In the present embodiment, the first period includes a period from the time when the exposure of the initial shot area S among the plurality of shot areas S is started to the time when the exposure of the last shot area S is ended. The control apparatus 8 continues to perform the fluid suction operation of the suction port 24 during the start of the exposure of the initial shot area S to the termination of the exposure of the last shot area S among the plurality of shot areas S.

As a result, for example, even though the liquid immersion space LS is formed above the gap Ga and the liquid LQ at the liquid immersion space LS flows into the gap Ga, during at least a part of the first period during which the exposure light EL is sequentially irradiated to the plurality of shot areas S, the liquid LQ which flows into the gap Ga is immediately suctioned through the suction port 24 (the porous member 80) in the first period. Furthermore, the liquid LQ which flows into the space portion 23 through the gap Ga is also suctioned through the suction port 24 (the porous member 80).

In the present embodiment, the second period includes a period following the time at which the irradiation of the substrate P by the exposure light EL is ended. In the present embodiment, the second period includes a period following the time at which the irradiation of the plurality of shot areas S by the exposure light EL is ended. In other words, the second period includes a period following the time at which the last shot area S among the plurality of shot areas S is exposed. Even though the liquid LQ in the space portion 23 cannot be sufficiently suctioned, by the suction operation through the suction port 24 (the porous member 80) being performed during the first period, by the suction operation through the suction port 24 (the porous member 80) being performed in the second period, the liquid LQ is removed from the gap Ga (the space portion 23) by the suction operation through the suction port 24 (the porous member 80) being performed during the second period.

Furthermore, in the present embodiment, the second period includes a period preceding the time at which the irradiation of the substrate P by the exposure light EL is started. In the present embodiment, the second period includes a period preceding the time at which the irradiation of the plurality of shot areas S by the exposure light EL is started. In other words, the second period includes a period preceding the time at which the initial shot area S among the plurality of shot areas S is exposed. The exposure of the substrate P can be started after the liquid LQ is removed from the gap Ga (the space portion 23), by the suction operation of the suction port 24 (the porous member 80) being performed in the second period.

In the present embodiment, the control apparatus 8 makes a suction force of the suction port 24 (the porous member 80), during at least a part of the first period during which the exposure of the substrate P is performed, smaller than the suction force of the suction port 24 (the porous member 80), during the second period during which the exposure of the substrate P is not performed. That is, the control apparatus 8 suctions the fluid at the gap Ga (the space portion 23) with a first suction force through the suction port 24 during at least a part of the first period, and suctions the fluid at the gap Ga (the space portion 23) with a second suction force, greater than the first suction force, through the suction port 24, in the second period. In other words, the control apparatus 8 suctions the fluid by a first amount of flowing fluid per unit time through the suction port 24 (the porous member 80), during at least a part of the first period, and suctions the fluid through the suction port 24 (the porous member 80), by a second amount of flowing fluid, larger than the first amount of flowing fluid, per unit time, in the second period.

In the present embodiment, among a plurality of substrates P which are sequentially exposed, the second period includes at least a part of the period from the time when the exposure of a first substrate P is ended (when the exposure of the last shot area S is ended) to the time when the exposure of a next second substrate P is started (when the exposure of the initial shot area S is started).

For example, the second period may be a period from the time when the exposure of the first substrate P is ended (Step ST2) and to the time when the exposed first substrate P is carried from the first holding portion 31, the second substrate P before the exposure is carried to the first holding portion 31, and the detection of the alignment mark of the second substrate P before the exposure is started (Step ST7). That is, in the present embodiment, the second period may be a period from the time when the exposure of the substrate P is ended (Step ST2) to the time when the alignment mark of the next substrate P is detected (Step ST7).

Furthermore, the second period may be a period from the time when the irradiation of the substrate P by the exposure light EL is ended (Step ST2) until to the time when the movement of the substrate stage 2, which holds the substrate P before the exposure by the first holding portion 31, to the exposure position EP is started (Step ST6).

Furthermore, the second period may be a period from the time when the irradiation of the substrate P by the exposure light EL is ended (Step ST2) until to the time when the substrate P before the exposure is carried to the first holding portion 31 (Step ST5).

Furthermore, the second period may be also a period from the time when the irradiation of the substrate P by the exposure light EL is ended (Step ST2) until to the time when the substrate P is carried from the first holding portion 31 (Step ST4).

Furthermore, the second period may be a period from the time when the irradiation of the substrate P by the exposure light EL is ended (Step ST2) until to the time when the movement of the substrate stage 2 to the substrate exchange position EP is started with the exposed substrate P being held by the first holding portion 31 (Step T3).

Furthermore, the second period may be a period during which the substrate stage 2 is arranged at the substrate exchange position RP. Furthermore, the second period may be a period during which the substrate P is not held by the first holding portion 31. The period during which the substrate P is not held by the first holding portion 31 includes a period (the substrate exchange operation period) from the time when the exposed substrate P is carried from the first holding portion 31 (Step ST4) until to the time when the substrate P before the exposure is carried to the first holding portion 31 (Step ST5). Furthermore, the period during which the substrate P is not held by the first holding portion 31 is not limited to during the substrate exchange operation period.

Furthermore, the second period may be a period during which steps ST3 to ST7 are performed, may be a period during which steps ST3 to ST6 are performed, may be a period during which steps ST3 to ST5 are performed, may be a period during which steps ST3 to ST4 are performed, may be a period during which steps ST4 to ST7 are performed, and may be a period during which steps ST4 to ST6 are performed.

In the present embodiment, the control apparatus 8 suctions the fluid through the suction port 24 (the porous member 80) with the first suction force during the exposure of the substrate P (the plurality of shot areas S), and changes the suction force of the suction port 24 (the porous member 80) from the first suction force to the second suction force at the time when the irradiation of the last shot area S on the substrate P by the exposure light EL is ended (Step ST2). In such a case, the second period includes a period during which the liquid immersion space LS is formed between the last optical element 12 and the liquid immersion member 7, and at least one of the upper surface of the substrate P and the upper surface 2U of the substrate stage 2, after the irradiation of the substrate P (the plurality of shot areas S) by the exposure light EL is ended.

Furthermore, the suction force of the suction port 24 (the porous member 80) may be changed from the first suction force to the second suction force, when the liquid immersion space LS changes from a state of being formed on the substrate stage 2 to a state of being formed on the measurement stage 3 (for example, step ST3). In such a case, after the irradiation by the exposure light is ended, the fluid is suctioned with the first suction force through the suction port 24 (the porous member 80), during which the liquid immersion space LS is formed over at least one of the upper surface of the substrate P and the upper surface 2U of the substrate stage 2.

Furthermore, the suction force of the suction port 24 (the porous member 80) may be changed from the first suction force to the second suction force, when the exposed substrate P is carried from the first holding portion 31 (Step ST4).

Furthermore, the suction force of the suction port 24 (the porous member 80) may be changed from the second suction force to the first suction force, when the substrate P before the exposure is carried to the first holding portion 31 (Step ST5).

Furthermore, the suction force of the suction port 24 (the porous member 80) may be changed from the second suction force to the first suction force, when the liquid immersion space LS changes from a state of being formed on the measurement stage 3 to a state of being formed on the substrate stage 2 (for example, Step ST6).

Furthermore, the suction force of the suction port 24 (the porous member 80) may be changed from the second suction force to the first suction force, when the alignment mark of the substrate P is detected (Step ST7).

Furthermore, the suction force of the suction port 24 (the porous member 80) may be changed from the second suction force to the first suction force, at the time when the irradiation of the initial shot area S on the substrate P by the exposure EL is started (Step ST1).

Furthermore, in the present embodiment, for example, the operation of suctioning the fluid through the suction port 24 (the porous member 80) may be also performed during the scan exposure process in which the exposure light EL irradiates the substrate P, and the operation of suctioning the fluid through the suction port 24 (the porous member 80) may be stopped during the stepping operation in which the exposure light EL does not irradiate the substrate P. Furthermore, the operation of suctioning the fluid through the suction port 24 (the porous member 80) may be performed during the stepping operation in which the exposure light EL does not irradiate the substrate P and the operation of suctioning the fluid through the suction port 24 (the porous member 80) may be stopped in the scan exposure process in which the exposure light EL irradiates the substrate P (the shot area S).

Furthermore, in the present embodiment, the fluid may be suctioned with first suction force through the suction port 24 (the porous member 80) during in the scan exposure process, and may be suctioned with the second suction force through the suction port 24 (the porous member 80) during in the stepping operation.

As is described above, according to the present embodiment, the remaining of the liquid LQ can be suppressed because the liquid LQ which flows into the gap Ga is made to be recovered through the porous member 80 of which at least a part is arranged at the gap Ga. Accordingly, an occurrence of the poor quality in exposure and an occurrence of a defective device can be suppressed.

Furthermore, in the present embodiment, since the upper surface 80A of the porous member 80 is liquid-repellent with respect to the liquid LQ, the remaining of the liquid LQ on the upper surface 80A can be suppressed.

Second Embodiment

Next, a second embodiment is described. In the below-written description, the same component as or the equivalent component to the component of the above-described embodiment is given a like reference numeral and therefore its description is brief or omitted.

Figure 8:
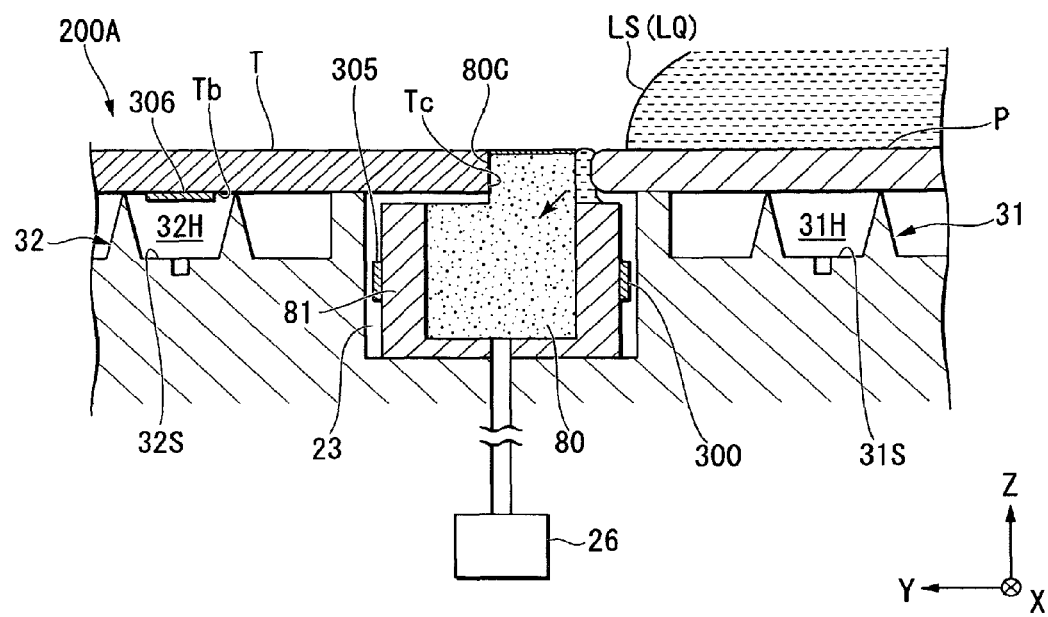
FIG. 8 is a view illustrating a part of a substrate stage relating to a second embodiment.

FIG. 8 is a view illustrating one example of a substrate stage 200A relating to the second embodiment. As shown in FIG. 8, in the present embodiment, a porous member 80 is arranged in such a manner that a second side surface 80C of a porous member 80 and an inside surface Tc of a cover member T come into contact with each other. Furthermore, in an example shown in FIG. 8, a support member 82 is omitted. Furthermore, in the example shown in FIG. 8, a support member 82 may be also arranged.

Furthermore, in the present embodiment, a substrate stage 200A includes the temperature adjustment apparatus 305 adjusting the temperature of the porous member 80. The temperature adjustment apparatus 305 includes, for example, a Peltier element.

In the present embodiment, the temperature adjustment apparatus 305 is arranged in such a manner as to come into contact with a case 81. The temperature adjustment apparatus 305 adjusts the temperature of the porous member 80 through the case 81. The temperature adjustment apparatus 305 can adjust the temperature of the case 81 as well.

Furthermore, the temperature adjustment apparatus 305 may be arranged in such a manner as to come into contact with at least a part of the porous member 80.

Furthermore, the temperature adjustment apparatus 305 may include, for example, a supply apparatus supplying temperature-controlled fluid (any one of the gas and the liquid, or both of them) to a channel formed inside of the case 81.

Furthermore, in the present embodiment, a substrate stage 2 includes the temperature adjustment apparatus 306 adjusting the temperature of a cover member T. The temperature adjustment apparatus 306 includes, for example, a Peltier element. In the present embodiment, the temperature adjustment apparatus 306 is arranged in such a manner as to come into contact with a lower surface Tb of the cover member T. In the present embodiment, the temperature adjustment apparatus 306 is arranged at a space 32H between a peripheral wall portion 38 and a peripheral wall portion 39, in such a manner as to come into contact with the lower surface Tb of the cover member T. Furthermore, the temperature adjustment apparatus 306 may not come into contact with the cover member T. For example, the temperature adjustment apparatus 306 may be arranged at a support surface 32S in such a manner as to face the lower surface Tb of the cover member T.

Furthermore, the temperature adjustment apparatus 306 may include, for example, a supply apparatus supplying temperature-controlled fluid (any one of the gas and the liquid, or both of them) to a channel formed inside of the cover member T.

Furthermore, the temperature adjustment apparatus adjusting the temperature of the porous member 80 described in the first embodiment, and the temperature adjustment apparatus adjusting the temperature of the cover member T may be provided.

Furthermore, in the above-described embodiment, a gap may not be in the vicinity of a case 81. A recovery port may be provided, through which Liquid LQ which flows into the gap in the vicinity of the case 81 is recovered.

Third Embodiment

Next, a third embodiment is described. In the below-written description, the same component as or the equivalent component to the component of the above-described embodiment is given a like reference numeral and therefore its description is brief or omitted.

Figure 9:
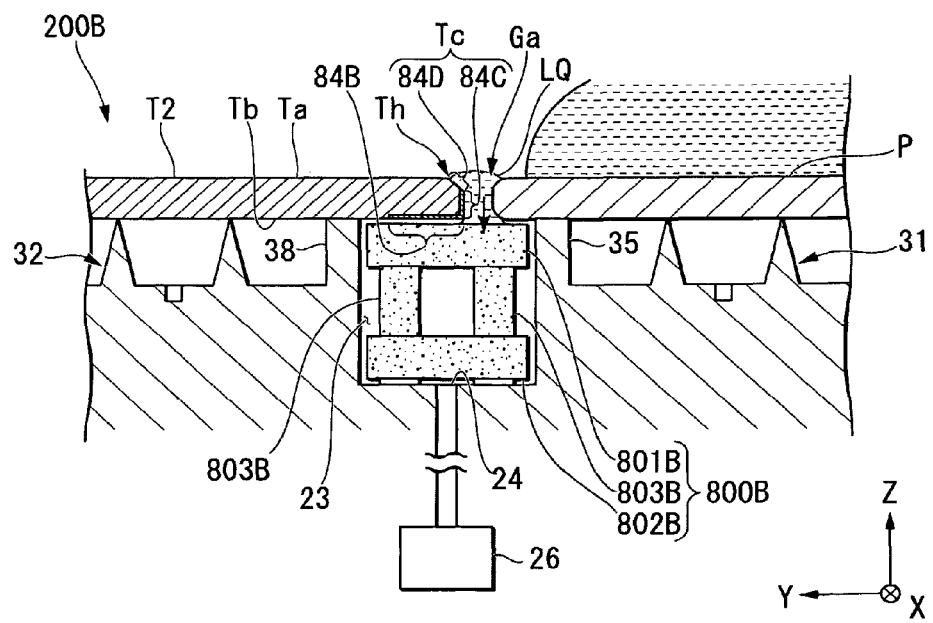
FIG. 9 is a view illustrating a part of a substrate stage relating to a third embodiment.

FIG. 9 is a view illustrating one example of a substrate stage 200B relating to the third embodiment. In FIG. 9, a porous member 800B includes a part 801B in the form of a plate, a part 802B in the form of a plate, and a part 803B in the form of a rod.

The part 801B is arranged at a space portion 23 in such a manner as to face a gap Ga. The part 802B is arranged at a space portion 23 in such a manner as to face the suction port 24. The part 803B is arranged between the part 801B and the part 802B.

In the present embodiment, the porous member 800B is not provided in the gap Ga. Furthermore, at least a part of the porous member 800B (the part 801B) may be arranged at the gap Ga.

Furthermore, in an example shown in FIG. 9, an area 84B, a part of a lower surface Tb of a cover member T2, and an area 84C, a part of an inside surface Tc are lyophilic with respect to liquid LQ. The area 84B is an area which is more to the inside than the peripheral wall portion 38 with respect to the center of an opening Th (the first holding portion 31). The area 84C is an area which includes the lower end of an inside surface Tc, but does not include the upper end. The lower end of the area 84C is linked to the area 84B. The area 84B on the lower surface Tb faces an upper surface of the porous member 800B (the part 801B).

In the present embodiment, the lower surface Tb (the area 84B) and the upper surface of the porous member 800B (the part 801B) face each other with the gap in between. Furthermore, the lower surface Tb (the area 84B) and the upper surface of the part 800B (the part 801B) may come into contact with each other.

In the present embodiment, contact angles of the areas 84B and 84C with respect to the liquid LQ is, for example, smaller than 90 degrees. The contact angles of the areas 84B and 84C with respect to the liquid LQ, for example may be equal to, or smaller than 80 degrees, and may be equal to, or smaller than 70 degrees.

In the present embodiment, a part of the lower surface Tb and a part of the inside surface Tc is coated with lyophilic material. That is, a film including the lyophilic material is arranged at a part of the lower surface Tb and a part of the inside surface Tc. Furthermore, the areas 84B and 84C may be, for example, a surface made of titanium.

In the present embodiment, a contact angle of the area 84C on the inside surface Tc of the cover member T with respect to the liquid LQ is smaller than a contact angle of the upper surface Ta of the cover member T. In the present embodiment, the contact angle of the area 84B on the lower surface Tb of the cover member T with respect to the liquid LQ is smaller than the contact angle of the upper surface Ta of the cover member T.

Furthermore, in the present embodiment, an area 84D on the inside surface Tc above the area 84C is upward inclined, in the outside direction with respect to the center of an opening Th (the first holding portion 31).

The liquid LQ which flows into the gap Ga is recovered through a porous member 80B. At least a part of the liquid LQ recovered through a porous member 800B is suctioned through the suction port 24.

As is described above, even in the present embodiment, the liquid LQ which flows into the gap Ga can be recovered, and thus the remaining of the liquid LQ can be suppressed.

Fourth Embodiment

Next, a fourth embodiment is described. In the below-written description, the same component as or the equivalent component to the component of the above-described embodiment is given a like reference numeral and therefore its description is brief or omitted.

Figure 10:
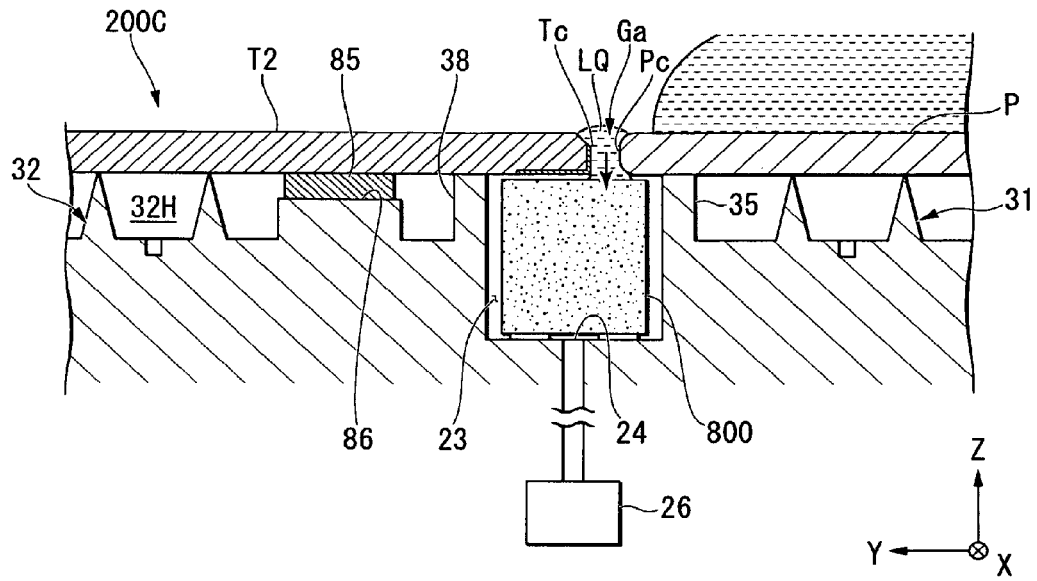
FIG. 10 is a view illustrating a part of a substrate stage relating to a fourth embodiment.

FIG. 10 is a view illustrating one example of a substrate stage 200C relating to the fourth embodiment. In FIG. 10, the substrate stage 2 includes an ultrasonic generation apparatus 85 which gives an ultrasonic wave to the cover member T2. The ultrasonic generation apparatus 85 includes, for example, an ultrasonic generation element such as a piezo-electric element.

Furthermore, in the present embodiment, the cover member T2 described in the third embodiment is held by a second holding portion 32, but may be held by a second holding portion 32 described in the first and second embodiments.

The ultrasonic generation apparatus 85 comes into contact with at least a part of the cover member T2. In the present embodiment, the ultrasonic generation apparatus 85 is arranged to come into contact with a rear surface Tb of the cover member T2.

In the present embodiment, the ultrasonic generation apparatus 85 is arranged at a space 32H between a peripheral wall portion 38 and a peripheral wall portion 39, in such a manner as to come into contact with the rear surface Tb. In the present embodiment, the second holding portion 32 is arranged at the space 32H, and has a support portion 86 supporting the ultrasonic generation apparatus 85.

A porous member 800 is arranged at a space portion 23. In the present embodiment, the porous member 800 is arranged at a gap Ga, but at least a part of the porous member 800 may be arranged even in the gap Ga.

By operation of the ultrasonic generation apparatus 85, the cover member T2 vibrates. By vibration of the cover member T2, liquid LQ existing in the gap Ga smoothly moves to the space portion 23. For example, in a case where the liquid LQ remains behind in the gap Ga, the liquid LQ falls into the space portion 23 by the vibration of the cover member T2. Furthermore, in a case where the liquid LQ (for example, the droplet of liquid LQ) adheres to the inside surface Tc of the cover member T2, the liquid LQ adhering to the inside surface Tc falls into the space portion 23 by the vibration of the cover member T2. Furthermore, in a case where an interface of the liquid LQ exits between the inside surface Tc and the side surface Pc, the interface of the liquid LQ moves to the space portion 23 by the vibration of the cover member T2.

The liquid LQ moving from the gap Ga to the space portion 23 is recovered through the porous member 800.

At least a part of the liquid LQ recovered through the porous member 800 is suctioned through the suction port 24.

As is described above, even in the present embodiment, the remaining of the liquid LQ can be suppressed by the liquid LQ which flows into the gap Ga being recovered.

Fifth Embodiment

Next, a fifth embodiment is described. In the below-written description, the same component as or the equivalent component to the component of the above-described embodiment is given a like reference numeral and therefore its description is brief or omitted.

Figure 11:
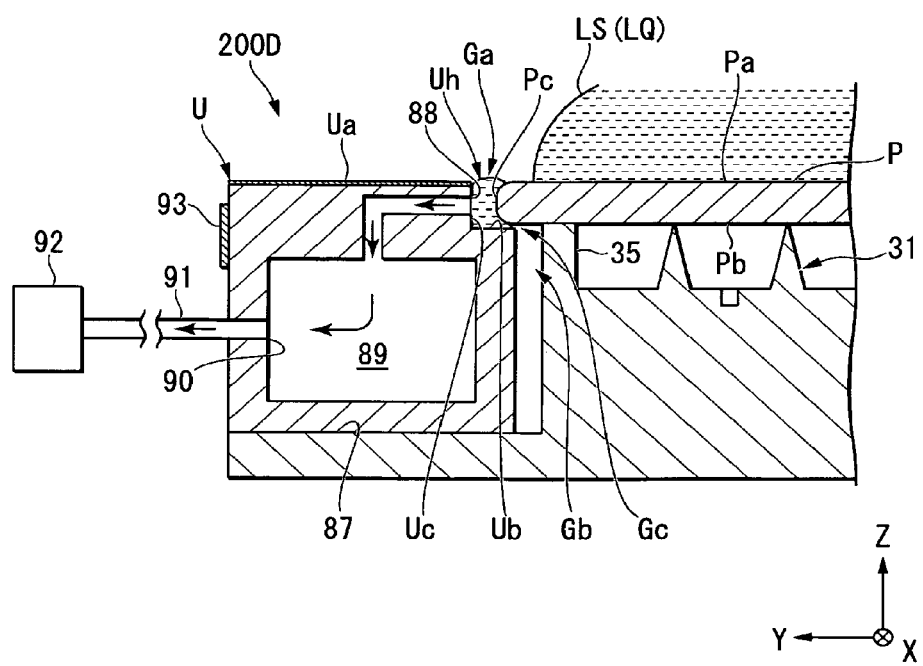
FIG. 11 is a view illustrating a part of a substrate stage relating to a fifth embodiment.

FIG. 11 is a view illustrating one example of a substrate stage 200D relating to the fifth embodiment. In FIG. 11, the substrate stage 200D includes a first holding portion 31 holding a lower surface Pb of a substrate P in such a manner that the lower surface Pb of the substrate P can be released, and a recovery member U having an upper surface Ua which defines an opening Uh where the substrate P can be arranged, and which is arranged at the vicinity of an upper surface Pa of the substrate P, in a state in which the substrate P is held by the first holding portion 31.

In the present embodiment, the recovery member U is arranged at at least a part of the vicinity of the first holding portion 31. At least a part of the recovery member U is arranged in such a manner as to surround a peripheral wall portion 35. In the present embodiment, a gab Gb is formed between the recovery member U and the peripheral wall portion 35. Furthermore, the recovery member U and at least a part of the peripheral wall portion 35 may come into contact with each other.

In the present embodiment, the recovery member U is supported by a holding unit 87 of a substrate stage 2. The holding unit 87 holds the recovery member U in such a manner that the recovery member U can be released. Furthermore, the recovery member U and the substrate stage 2 may be a single body.

In the present embodiment, an upper surface Ua is substantially parallel with the XY plane. The upper surface Ua and the upper surface Pa are arranged at the same plane (are flush with each other). Furthermore, a position of the upper surface Ua and a position of the upper surface Pa in relation to the Z axis direction may be different from each other. For example, the upper surface Ua may be arranged at a lower position (a position in the negative Z direction) than the upper surface Pa, and may be arranged at a higher position (a position in the positive direction) than the upper surface Pa.

Furthermore, the recovery member U has an inside surface Uc which a side surface Pc of the substrate P held by the first holding portion 31 can face, and a facing surface Ub of which at least a part faces a lower surface Pb of the substrate P.

In the present embodiment, the gap Ga is formed between an inside surface Uc of the recovery member U and the side surface Pc of the substrate P. Furthermore, a gap Gc is formed between the facing surface Ub and the lower surface Pb of the substrate P. That is, the recovery member U and the substrate P are separated from each other.

In the present embodiment, the upper surface Ua is liquid-repellent with respect to liquid LQ. In the present embodiment, a contact angle of the upper surface Ua with respect to the liquid LQ is greater than a contact angle of the inside surface Uc. Furthermore, the contact angle of the upper surface Ua with respect to the liquid LQ may be smaller than the contact angle of the inside surface Uc, and may be substantially the same as the contact angle of the inside surface Uc.

The recovery member U has a recovery port 88, arranged in such a manner as to face a side surface Pc of the substrate P held by the first holding portion 31. A recovery port 88 can recover fluid (at least one of the gas and the liquid).

The recovery port 88 recovers at least a part of the liquid LQ which flows into a gap Ga between the substrate P and the recovery member U. In the present embodiment, a plurality of recovery ports 88 is arranged at the vicinity of the substrate P.

The recovery member U has a space portion 89. The space portion 89 is formed inside of the recovery member U.

The recovery port 88 is linked to at least a part of the space portion 89. The liquid LQ recovered through the recovery port 88 flows through at least a part of the space portion 89.

In the present embodiment, the recovery member U has a suction port 90 facing the space portion 89. In the present embodiment, the suction port 90 is formed at at least a part of an inside surface of the recovery member U forming the space portion 89. The suction port 90 suctions at least a part of fluid in the space portion 89 in such a manner that the space portion 89 becomes under negative pressure. The suction port 90 can suction any one of the gas and the liquid in the space portion 89, or both of them.

The suction port 90 is connected to a fluid suction apparatus 92 via a channel 91. The fluid suction apparatus 92 can enable the suction port 90 to connect to a vacuum system, and thus can suction any one of the liquid and the gas, or both of them through the suction port 90. The fluid suctioned through the suction port 90 (at least one of the liquid and the gas) is suctioned by the fluid suction apparatus 92 through the channel 91.

At least a part of the liquid LQ which flows into the gap Ga is recovered through the recovery port 88. When recovering the liquid LQ which flows into the gap Ga, a control apparatus 8 enables the suction port 90 to be connected to the vacuum system, by controlling the fluid suction apparatus 92. When the fluid in the space portion 89 is suctioned through the suction port 90, and the space portion 89 becomes under negative pressure, the fluid in the vicinity of the recovery port 88 is recovered through the recovery port 88.

By the suction operation through the suction port 90 being performed, the liquid LQ which flows into between an inside surface Uc of the recovery member U and a side surface Pc of the substrate P is recovered through the recovery port 88. That is, the recovery member U recovers the liquid LQ which flows into between the inside surface Uc and the side surface Pc through the recovery port 88 facing the side surface Pc of the substrate P.

As is described above, even in the present embodiment, the remaining of the liquid LQ can be suppressed by the liquid LQ which flows into the gap Ga being recovered.

Furthermore, as shown in FIG. 11, a temperature adjustment apparatus 93 adjusting the temperature of the recovery member U may be provided. For example, a Peltier element adjusting the temperature of the recovery member U may be arranged in such a manner as to come into contact with the recovery member U.

Sixth Embodiment

Next, a sixth embodiment is described. In the below-written description, the same component as or the equivalent component to the component of the above-described embodiment is given a like reference numeral and therefore its description is brief or omitted.

Figure 12:
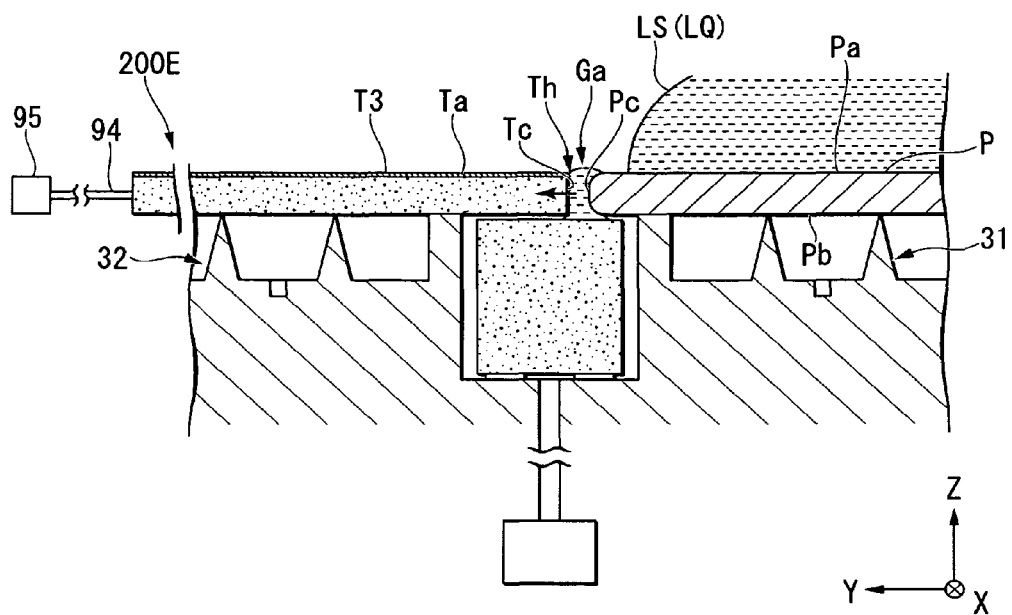
FIG. 12 is a view illustrating a part of a substrate stage relating to a sixth embodiment.

FIG. 12 is a view illustrating one example of a substrate stage 200E relating to the sixth embodiment. In FIG. 12, the substrate stage 200E includes, a first holding portion 31 holding a lower surface Pb of a substrate P in such a manner that the lower surface Pb of the substrate P can be released, and a cover member T3 having an upper surface Ta which defines an opening Th where the substrate P can be arranged and which is arranged at the vicinity of an upper surface Pa of the substrate P in a state in the substrate P is held by the first holding portion 31.

In the present embodiment, a cover member T3 includes a porous member. The cover member T3 has an inside surface Tc which can face a side surface Pc of the substrate P. The cover member T3 can recover at least a part of liquid LQ which flows into a gap Ga through pores in a porous member, arranged at the inside surface Tc, and which the side surface Pc of the substrate P faces.

In the present embodiment, the cover member T3 is connected to a fluid suction apparatus 95 via a channel 94 in between. The fluid suction apparatus 95 can enable the cover member T3 to be connected to a vacuum system. The control apparatus 8 can recover at least a part of the liquid LQ which flows into a gap Ga through a hole in the cover member T3 which the side surface Pc of the substrate P faces by controlling a fluid suction apparatus 95 and enabling the cover member T3 to be connected to the vacuum system.

Seventh Embodiment

Next, a seventh embodiment is described. In the below-written description, the same component as or the equivalent component to the component of the above-described embodiment is given a like reference numeral and therefore its description is brief or omitted.

Figure 13:
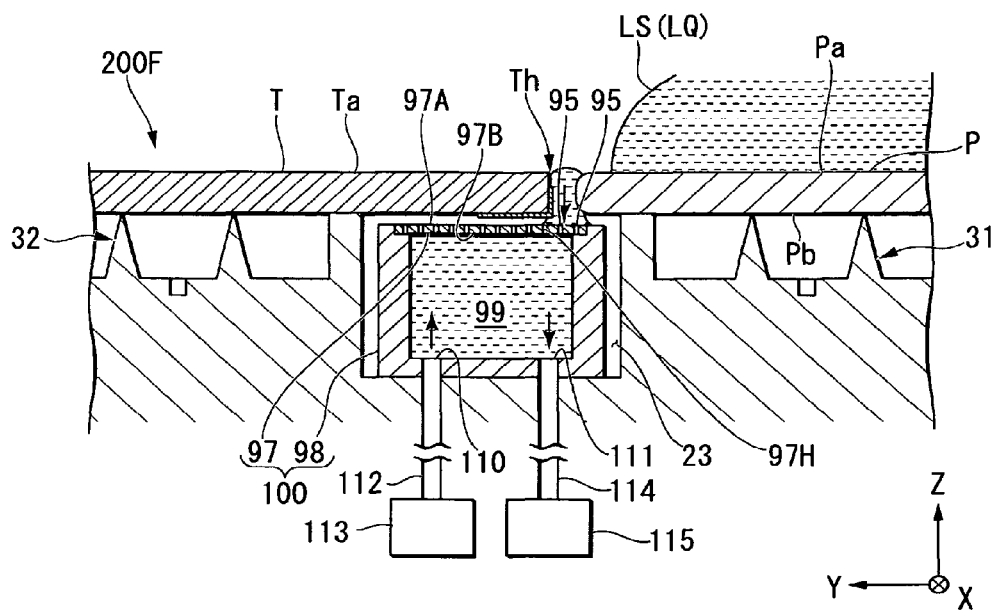
FIG. 13 is a view illustrating one example of a substrate stage relating to a seventh embodiment.

FIG. 13 is a view illustrating one example of a substrate stage 200F relating to the seventh embodiment. In FIG. 13, the substrate stage 200F includes a first holding portion 31 holding a lower surface Pb of a substrate P in such a manner that the lower surface Pb of the substrate P can be released, and a cover member T having an upper surface Ta which defines an opening Th and which is arranged at the vicinity of an upper surface Pa of the substrate P, in a state in which the substrate P is held by the first holding portion 31. Furthermore, a substrate stage 2 has a space portion 23 communicating with a gap Ga between the substrate P and a cover member T.

In the present embodiment, the substrate stage 200F includes a recovery member 100 having a recovery port 95, arranged at the space portion 23, through which at least a part of the liquid LQ which flows into the gap Ga can be recovered.

The recovery member 100 includes a porous member 97 of which at least a part is arranged in such a manner as to face the gap Ga, and a support member 98 supporting a porous member 97 and forming a space 99 between the support member 98 and the porous member 97.

The porous member 97 is in the form of a plate. The porous member 97 has an upper surface 97A of which at least a part faces the gap Ga, a lower surface 97B which faces toward the opposite direction to the upper surface 97A and faces the space 99, and a plurality of holes 97H linking the upper surface 97A and the lower surface 97B together. In the present embodiment, the recovery port 95 includes an upper end of the hole 97H.

Furthermore, the recovery member 100 facing the space 99 has a supply port 110 supplying liquid LQ to the space 99 and a recovery port 111 recovering the liquid LQ in the space 99. The supply port 110 is connected to a liquid supply apparatus 113 via a channel 112 in between. The recovery port 111 is connected to a liquid recovery apparatus 115 with a channel 114 in between.

In the present embodiment, only the liquid LQ is substantially recovered through the recovery port 95, and gas is not recovered.

In the present embodiment, the control apparatus 8 fills the space 99 with the liquid LQ by controlling at least one of a liquid supply apparatus 113 and a liquid recovery apparatus 115, when recovering the liquid LQ which flows into the gap Ga through the recovery port 95. Furthermore, the control apparatus 8 adjusts a difference between a pressure at the side of the upper surface 97A (a pressure in a space 102 in the chamber apparatus 103) and a pressure at the side of the lower surface 97B (a pressure in the space 99), in such a manner that only the liquid LQ is recovered through the recovery port 95 and the gas is not recovered. The control apparatus 8 can control the pressure in the space 102 by controlling the chamber apparatus 103 (an air conditioning system 105). Furthermore, the control apparatus 8 can control the pressure in the space 99 by controlling at least one of the liquid supply apparatus 113 and the liquid recovery apparatus 115. The control apparatus 8 adjusts at least one of the pressure in the space 102 and the pressure in the space 99, in such a manner that only the liquid LQ is recovered through the recovery port 95 and the gas is not recovered. The control apparatus 8 adjusts, for example, the difference between the pressure in the space 102 and the pressure in the space 99, for example, based on, the contact angle of the inside surface of a hole 97H with respect to the liquid LQ, the surface tension of the liquid LQ and the like. For example, the technique of recovering only the liquid through the porous member is disclosed in, for example, the specification of U.S. Pat. No. 7,292,313.

The liquid LQ which flows into the gap Ga is recovered through the porous member 95. At least a part of the liquid LQ which flows into the space 99 through the porous member 95 is recovered by the liquid recovery apparatus 115 through the recovery port 111.

As is described above, even in the present embodiment, the remaining of the liquid LQ can be controlled by recovering the liquid LQ which flows into the gap Ga.

Figure 14:
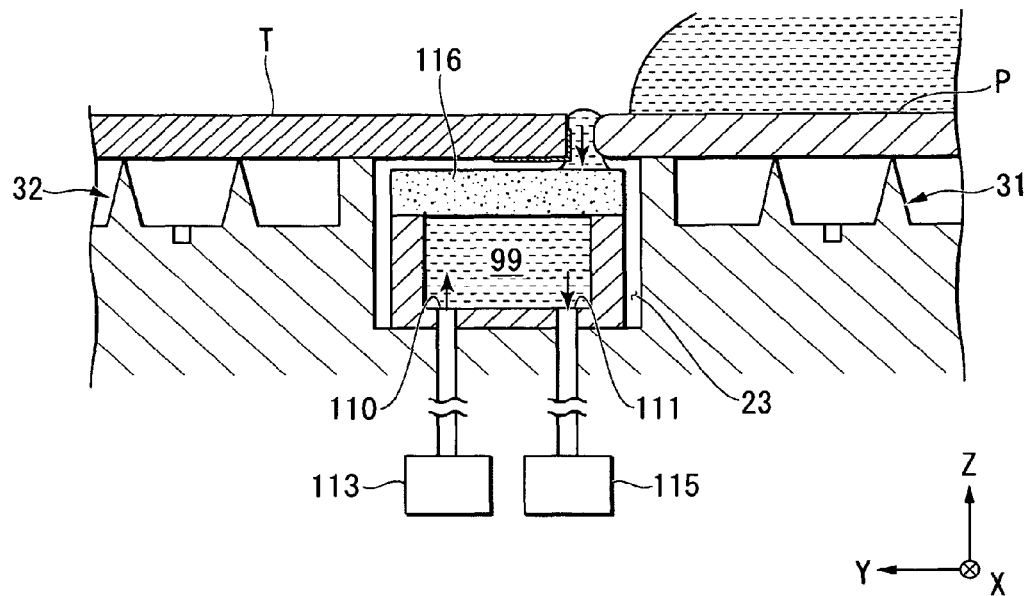
FIG. 14 is a view illustrating one example of the substrate stage relating to the seventh embodiment.

Furthermore, the porous member 97 shown in FIG. 13 is made by forming a plurality of holes 97H in a metal plate. Furthermore, as shown in FIG. 14, the liquid LQ can be recovered through a porous member 116 formed using a sintering method. Even in an example shown in FIG. 14, only the liquid LQ can be recovered through the porous member 116 by adjusting the difference between the pressure in the space 99 and the pressure in the space 102.

Eighth Embodiment

Next, an eighth embodiment is described. In the below-written description, the same component as or the equivalent component to the component of the above-described embodiment is given a like reference numeral and therefore its description is brief or omitted.

Figure 15:
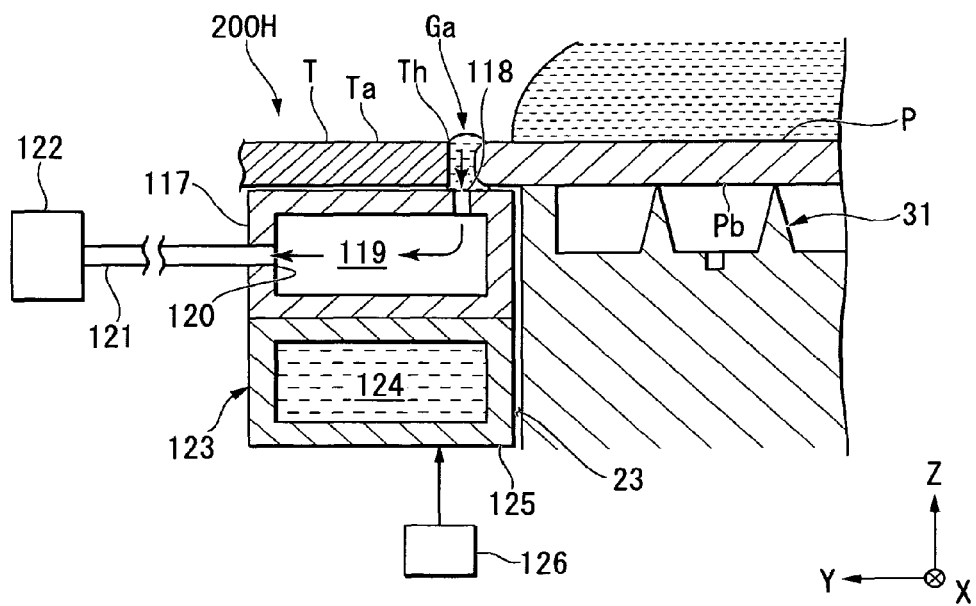
FIG. 15 is a view illustrating a part of a substrate stage relating to an eighth embodiment.

FIG. 15 is a view illustrating one example of a substrate stage 200H relating to the eighth embodiment. In FIG. 15, the substrate stage 200H includes a first holding portion 31 holding a lower surface Pb of a substrate P in such a manner that the lower surface Pb of the substrate P can be released, and a cover member T having an upper surface Ta which defines an opening Th where the substrate P can be arranged, and which is arranged at the vicinity of an upper surface Pa of the substrate P in a state in which the substrate P is held by the first holding portion 31. Furthermore, the substrate stage 200H has a space portion 23 communicating with a gap Ga between the substrate P and the cover member T.

In the present embodiment, the substrate stage 200H includes a recovery member 117 having a recovery port 118, arranged at the space portion 23 through which at least a part of the liquid LQ which flows into gap Ga can be recovered.

The recovery member 117 includes the porous member 118 which at least a part is arranged in such a manner as to face the gap Ga, a space 119, linked to the recovery port 118, and formed at the inside, and a recovery port 120 facing the space 119, through which fluid in the space 119 is recovered. The recovery port 120 is connected to a fluid recovery apparatus 122 via a channel 121.

In the present embodiment, the liquid LQ and the gas are recovered through the recovery port 118. Furthermore, through the recovery port 118, only the liquid LQ can be recovered and only the gas can be recovered.

The control apparatus 8 enables the space 119 to be under negative pressure by controlling a fluid recovery apparatus 122 when the liquid LQ which flows into the gap Ga is recovered through the recovery port 118. As a result, at least a part of the liquid LQ which flows into the gap Ga is recovered through the recovery port 118. At least a part of the liquid LQ which flows into the space 119 through the recovery port 118 is recovered by the fluid recovery apparatus 122 through the recovery port 120. Furthermore, the gas which flows into the space 119 through the recovery port 118 is recovered by the fluid recovery apparatus 122 through the recovery port 120.

In the present embodiment, the substrate stage 200H has a temperature adjustment apparatus 123 adjusting the temperature of the recovery member 117. The temperature adjustment apparatus 123 has a temperature control member 125 having a channel 124 through which a fluid for temperature adjustment flows, and a supply apparatus 126 supplying a temperature-controlled fluid to a channel 124. The temperature control member 125 is arranged in such a manner as to come into contact with the recovery member 117. The supply apparatus 126 supplies the temperature-adjusted liquid to the channel 124. Furthermore, the supply apparatus 126 may supply the temperature-adjusted gas to the channel 124. Furthermore, the fluid in the channel 124 may return back to the supply apparatus 126 and may be recovered by a different apparatus (for example, a recovery apparatus) from the supply apparatus 126.

Furthermore, the temperature adjustment apparatus 123 may include, for example, a Peltier element. For example, the Peltier element may be arranged in such a manner as to come into contact with the recovery member 117.

Ninth Embodiment

Next, a ninth embodiment is described. In the below-written description, the same component as or the equivalent component to the component of the above-described embodiment is given a like reference numeral and therefore its description is brief or omitted.

Figure 16:
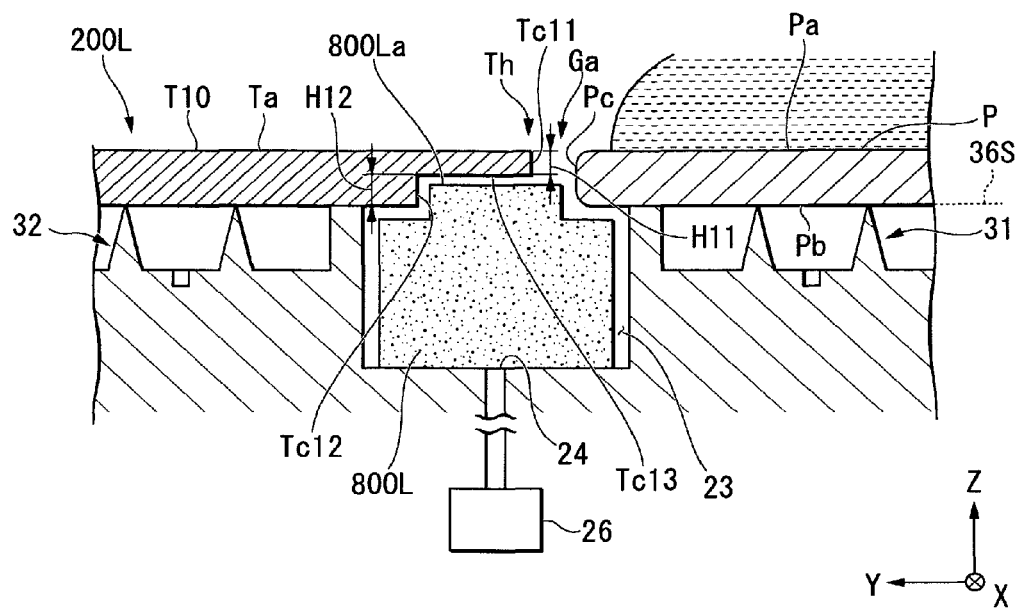
FIG. 16 is a view illustrating a part of a substrate stage relating to a ninth embodiment.

FIG. 16 is a view illustrating one example of a substrate stage 200L relating to the ninth embodiment. In FIG. 16, the substrate stage 200L includes a first holding portion 31 holding a lower surface Pb of a substrate P in such a manner that the lower surface Pb of the substrate P can be released, and a cover member T10 having an upper surface Ta which defines an opening Th where the substrate P can be arranged and which is arranged at the vicinity of an upper surface Pa of the substrate P in a state in which the substrate P is held by the first holding portion 31. Furthermore, the substrate stage 200L has a space portion 23 communicating with a gap Ga between the substrate P and the cover member T10. A porous member 800L is arranged at the space portion 23. At least a part of the porous member 800L is arranged below the gap Ga. At least a part of liquid LQ which flows into the gap Ga is recovered through the porous member 800L.

In the present embodiment, a cover member T10 has a first inside surface Tc11 which a side surface Pc of the substrate P can face, and a second inside surface Tc12, arranged below the first inside surface Tc11, and further separated from the first holding portion 31 than the first inside surface Tc11.

Furthermore, the cover member T10 is linked to the lower end of the first inside surface Tc11, and has a lower surface Tc13 which faces toward the opposite direction to an upper surface Ta. The second inside surface Tc12 is linked to an edge of the lower surface Tc13. The lower surface Tc13 is linked to the upper end of the second inside surface Tc12.

In the present embodiment, the first inside surface Tc11 and the second inside surface Tc12 are substantially in parallel with each other. The first inside surface Tc11 and the second inside surface Tc12 are substantially in parallel with the optical axis (the Z axis) of the last optical element 12. In the present embodiment, an upper surface Ta and the lower surface Tc13 are substantially in parallel with each other.

In the present embodiment, the first inside surface Tc11 and the second inside surface Tc12 are substantially in parallel with a normal line of the upper surface Ta.

In relation to the normal direction (the Z axis direction) of the upper surface Ta, a dimension H11 of the first inside surface Tc11 is smaller than a dimension H12 of the second inside surface Tc12. The dimension H11 includes a distance between the upper surface Ta and the lower surface Tc13.

A part of an upper surface 800La of the porous member 800L faces the lower surface Tc13 via a space.

In the present embodiment, the upper surface 800La is at the upper end of the porous member 800. In the present embodiment, the upper surface 800La is more below than the upper surface Ta of the cover member T10 and is arranged more above than a holding surface 36S of the first holding portion 31. Furthermore, the upper surface 800La is arranged more below than the lower end of the first inside surface Tc11, and is arranged more above than the lower end of the second inside surface Tc12. Furthermore, as shown in FIG. 16, the upper surface 800La is arranged between the substrate P and the cover member T10 in a state in which the substrate P is held by the first holding portion 31. Furthermore, at least a part of an outside side surface of the porous member 800L faces the second inside surface Tc12 via a gap. Furthermore, at least a part of an inside side surface of the porous member 800L faces a side surface Pc of the substrate P. In the present embodiment, the porous member 800L does not face the first inside surface Tc11.

Furthermore, in the present embodiment, at least a part of the porous member 800L may be arranged in such a manner as to face the first inside surface Tc11.

According to the present embodiment, for example, in a case where the substrate stage 200L moves in such a manner that a liquid immersion space LS moves from an upper surface Ta of the cover member T10 to an upper surface Pa of the substrate P, a phenomenon can be prevented that liquid LQ remains behind on the upper surface Ta of the cover member T10 at the vicinity of the gap Ga, or a phenomenon (so-called bridge phenomenon) can be prevented that the liquid LQ stays on the gap Ga.

Figure 17:
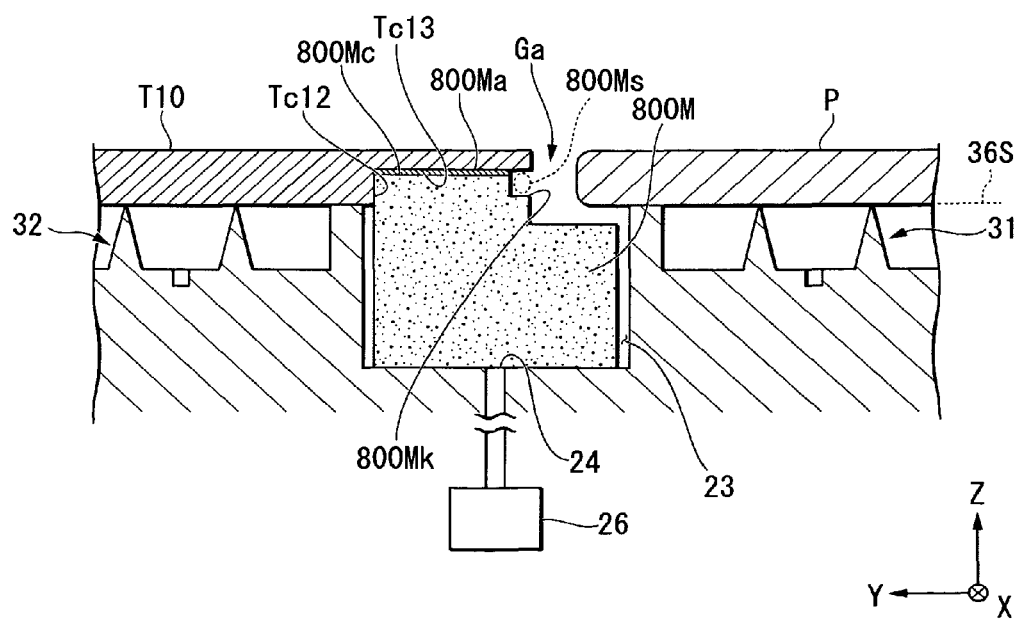
FIG. 17 is a view illustrating a part of the substrate stage relating to the ninth embodiment.

Furthermore, as shown in FIG. 17, a part of an upper surface 800Ma of the porous member 800M may come into contact with a lower surface Tc13. Furthermore, as shown in FIG. 17, the upper surface 800Ma of the porous member 800M and the lower surface Tc13 may be bonded together with an adhesive agent 800Mc. Furthermore, a part of an outside side surface of the porous member 800M may come into contact with the second inside surface Tc12.

Furthermore, as shown in FIG. 17, the porous member 800M may have a corner portion 800Mk. The corner portion 800Mk faces the gap Ga. Furthermore, a part of the lower surface Tc13 may not face the porous member 800M. In other words, the lower surface Tc13 may have a facing area facing the porous member 800M and a non-facing area not facing the porous member 800M. Furthermore, a space 800Ms may be formed between the non-facing area on the lower surface Tc13 and the porous member 800M (the corner portion 800Mk).

Tenth Embodiment

Next, a tenth embodiment is described. In the below-written description, the same component as or the equivalent component to the component of the above-described embodiment is given a like reference numeral and therefore its description is brief or omitted.

Figure 18:
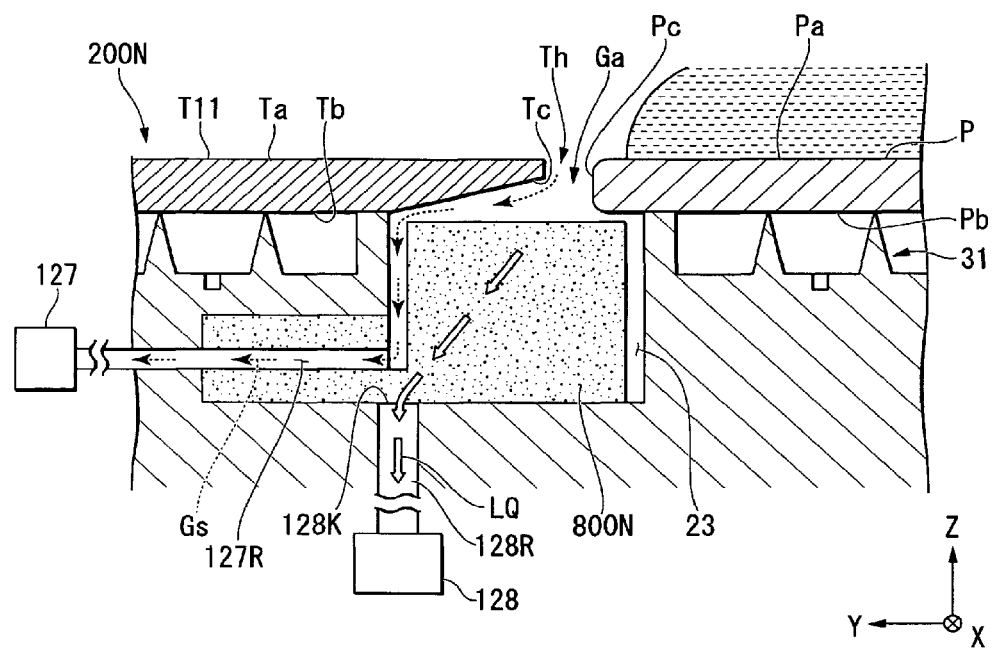
FIG. 18 is a view illustrating a part of a substrate stage relating to a tenth embodiment.

FIG. 18 is a view illustrating one example of a substrate stage 200N relating to the tenth embodiment. In FIG. 18, the substrate stage 200N includes a first holding portion 31 holding a lower surface Pb of a substrate P in such a manner that the lower surface Pb of the substrate P can be released, and a cover member T11 having an upper surface Ta which defines an opening Th where the substrate P can be arranged and which is arranged at the vicinity of an upper surface Pa of the substrate P, in a state in which the substrate P is held by the first holding portion 31. Furthermore, the substrate stage 200N has a space portion 23 communicating with a gap Ga between the substrate P and the cover member T11. A porous member 800N is arranged at the space portion 23. At least a part of liquid LQ which flows into the gap Ga is recovered through the porous member 800N.

As shown in FIG. 18, at least a part of an inside surface Tc of the cover member T11 which the side surface Pc of the substrate P faces is inclined downward in the outside direction with respect to the center of the first holding portion 31.

In the present embodiment, the liquid LQ and the gas Gs staying in the space portion 23 are separately recovered by the porous member 800N. In the present embodiment, a channel 127R through which the gas Gs mainly flows, with flow of the liquid LQ being limited, is formed at the porous member 800N. One end of a channel 127R is connected to a gas space in the space portion 23. The other end of the channel 127R is connected to a fluid suction apparatus 127 including a vacuum system. A dimension (a diameter) of the channel 127R is greater than a dimension of the pore in the porous member 800N.

The porous member 800N is connected to a fluid suction apparatus 128 including the vacuum system via a channel 128R. One end (the upper end) of the channel 128R and a lower surface of the porous member 800N are connected to each other.

The liquid LQ in the space portion 23 flows through an inside channel in a porous member 800R, different from a channel 127R, and is recovered by the fluid suction apparatus 128.

The liquid LQ which flows into the space portion 23 from the gap Ga comes into contact with a surface (an upper surface and others) of the porous member 800N. By operation of the fluid suction apparatus 128, the liquid LQ coming into contact with the surface of the porous member 800N is recovered by the fluid suction apparatus 128 through the porous member 800N.

Furthermore, by operation through the fluid suction apparatus 127, the gas Gs in the space portion 23 is recovered by the fluid suction apparatus 127 through the channel 127R. Furthermore, by operation of the fluid suction apparatus 127, the flowing of the gas Gs from a space (a space at the side of the upper surfaces Pa and Ta) above the gap Ga, toward the space portion 23 is generated. By the flowing of the gas Gs, the liquid LQ can flow into the space portion 23, and thus, for example, a phenomenon (so-called bridge phenomenon) that the liquid LQ stays in the gap Ga can be prevented.

Furthermore, only the gas Gs substantially flows through the channel 127R, and since the liquid LQ does not flow, an occurrence of vaporization heat is suppressed.

Figure 19:
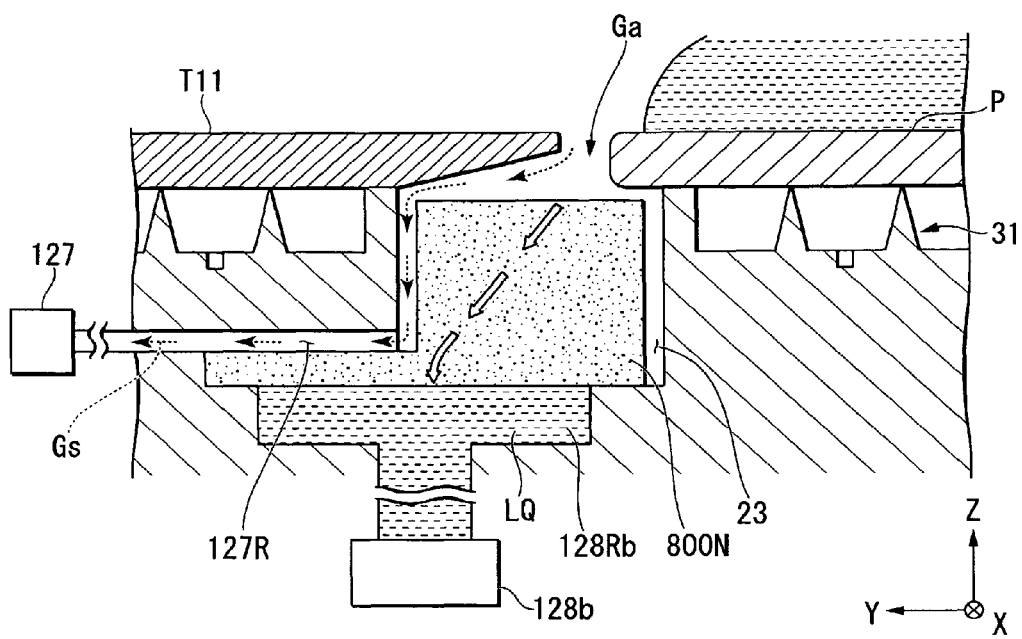
FIG. 19 is a view illustrating a part of the substrate stage relating to the tenth embodiment.

Furthermore, as shown in FIG. 19, a pressure difference may be adjusted between a pressure at the side of a lower surface of the porous member 800N and a pressure at the side of an upper surface, in such a manner that the liquid LQ is suctioned by a fluid suction apparatus 128b through the porous member 800N in a state in which a channel 128Rb connected to a lower surface of the porous member 800N is filled with the liquid LQ. In the present embodiment, the pressure at the side of the lower surface of the porous member 800N can be adjusted by the fluid suction apparatus 128b. The pressure at the side of the upper surface of the porous member 800N can be adjusted by, for example, a chamber apparatus 103 (the air conditioning system 105). Furthermore, for example, one example of the technique of recovering only liquid through the porous member is disclosed in, for example, the specification of U.S. Pat. No. 7,292,313.

Eleventh Embodiment

Next, an eleventh embodiment is described. In the below-written description, the same component as or the equivalent component to the component of the above-described embodiment is given a like reference numeral and therefore its description is brief or omitted.

Figure 20:
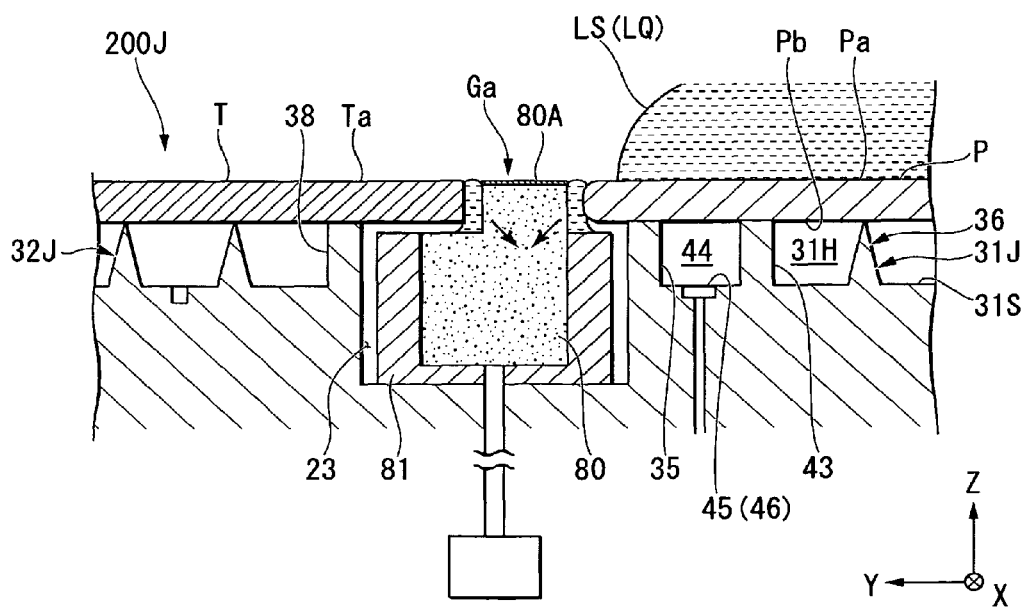
FIG. 20 is a view illustrating a part of a substrate stage relating to an eleventh embodiment.
Figure 21:
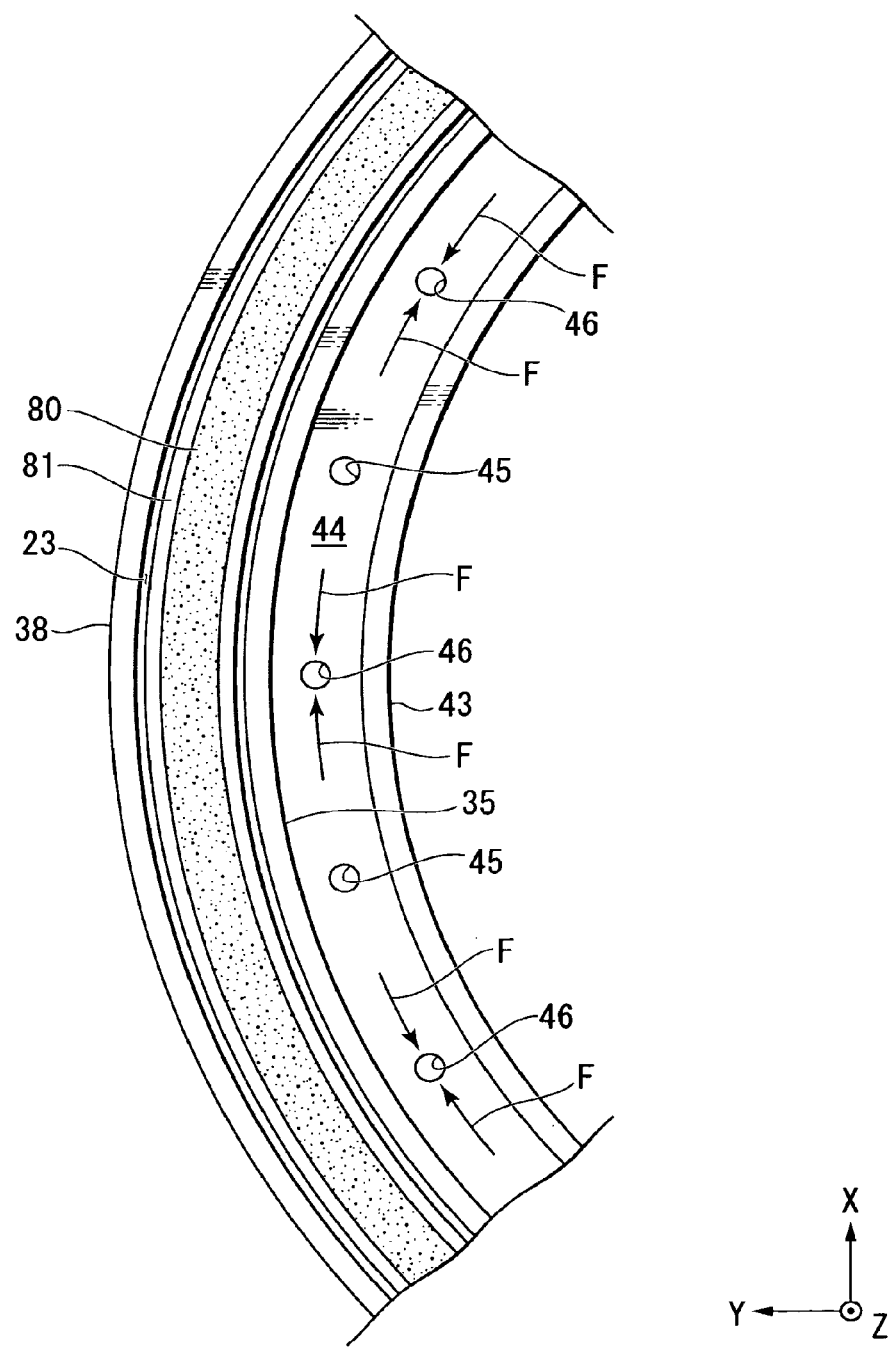
FIG. 21 is a view illustrating a part of the substrate stage relating to the eleventh embodiment.

FIG. 20 is a sectional side view illustrating a part of a substrate stage 200J relating to the present embodiment, and FIG. 21 is a view illustrating a part of the substrate stage 200J when is viewed from above (from the positive Z direction). In FIGS. 20 and 21, the substrate stage 200J has a first holding portion 31J holding the substrate P in such a manner that the substrate P can be released, a second holding portion 32J holding a cover member T in such a manner that the cover member T can be released, and a space portion 23 communicating with a gap Ga between an upper surface Pa of the substrate P and an upper surface Ta of the cover member T. The space portion 23 includes a space in the vicinity of a peripheral wall portion 35. In the present embodiment, the space portion 23 includes a space between a peripheral wall portion 35 and a peripheral wall portion 38.

Furthermore, FIG. 21 illustrates a state in which the substrate P is not on the first holding portion 31J and the cover member T is not on the second holding portion 32J. Furthermore, in an example shown in FIGS. 20 and 21, the substrate stage 200J has a porous member 80 described in the first embodiment, but may have the porous member (the recovery member) described in any one of the second to tenth embodiments.

The first holding portion 31J has a peripheral wall portion 43, arranged inside of the peripheral wall portion 35, which a lower surface Pb of the substrate P can face, and a gas supply port 45 through which gas is supplied to a space portion 44 between the peripheral wall portion 35 and the peripheral wall portion 43. Furthermore, the first holding portion 31J has a discharge port 46 through which fluid in the space portion 44 (any one of the liquid and the gas, or both of them) is discharged.

A support portion 36 of the first holding portion 31J is arranged inside of the peripheral wall portion 43. In the present embodiment, a space 31H is formed between the lower surface Pb of the substrate P, the peripheral wall portion 43 and the support surface 31S, in a state in which the lower surface Pb of the substrate P and the upper surface of the peripheral wall portion 43 face each other.

As shown in FIG. 21, a plurality of gas supply port 45 is arranged along the peripheral wall portion 43 (the peripheral wall portion 35). A plurality of discharge ports 46 are arranged along the peripheral wall portion 43 (the peripheral wall portion 35). In the present embodiment, the discharge ports 46 are arranged at one side and the other side of the gas supply port 45, respectively. In other words, the gas supply port 45 is arranged between two of the discharge ports 46. Furthermore, in the present embodiment, the gas supply ports 45 are arranged at one side and the other side of the discharge port 46, respectively. In other words, the discharge port 46 is arranged between two of the gas supply ports 45. That is, in the present embodiment, a plurality of gas supply ports 45 and a plurality of discharge ports 46 are alternately arranged at the vicinity of the peripheral wall portion 43. Furthermore, the plurality of gas supply ports 45 and the plurality of discharge ports 46 may not be alternately arranged. For example, the discharge port 46 may be arranged at the direction of one side of the gas supply port 45 and the gas supply port 45 may be arranged at the direction of the other side. For example, the gas supply port 45 may be arranged at the direction of one side of the discharge port 46, and the discharge port 46 may be arranged at the direction of the other side.

In the present embodiment, the gas supply port 45 is connected to a gas supply apparatus via a channel. The gas supply apparatus includes, for example, a pump which can send the gas, a temperature adjustment apparatus which can adjust the temperature of the gas which is supplied, and a filter apparatus which can remove particles from the gas which is supplied.

In the present embodiment, the discharge port 46 is connected to a fluid suction apparatus via the channel. The fluid suction apparatus includes, for example, the pump which can suction fluid (any one of the gas and the liquid, or both of them), and a gas liquid separation apparatus which can separate the gas and the liquid which are suctioned.

The gas supply apparatus connected to the gas supply port 45, and the fluid suction apparatus connected to the discharge port 46 are controlled by a control apparatus 8. The control apparatus 8 can control an operation of supplying the gas through the gas supply port 45 and an operation of discharging the gas through the discharge port 46 (the suction operation). By the gas being supplied through the gas supply port 45 and the fluid being discharged (suctioned) through the discharge port 46, a gas current F is generated in the space portion 44, as shown in FIG. 21. For example, in a space portion 44, the gas flows through the gas supply port 45 toward the discharge port 46.

As shown in FIG. 20, the gap Ga is formed between the substrate P held by the first holding portion 31J and the cover member T held by second holding portion 32. There is a likelihood that the liquid LQ (for example, the liquid LQ in liquid immersion space LS) staying in a space which at least one of an upper surface Pa of the substrate P and an upper surface Ta of the cover member T faces flows into a space portion 23 though the gap Ga.

Furthermore, for example, there is a likelihood that the liquid LQ flows into the space portion 44. For example, there is a likelihood that the liquid LQ in the space portion 23 flows through a space between a lower surface Pb of the substrate P and an upper surface of the peripheral wall portion 35 into the space portion 44. In the present embodiment, the liquid LQ in the space portion 44 can be suctioned through the discharge port 46. A control apparatus 8 can remove the liquid LQ from the space portion 44 by performing the suction operation through the discharge port 46. As a result, the flowing of the liquid LQ into a space 31H is suppressed.

Twelfth Embodiment

Next, a twelfth embodiment is described. In the below-written description, the same component as or the equivalent component to the component of the above-described embodiment is given a like reference numeral and therefore its description is brief or omitted.

Figure 22:
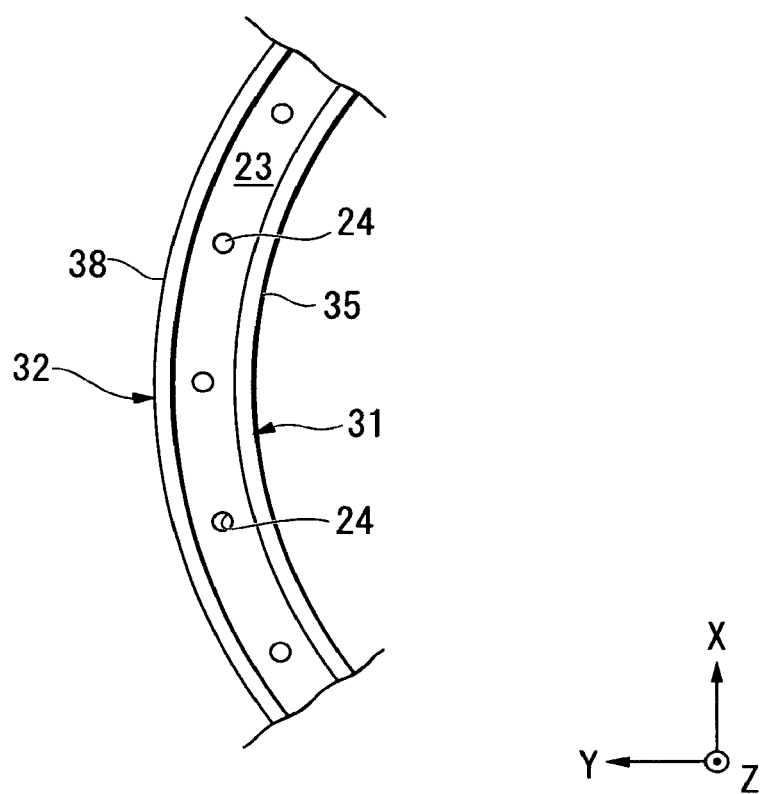
FIG. 22 is a view illustrating a part of a substrate stage relating to a twelfth embodiment.

FIG. 22 is a view illustrating a part of a substrate stage 200K relating to the twelfth embodiment. FIG. 22 is a view illustrating a peripheral wall portion 35 and a peripheral wall portion 38 of the substrate stage 200K, when is viewed from above. For example, the substrate stage 200K is the same as the substrate stage 2 described in the first embodiment, except that the porous member 80 is omitted from the substrate stage 200K.

As shown in FIG. 22, a suction port 24 is arranged between a peripheral wall portion 35 of a first holding portion 31 and a peripheral wall portion 38 of a second holding portion 32. A plurality of suction ports 24 are arranged at the vicinity of the first holding portion 31. Each of the suction ports 24 can recover at least a part of the liquid LQ which flows into a gap Ga between the substrate P and the cover member T. In an example shown in FIG. 22, the porous member is not being arranged at a space portion 23.

The substrate P and the cover member T move in the XY plane with respect to a last optical element 12, in a state in which a liquid immersion space LS for the liquid LQ is formed at the side of an emitting surface 13 of a last optical element 12. For example, as in the above-described embodiments, in exposing the substrate P, the substrate P and the cover member T move in the XY plane with respect to a last optical element 12 and a liquid immersion member 7, in a state in which the liquid immersion space LS of the liquid LQ is formed between the last optical element 12 and the liquid immersion member 7, and at least one of the substrate P and the cover member T.

In the present embodiment, recovery of the liquid LQ through some of the suction ports 24 among a plurality of the suction ports 24 is performed, based on any of, or both of, a position of the gap Ga with respect to the liquid immersion space LS and a movement condition of the gap Ga with respect to the liquid immersion space LS.

Figure 23:
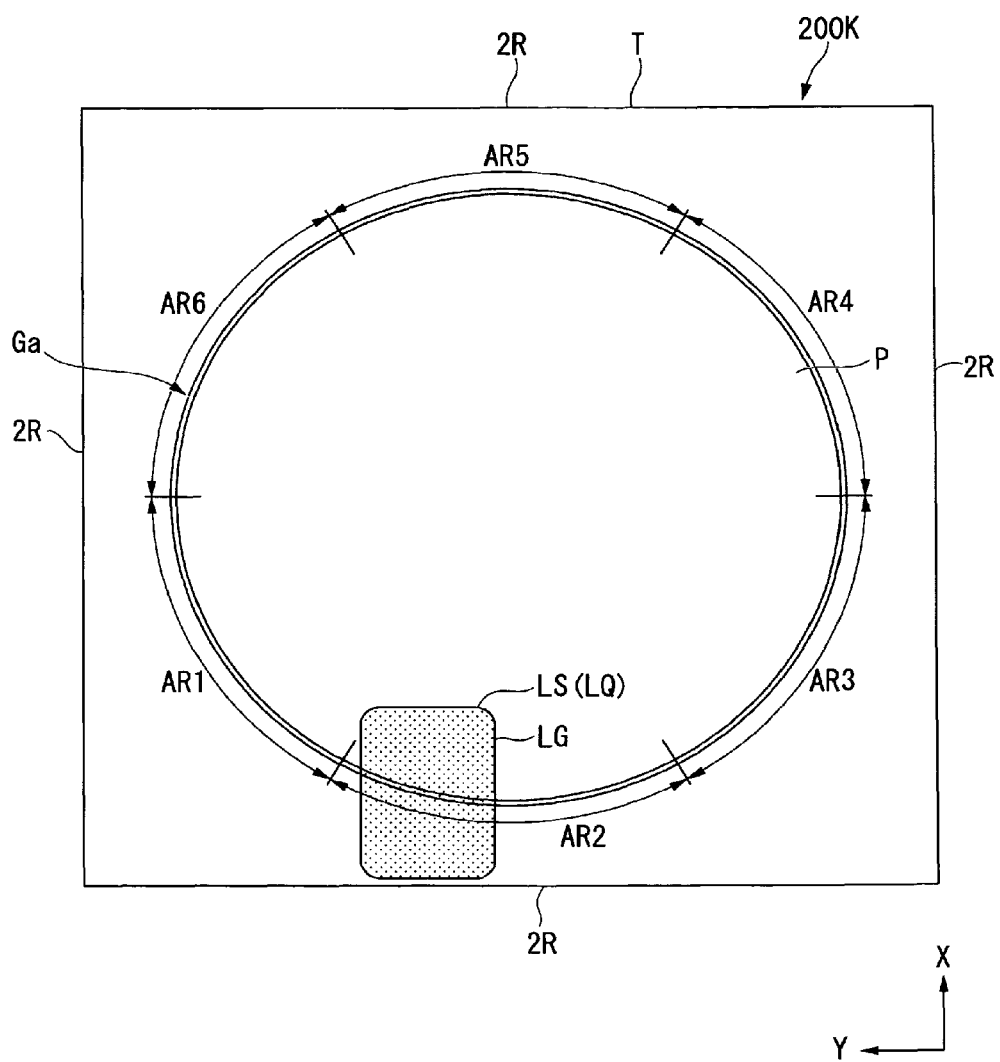
FIG. 23 is a view illustrating a part of the substrate stage relating to the twelfth embodiment.

FIG. 23 is a schematic diagram to describe one example of operation through an exposure apparatus EX relating to the present embodiment. The control apparatus 8, for example, controls the suction operation of the plurality of suction ports 24, based on a position relation between the gap Ga formed at the vicinity of the substrate P and the liquid immersion space LS.

In the present embodiment, the gap Ga at the vicinity of the substrate P, is divided into, for example, first to sixth parts AR1 to AR6. A control apparatus 8 performs the suction operation of the suction port 24, which is arranged at a position to suction the liquid LQ which flows into the second part AR2 among the plurality of suction ports 24 arranged at the vicinity of the first holding portion 31, for example, when the liquid immersion space LS is over the second part AR2, in the gap Ga. In the present embodiment, the suction operation through the suction port 24 arranged directly under the second part AR2 is performed. On the one hand, the control apparatus 8 does not perform the suction operation through the suction port 24 which is arranged at the position to recover the liquid LQ which flows into the first, third, fourth, fifth, and sixth parts AR1, AR3, AR4, AR5, and AR6 among the plurality of suction ports 24 arranged at the vicinity of the first holding portion 31, when the liquid immersion space LS is over the second part AR2. For example, the suction operation of the suction port 24 which is arranged directly under the first, third, fourth, fifth, and sixth parts AR1, AR3, AR4, AR5, and AR6, is stopped when the liquid immersion space LS is over the second part AR2.

Furthermore, the control apparatus 8 performs the suction operation of the suction port 24, which is arranged at the position to recover the liquid LQ which flows into the fourth part AR4 among the plurality of suction ports 24 arranged at the vicinity of the first holding portion 31, for example, when the liquid immersion space LS is over the fourth part AR4, in the gap Ga. On the one hand, the control apparatus 8 does not perform (stops) the suction operation of the suction port 24, which is arranged at a position to recover the liquid LQ which flows into the first, second, third, fifth, and sixth parts AR1, AR2, AR3, AR5, and AR6 among the plurality of suction ports 24 arranged at the vicinity of the first holding portion 31, when the liquid immersion space LS is over the fourth part AR4, in the gap Ga.

The control apparatus 8 can obtain position relations between the liquid immersion space LS and the first to sixth parts AR1 to AR6 in the XY plane, based on, for example, the measurement result obtained by an interferometer system 11.

In the present embodiment, a position of a substrate stage 200K is measured by the interferometer system 11. The interferometer system 11 obtains the position of the substrate stage 200K, by irradiating detection light to a measurement mirror 2R for an interferometer which is included in the substrate stage 200K. The position relationship is known between the measurement mirror 2R which is included in the substrate stage 200K, and the gap Ga (the first to sixth parts AR1 to AR6). Accordingly, the control apparatus 8 can obtain the position of the gap Ga (the first to sixth parts AR1 to AR6) on the coordinate system of the interferometer system 11, based on the measurement result obtained by the interferometer system 11.

Furthermore, in the present embodiment, a position of an interface LG of the liquid LQ in the liquid immersion space LS is known. Furthermore, the position is also known in which the interface LG is located when an object moves in a state in which the liquid immersion space LS is formed between a last optical element 12 and a liquid immersion member 7, and the object such as the substrate stage 200K. For example, the position of the interface LG is determined, based on liquid immersion conditions including an amount of liquid supplied per unit time through a supply port 15 of the liquid immersion member 7 and an amount of liquid recovered per unit time through a recovery port 16.

Furthermore, the position of the interface LG is determined, based on the movement condition (a movement speed, acceleration, a movement distance in relation to a certain direction, a movement trail and the like) of the object in a state in which the liquid immersion space LS is formed.

For example, the position of the interface LG determined based on at least one of the liquid immersion condition and the movement condition can be obtained from a preliminary experiment or a simulation. In the present embodiment, the control apparatus 8 includes a storage apparatus 8R, and information related to the position of the interface LG determined based on at least one of the liquid immersion condition and the movement condition is stored in the storage apparatus 8R.

Accordingly, the control apparatus 8 can obtain the position relationship between the gap Ga (the first to sixth parts AR1 to AR6) and the liquid immersion space LS (the interface LG) in the coordinate system of the interferometer system 11, based on the measurement result obtained by the interferometer system 11 and the stored information in the storage apparatus 8R.

In the present embodiment, the control apparatus 8 performs the suction operation through some of the suction port 24 among a plurality of suction ports 24, based on the position relationship between the gap Ga (the first to sixth parts AR1 to AR6) and the interface LG. For example, the control apparatus 8 starts the suction operation through the suction port 24 (for example, the suction port 24 directly under the first part AR1) corresponding to the first part AR1 on which the suction operation is stopped, immediately before the liquid immersion space LS is arranged over first part AR1.

As a result, at least a part of the liquid LQ which flows into the first part AR1 can be suctioned through the suction port 24 corresponding to the first part AR1, for example, when the liquid immersion space LS is arranged over the first part AR1. Furthermore, the control apparatus 8 may stop the suction operation through the suction port 24 corresponding to the first part AR1 on which the suction operation was performed, immediately after the liquid immersion space LS passes over the first part AR1. Furthermore, the control apparatus 8 can perform the same control as well, even when the liquid immersion space LS passes over each of the second to sixth parts AR2 and AR6.

Figure 24:
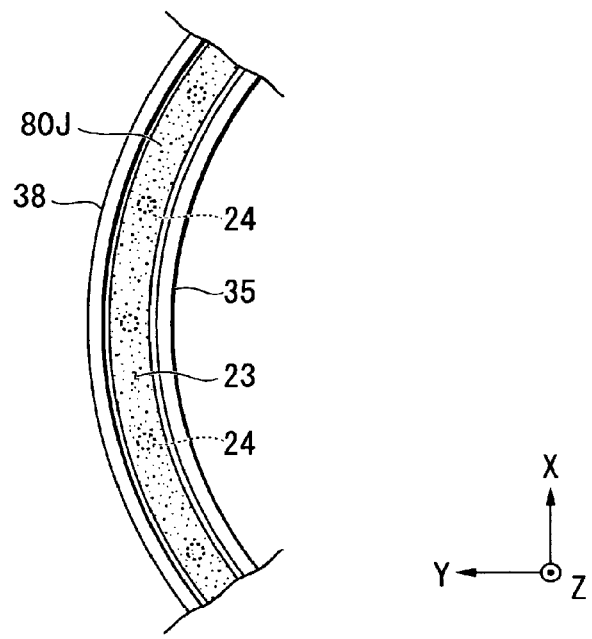
FIG. 24 is a view illustrating a part of the substrate stage relating to the twelfth embodiment.

Furthermore, in the present embodiment, for example, as shown in FIG. 24, a porous member 80J can be arranged at the space portion 23. As described referring to FIG. 22, the plurality of suction ports 24 are arranged below the porous member 80J. By the suction operation through some of the suction ports 24 among the plurality of suction ports 24 being performed, the operation of recovering the liquid through some of the porous members 80J which are arranged above of the suction port 24 on which the suction operation is performed, among the porous members 80J. Even in an example shown in FIG. 24, the control apparatus 8 can perform the operation of recovering the liquid LS through some of the porous members 80J, based on any of, or both of, a position of the gap Ga with respect to the liquid immersion space LS and a movement condition of the gap Ga with respect to the liquid immersion space LS.

Furthermore, as described referring to FIGS. 4, 8, 11, 12, 20 and other figures, a plurality of recovery ports which are arranged in such a manner as to face the side surface Pc of the substrate P may be arranged at the vicinity of the substrate P, and the liquid LQ may be recovered through some of the recovery ports among a plurality of recovery ports, based on any of, or both of, a position of the gap Ga with respect to the liquid immersion space LS and a movement condition of the gap Ga with respect to the liquid immersion space LS.

Furthermore, in the present embodiment, the recovery of the liquid LQ through some of the recovery ports 24 among a plurality of recovery ports 24 is performed, based on any of, or both of, a position of the gap Ga with respect to the liquid immersion space LS and a movement condition of the gap Ga with respect to the liquid immersion space LS. In the present embodiment, the liquid LQ may be recovered through some of recovery ports 24 among a plurality of recovery ports 24, for example, based on any of, or both of, a position of the gap Ga with respect to the last optical element 12 and a movement condition of the gap Ga with respect to the liquid immersion space LS. Furthermore, the liquid LQ may be recovered through some of recovery ports 24 among a plurality of recovery ports 24, for example, based on any of, or both of, a position of the gap Ga with respect to the liquid immersion member 7 and a movement condition of the gap Ga with respect to the liquid immersion member 7.

That is, in the present embodiment, the position of the gap Ga with respect to the last optical element 12 may be considered as the position of the gap Ga with respect to the liquid immersion space LS, and the position of the gap Ga with respect to the liquid immersion member 7 may be considered as the position of the gap Ga with respect to the liquid immersion space LS. Furthermore, the movement condition of the gap Ga with respect to the last optical element 12 may be considered as the movement condition of the gap Ga with respect to the liquid immersion space LS, and the movement condition of the gap Ga with respect to the liquid immersion member 7 may also be considered as the movement condition of the gap Ga with respect to the liquid immersion space LS.

Thirteenth Embodiment

Next, a thirteenth embodiment is described. In the below-written description, the same component as or the equivalent component to the component of the above-described embodiment is given a like reference numeral and therefore its description is brief or omitted.

Figure 25:
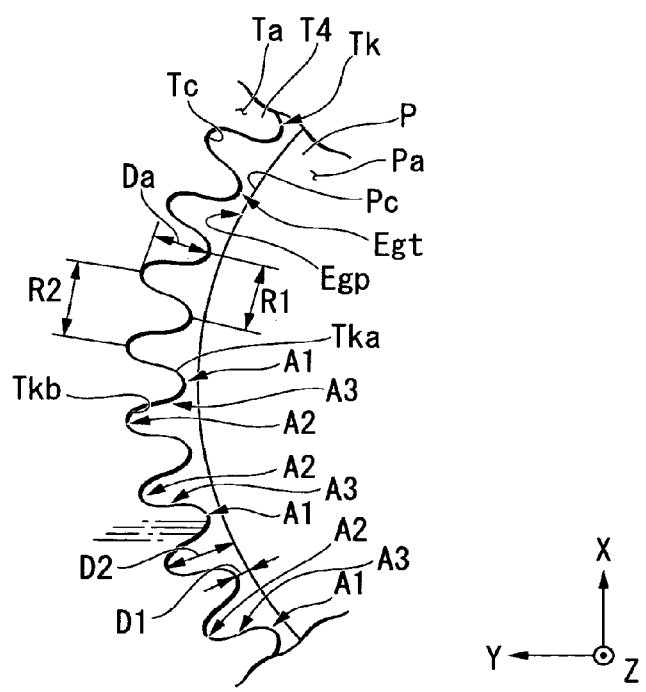
FIG. 25 is a view illustrating a part of a substrate stage relating to a thirteenth embodiment.

FIG. 25 is a schematic diagram illustrating one example of an opening Tk of a cover member T4, arranged at the vicinity of a substrate P. The substrate P can be arranged at the opening Tk in the cover member T4. The opening Tk in the cover member T4 includes a first area A1, positioned at a first distance D1 from the center of a first holding portion 31, which a side surface Pc of a substrate P held by the first holding portion 31 can face, and a second area A2 arranged adjacent to the first area A1, and positioned at a second distance D2 longer than the first distance D1, from the center of a first holding portion 31.

In the present embodiment, the second area A2 is arranged adjacent to the first area A1 in relation to the circumferential direction of the first holding portion 31. In other words, the first area A1 and the second area A2 are adjacent to each other in the plane (in the XY plane) which is vertical to the optical axis (the Z axis) of the terminal optical device 12.

In the present embodiment, the circumferential direction of the first holding portion 31 includes the circumferential direction of a peripheral wall portion 35. Furthermore, in the present embodiment, the circumferential direction of the peripheral wall portion 35 includes the circumferential direction of a peripheral wall portion 38. In the present embodiment, the peripheral wall portion 35 is substantially in the form of a circle (a circular loop) in the XY plane. The peripheral wall portion 38 is also substantially in the form of a circle (a circular loop) in the XY plane. In the present embodiment, the center of the peripheral wall portion 35 and the center of the peripheral wall portion 38 substantially agree with each other. In other words, the peripheral wall portion 35 and the peripheral wall portion 38 are arranged in such a manner as to be concentric.

Furthermore, in the present embodiment, an outward appearance (a form of an edge portion Egp of the substrate P) of the substrate P is substantially in the form of a circle. In the XY plane, the center of the first holding portion 31 (the center of the peripheral wall portion 35) and the center of the substrate P held by the first holding portion 31 substantially agree with each other. In the present embodiment, the circumferential direction of the first holding portion 31 includes a direction along the edge portion Egp of the substrate P held by the first holding portion 31. Furthermore, the center of the first holding portion 31 and the center of the substrate P held by the first holding portion 31 may not agree with each other.

An edge portion (an inside edge portion) Egt of the cover member T4 is arranged at the vicinity of the edge portion Egp of the substrate P held by the first holding portion 31. Furthermore, an upper surface Ta of the cover member T4 is arranged at the vicinity of an upper surface of the substrate P held by the first holding portion 31. The opening Tk in the cover member T4 is defined with the edge portion Egt of the cover member T4. Furthermore, the edge portion Egt defines at least a part of an edge (an inner edge) of an upper surface Ta of the cover member T4.

The edge portion Egt of the cover member T4 is arranged at the vicinity of the first holding portion 31. Between the edge portion Egp of the substrate P and the edge portion Egt of the cover member T4, a gap is formed along the circumferential direction of the first holding portion 31. The edge portion Egp the substrate P and the edge portion Egt of the cover member T4 faces each other with the gap in between.

The edge portion Egt of the cover member T4 extends in the circumferential direction of the first holding portion 31, in such a manner that the edge portion Egp of the substrate P held by the first holding portion 31 runs along.

Furthermore, the opening Tk includes a third area A3 linking a first area A1 and a second area A2 together.

In the present embodiment, the first to third areas A1 to A3 include at least a part of a corner portion formed with an upper surface Ta and an inside surface Tc of the cover member T4. Furthermore, the first to third areas A1 to A3 may include at least a part of the upper surface Ta of the cover member T4 and may include at least a part of the inside surface Tc.

The first area A1 and the second area A2 are alternately arranged at relation to the circumferential direction of the first holding portion 31. That is, the opening Tk has a plurality of protruding portions Tka protruding with respect to the center of the first holding portion 31, and a plurality of recessed portions Tkb being recessed with respect to the center of the first holding portion 31. The plurality of protruding portions Tka and the plurality of recessed portions Tkb are alternately arranged at relation to the circumferential direction of the first holding portion 31. In the present embodiment, the first area A1 is a curved surface (a curved line) in the XY plane. The second area A2 is a curved surface (a curved line) in the XY plane.

That is, in the present embodiment, the edge portion Egt of the cover member T4 includes a plurality of protruding portions Tka formed along the circumferential direction of the first holding portion 31. The protruding portion Tka includes the first area A1. The recessed portion Tkb includes the second area A2. The plurality of the protruding portions Tka includes a first protruding portion Tka and a second protruding portion Tka, which are adjacent to each other in the circumferential direction of the first holding portion 31. In the present embodiment, an upper surface Ta of the cover member T4 includes an upper surface of the protruding portion Tka.

Furthermore, in the present embodiment, a distance Da between the first area A1 and the second area A2 in relation to a radial direction with respect to the center of the first holding portion 31 is substantially the same as a distance R1 of the adjacent first area A1 in relation to the circumferential direction of the first holding portion 31. Furthermore, the distance Da is substantially the same as a distance R2 of the adjacent second area A2 in relation to the circumferential direction of the first holding portion 31. Furthermore, the distance Da may be longer than the distance R1. Furthermore, the distance Da may be longer than the distance R2.

Furthermore, in the present embodiment, the plurality of protruding portions Tka is arranged at regular intervals along the circumferential direction of the first holding portion 31. The distance R1 in relation to the circumferential direction of the first holding portion 31 between the adjacent first protruding portion Tka in the circumferential direction of the first holding portion 31 and the second protruding portion Tka is substantially the same as the distance R1 in relation to the circumferential direction of the first holding portion 31 between the second protruding portion Tka and a third protruding portion Tka.

In the present embodiment, for example, when a substrate stage 2 moves in such a manner that a liquid immersion space LS moves from an upper surface Ta of the cover member T4 to an upper surface Pa of the substrate P, the remaining of the liquid LQ of the liquid immersion space LS on, for example, the substrate P is suppressed.

Figure 26:
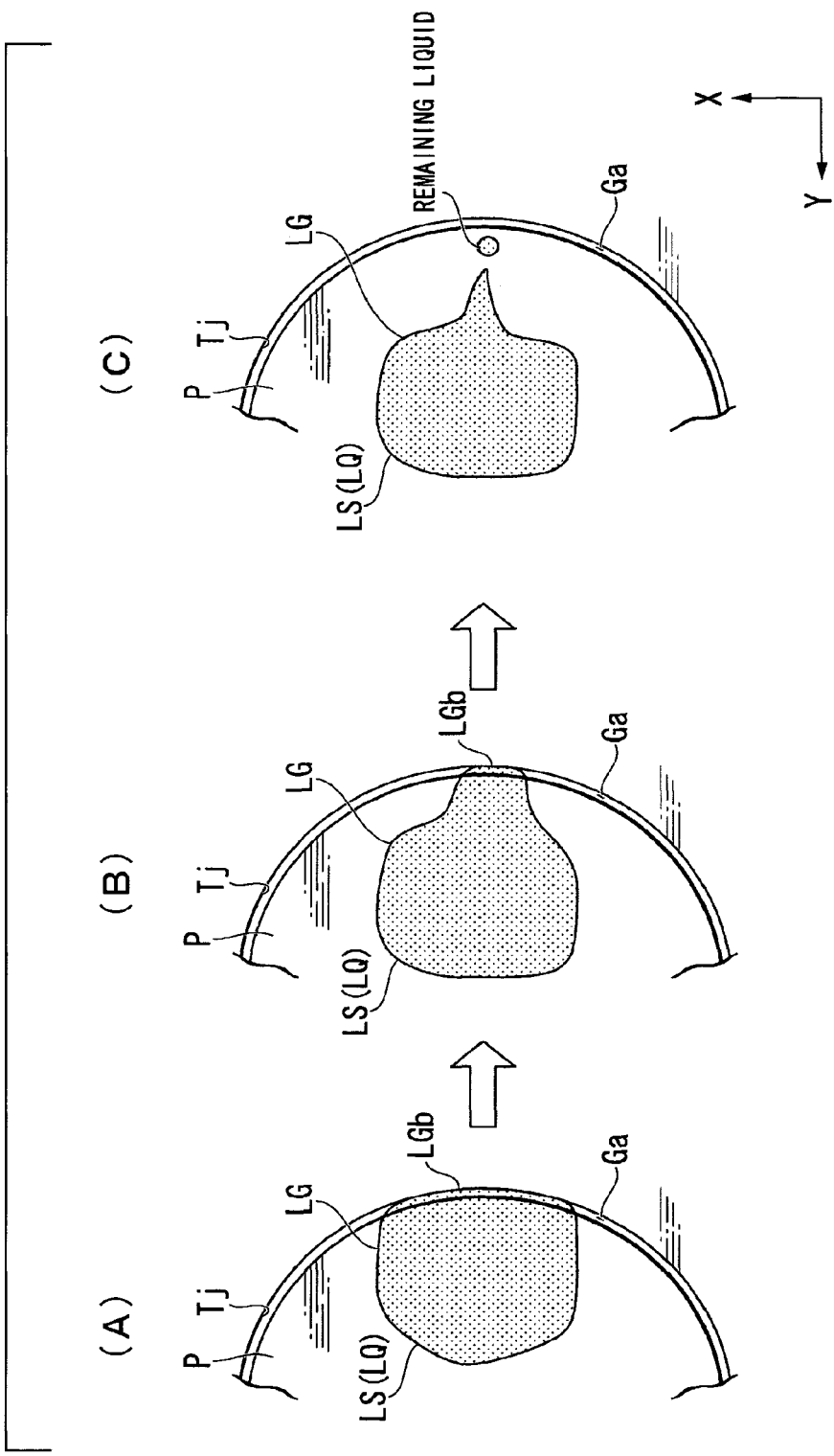
FIG. 26 is a view relating to a comparative example.

FIG. 26 is a schematic diagram illustrating a comparative example. In FIG. 26, an opening of a cover member Tj is in the form running along the outward appearance of the substrate P. For example, the liquid immersion space LS changes from in a state shown in FIG. 26(A) through a state shown in FIG. 26(B) to in a state shown in FIG. 26(C), in a case where a substrate stage 2 moves in the negative Y direction, in such a manner that the liquid immersion space LS moves from on the cover member Tj to on the substrate P. FIG. 26(A) illustrates the state which appears immediately before the liquid immersion space LS finishes moving from on the cover member Tj to on the substrate P by the substrate stage 2 moving in the negative Y direction. FIG. 26(B) illustrates the state which appears when the substrate stage 2 moves further in the negative Y direction from in the state shown in FIG. 26(A). FIG. 26(C) illustrates the state which appears when the substrate stage 2 moves further in the negative Y direction from in the state shown in FIG. 22(B).

As shown in FIG. 26(C), there is a likelihood that a part of the liquid LQ of the liquid immersion space LS breaks into smaller droplets and the droplets remain behind on the substrate P by the movement of the liquid immersion space LS from the cover member Tj to the substrate P.

The inventor obtained knowledge of the fact that one cause of the remaining of the liquid LQ on the substrate P lies in the form of the cover member arranged at the vicinity of the substrate P. For example, the liquid LQ of the liquid immersion space LS flows along the form of the cover member (the form of the gap Ga) when the liquid immersion space LS moves from the cover member to the substrate P in such a manner as to pass over the gap Ga. The inventor obtained knowledge of the fact that the liquid LQ can be enabled to flow in such a manner that the liquid LQ does not remain behind on the substrate P, by the form of cover member being adjusted. That is, the inventor obtained knowledge of the fact that, by devising the form of an edge inside of the cover member forming the substrate P and the gap Ga, the liquid LQ becomes easy to separate from the cover member when the liquid immersion space LS moves from the cover member to the substrate P, and thus the remaining of the liquid LQ on the substrate P can be suppressed.

In the below-written description, an interface LGb at the side in the first direction (for example, in the negative Y direction) with respect to the optical axis of the last optical element 12, among the interfaces LG of the liquid LQ of the liquid immersion space LS, is properly referred to a rear interface LGb, in a case where the substrate stage 2 moves in the first direction (for example, in the negative Y direction) in the XY plane.

For example, by a drastic change in a geometric form of an object with which the liquid LQ comes into contact, the form of the rear interface LGb changes and the liquid LQ shows the behavior such that the liquid LQ is caught by the object. As a result, there is a likelihood that the phenomenon in which the liquid LQ remains on the object occurs. In an example shown in FIG. 26, the liquid immersion space LS moves in order corresponding to the cover member Tj, the gap Ga, and the substrate P and drastically changes in the geometric form, at the cover member Tj and the substrate P, because of the existence of the gap Ga. By the drastic change in the geometric form, there is a likelihood that the liquid LQ of the liquid immersion space LS flows in such a manner that at least a part of the liquid LQ remains behind on the substrate P.

Figure 27:
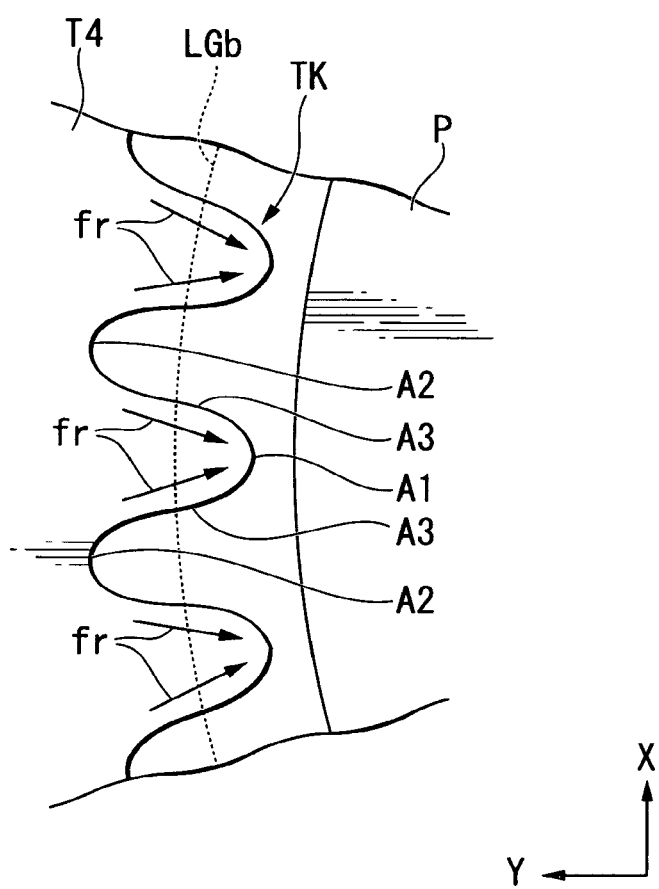
FIG. 27 is a view illustrating a part of the substrate stage relating to the thirteenth embodiment.

FIG. 27 is a view schematically illustrating the flowing of the liquid LQ in the vicinity of rear interface LGb relating to the present embodiment.

For example, there is a likelihood that at least a part of the liquid LQ of the liquid immersion space LS flows in the direction as indicated by an arrow fr in FIG. 27, in the vicinity of the rear interface LGb, in a case where the substrate stage 2 moves in the positive Y direction in such a manner that the liquid immersion space LS moves from the cover member T4 to the substrate P. That is, at least a part of the liquid LQ of the liquid immersion space LS flows from a second area (a recessed portion) A2 toward a first area (a protruding portion) A1, in such a manner as to be along with the third area A3.

In the present embodiment, the direction along with a third area A3 substantially agrees with a relative movement direction (here, the Y axis direction) of the liquid immersion space LS and the substrate stage 2. That is, the relative movement direction (the Y axis direction) of the liquid immersion space LS and the substrate stage 2 and the direction of the liquid LQ flowing in the vicinity of the rear interface LGb substantially agrees with each other, when the liquid immersion space LS moves from the cover member T4 to the substrate P. Therefore, according to the present embodiment, there is a high likelihood that the liquid LQ in the vicinity of the rear interface LGb flows toward the first area A1 (the protruding portion Tka), and the liquid LQ of the liquid immersion space LS does not come into contact with the second area A2 and the third area A3 on the cover member T4 immediately before the liquid LQ of the liquid immersion space LS are separated from the cover member T4, in such a manner that the liquid LQ does not remain behind on the substrate P. That is, an effect is expected which reduces a contact area of the cover member T4 and the liquid LQ of the liquid immersion space LS, by a fine form formed at the cover member T4 when the rear interface LGb moves from the cover member T4 to on the substrate P. As a result, the rear interface LGb can be smoothly separated from the cover member and the remaining of the liquid LQ on the upper surface of the substrate P can be suppressed.

As is described above, according to the present embodiment, for example, in a case where the substrate stage 2 moves in such a manner that the liquid immersion space LS moves from the cover member T4 to the substrate P, the remaining of the liquid LQ on the substrate P can be suppressed. Therefore, an occurrence of an exposure defect and an occurrence of a defective device can be suppressed.

Figure 28:
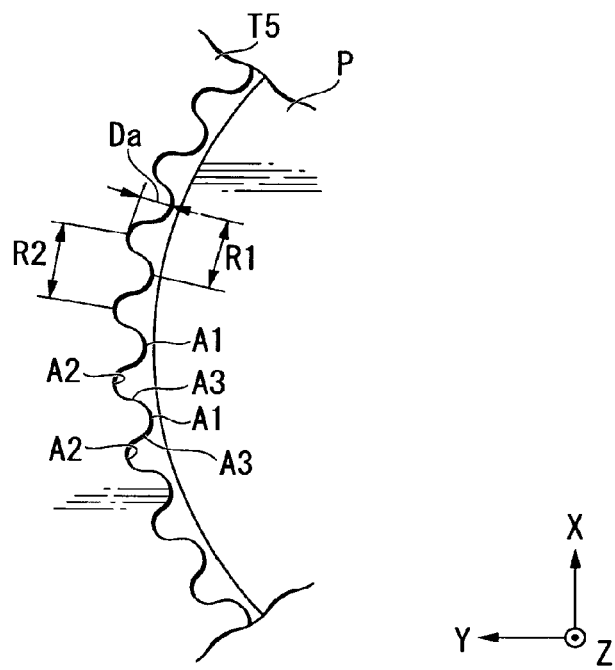
FIG. 28 is a view illustrating a part of the substrate stage relating to the thirteenth embodiment.

Furthermore, in the present embodiment, for example, as a cover member T5 shown in FIG. 28, the distance Da between the first area A1 (the protruding portion) and the second area A2 (the recessed portion) in relation to the radial direction with respect to the center of the first holding portion 31 may be shorter than the distance R1 of the adjacent first area A1 in relation to the circumferential direction of the first holding portion 31 and may be shorter than the distance R2 of the adjacent second area A2.

Figure 29:
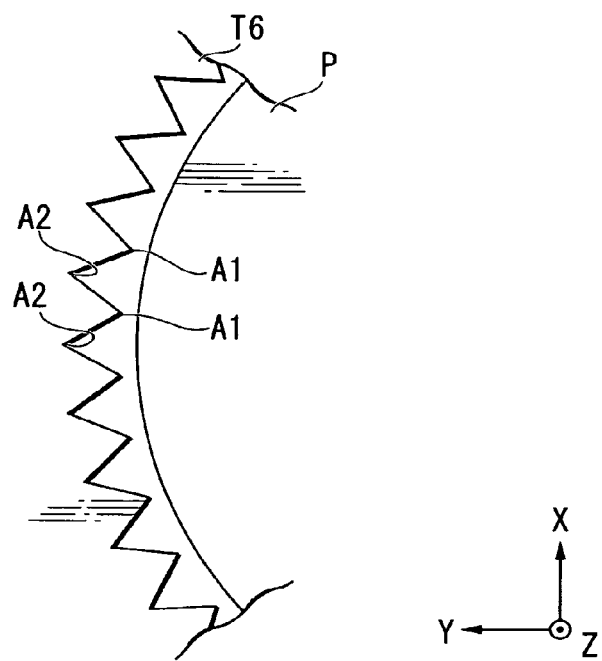
FIG. 29 is a view illustrating a part of the substrate stage relating to the thirteenth embodiment.

Furthermore, as a cover member T6 shown in FIG. 29, the first area A1 (the protruding portion) and the second area A2 (the recessed portion) may have a corner portion.

Figure 30:
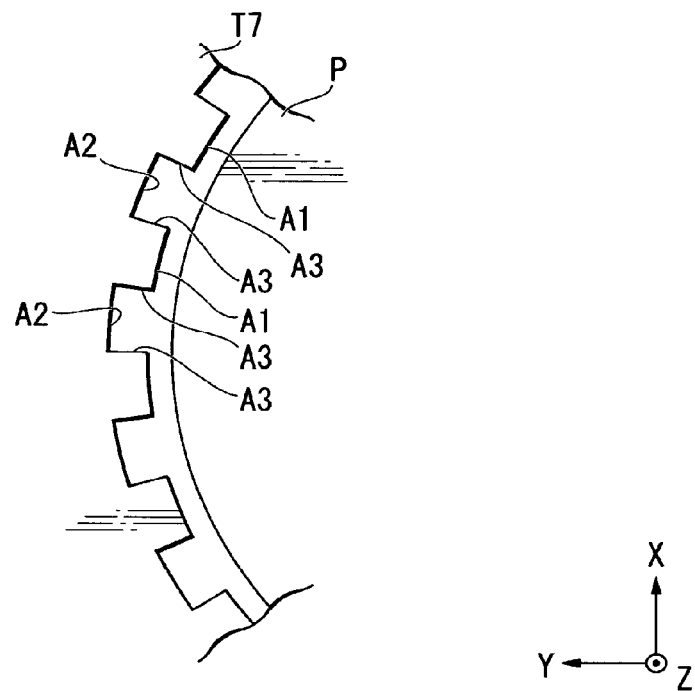
FIG. 30 is a view illustrating a part of the substrate stage relating to the thirteenth embodiment.

Furthermore, as a cover member T7 shown in FIG. 30, the first area A1 and the third area A3 may intersect substantially perpendicular, and the second area A2 and the third area A3 may intersect substantially perpendicular. In an example shown in FIG. 30, a dimension of the third area A3 is smaller than a dimension of the first area A1 (the second area A2).

Figure 31:
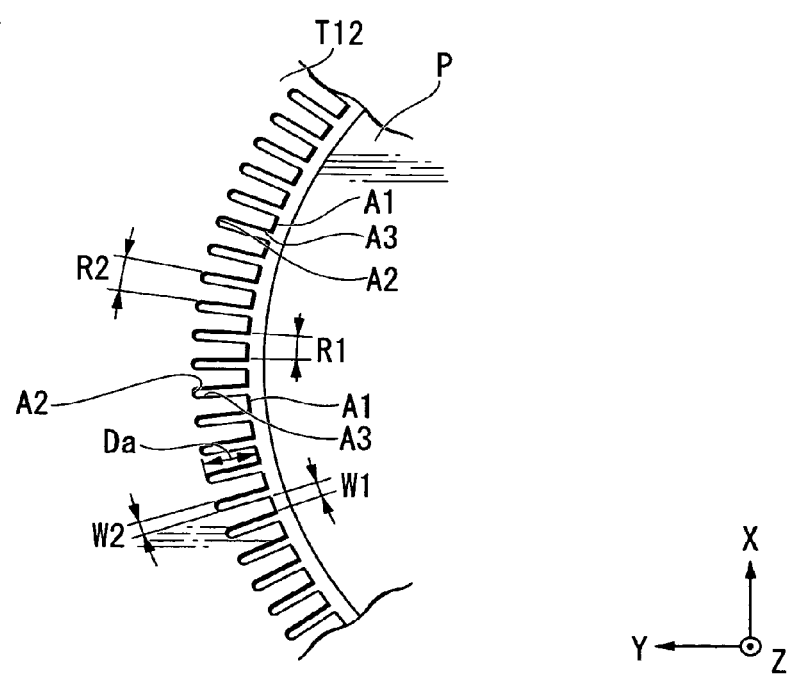
FIG. 31 is a view illustrating a part of the substrate stage relating to the thirteenth embodiment.

Furthermore, a dimension of the third area A3 may be greater than a dimension of the first area A1 (the second area A2), in a case where the first area A1 and the third area A3 intersect substantially perpendicular and the second area A2 and the third area A3 intersect perpendicular, as a cover member T12 shown in FIG. 31. That is, a dimension W1 of the first area A1 in relation to the circumferential direction of the first holding portion 31 may be smaller than the distance Da between the first area A1 and the second area A2 in relation to the radial direction with respect to the center of the first holding portion 31. Furthermore, a dimension W2 of the second area A2 in relation to the circumferential direction of the first holding portion 31 may be smaller than the distance Da between the first area A1 and the second area A2 in relation to the radial direction with respect to the center of the first holding portion 31.

Furthermore, the distance R1 of the adjacent first area A1 in relation to the circumferential direction of the first holding portion 31 may be smaller than the distance Da. Furthermore, the distance R2 of the adjacent second area A2 in relation to the circumferential direction of the first holding portion 31 may be smaller than the distance Da.

Figure 32:
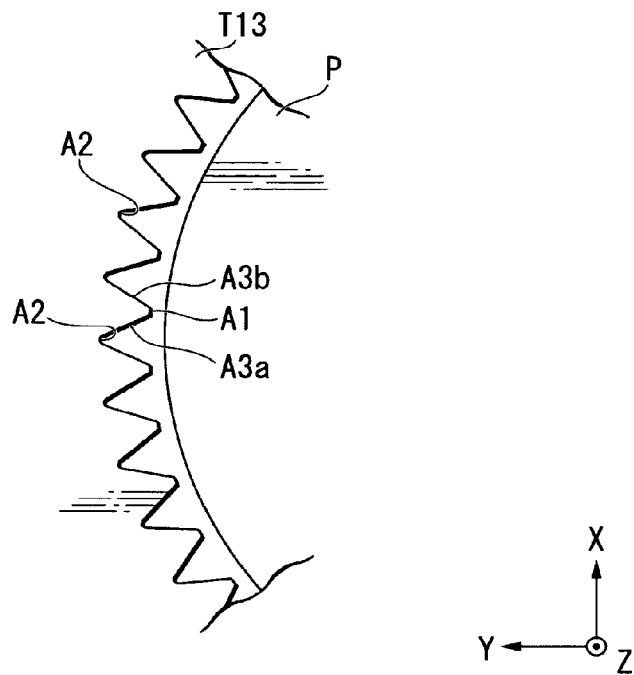
FIG. 32 is a view illustrating a part of the substrate stage relating to the thirteenth embodiment.

Furthermore, as a cover member T13 shown in FIG. 32, a distance between a third area A3a and a third area A3b, arranged at both sides of the first area A1 may become gradually smaller toward the first area A1.

Figure 33:
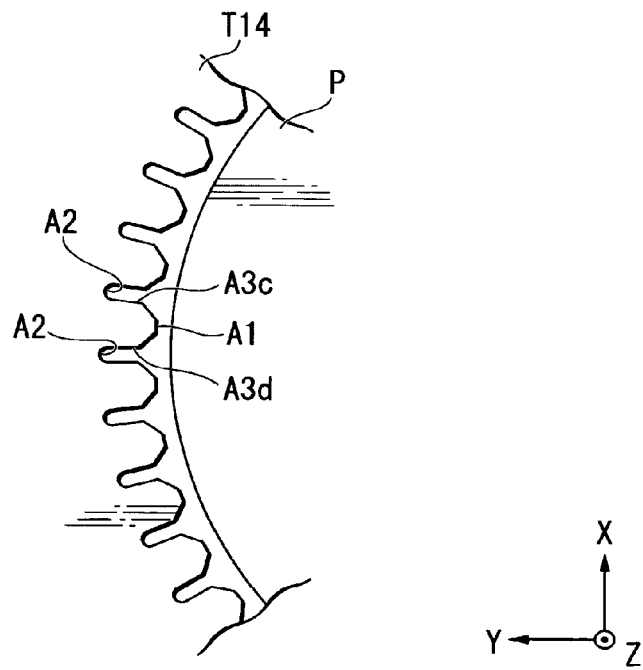
FIG. 33 is a view illustrating a part of the substrate stage relating to the thirteenth embodiment.

Furthermore, as a cover member T14 shown in FIG. 33, at least a part of each of a third area A3c and a third area A3d, arranged at both sides of the first area A1 may be in parallel.

Fourteenth Embodiment

Next, a fourteenth embodiment is described. In the below-written description, the same component as or the equivalent component to the component of the above-described embodiment is given a like reference numeral and therefore its description is brief or omitted.

Figure 34:
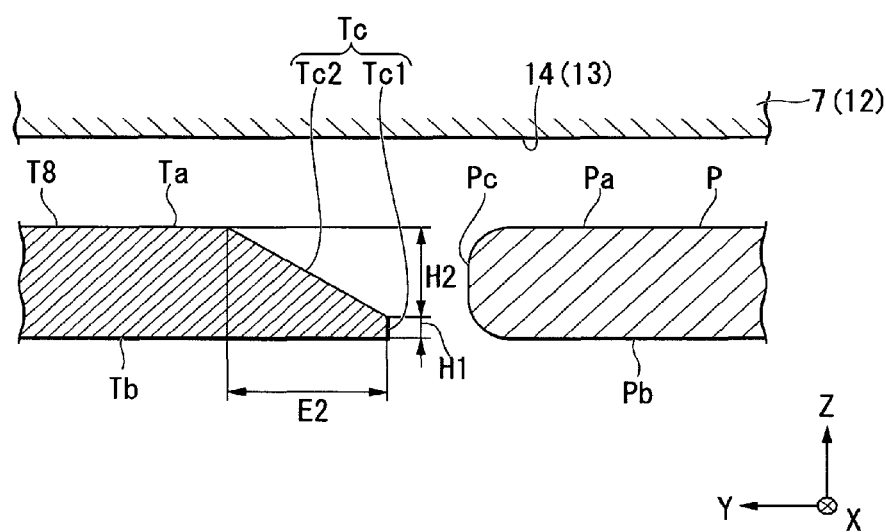
FIG. 34 is a view illustrating a part of a substrate stage relating to a fourteenth embodiment.

FIG. 34 is a cross-sectional view illustrating one example of a cover member T8 relating to the present embodiment. As shown in FIG. 34, at least a part of an inside surface Tc of the cover member T8 which a side surface Pc of a substrate P faces is inclined upward in the outside direction with respect to the center of a first holding portion 31.

In the present embodiment, an inside surface Tc of the cover member T8 includes a first inside surface Tc1 and a second inside surface Tc2 which is arranged above of the first inside surface Tc1, and which at least a part of the side surface Pc of the substrate P faces. The lower end of the second inside surface Tc2 is linked to the first inside surface Tc1, and the upper end is linked to an upper surface Ta of the cover member T8.

The first inside surface Tc1 and the second inside surface Tc2 are not in parallel. In relation to the normal direction (the Z axis direction) of the upper surface Ta of the cover member T8, a dimension H2 of the second inside surface Tc2 is greater than a dimension H1 of the first inside surface Tc1. In the present embodiment, the second inside surface Tc2 is inclined upward in the outside direction with respect to the center of the first holding portion 31. In the present embodiment, the first inside surface Tc1 is substantially parallel with the Z axis.

Furthermore, the lower end of the first inside surface Tc1 is linked to a lower surface Tb of the cover member T8. In the present embodiment, the upper surface Ta and the lower surface Tb of the cover member T8 are substantially parallel. Furthermore, the upper surface Ta is substantially parallel with the XY plane.

In the present embodiment, a dimension E2 of the second inside surface Tc2 in relation to the Y axis direction (the radial direction with respect to the center of the first holding portion 31) is greater than a dimension H2 of the second inside surface Tc2 in relation to the Z axis direction. Furthermore, an angle of the second inside surface Tc2 with respect to the XY plane is, for example, 10 degrees to 45 degrees.

Figure 35:
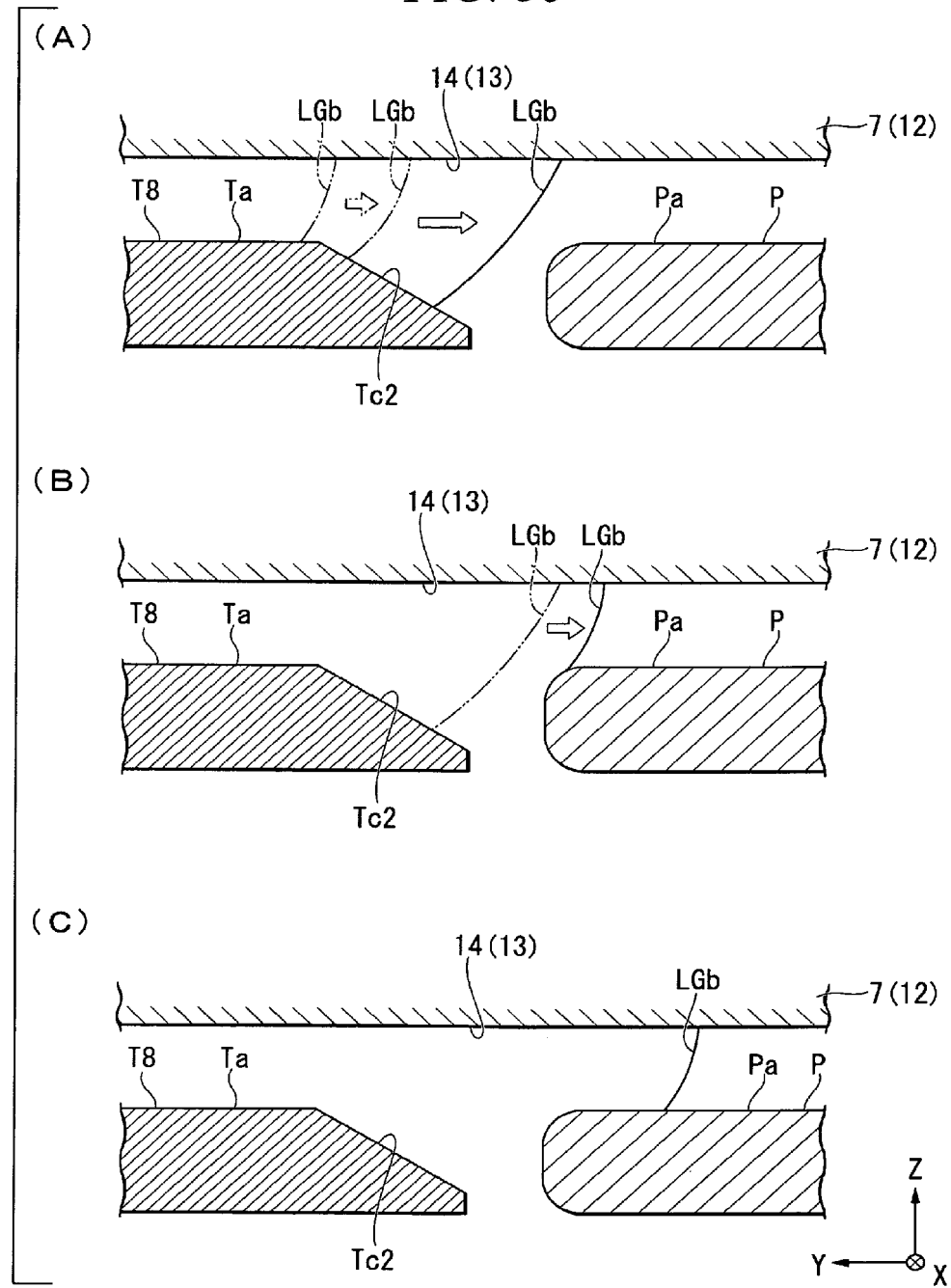
FIG. 35 is a view illustrating a part of the substrate stage relating to the fourteenth embodiment.

FIG. 35 is a view illustrating one example of a state in which a liquid immersion space LS moves from the cover member T8 to the substrate P. The liquid immersion space LS changes from a state shown in FIG. 35(A) through a state shown in FIG. 35(B) to a state shown in FIG. 35(C). FIG. 35 illustrates one example of the state in which the substrate stage 2 moves in the positive Y direction in such a manner that the liquid immersion space LS moves from the cover member T8 to the substrate P.

FIG. 35(A) illustrates the state in which a rear interface LGb of a liquid immersion space LS is positioned on the cover member T8. FIG. 35(B) illustrates the state in which the rear interface LGb moves from the cover member T8 to the substrate P. FIG. 35(C) illustrates the state in which the rear interface LGb is positioned on the substrate P.

When the substrate stage 2 moves, in such a manner that the liquid immersion space LS moves from the cover member T8 to the substrate P, because the cover member T8 has the inside surface Tc which includes the inclined second inside surface Tc2, the remaining liquid LQ of the liquid immersion space LS on the substrate P can be suppressed.

For example, as shown in FIG. 35(A), when the lower end of the rear interface LGb is positioned on the second inside surface Tc2, an angle which the rear interface LGb and the second inside surface Tc2 make with respect to each other is near 90 degrees. That is, the forming of a thin film of the liquid LQ on the cover member T8 is suppressed. In the present embodiment, when the rear interface LGb moves on the second inside surface Tc2, for example, the dimension H2 of the second inside surface Tc2 and the dimension E2, and an angle with respect to the XY plane are adjusted, in such a manner that the angle which the rear interface LGb and the second inside surface Tc2 make with respect to each other is near 90 degrees, in other words, in such a manner that the thin film of the liquid LQ is not formed on the second inside surface Tc2.

As shown in FIG. 35(B), the angle which the rear interface LGb and the upper surface Pa make with respect to each other is near 90 degrees, even immediately after the lower end of the rear interface LGb moves from the second inside surface Tc2 of the cover member T8 to an upper surface Pa of the substrate P. That is, the forming of a thin film of the liquid LQ on the substrate P is suppressed. In the present embodiment, when the rear interface LGb moves from the second inside surface Tc2 to the upper surface Pa of the substrate P, for example, the dimension H2 of the second inside surface Tc2, the dimension E2 and, and the angle with respect to the XY plane are adjusted, in such a manner that the angle which the rear interface LGb and the upper surface Pa make with respect to each other is indicated as a value near 90 degrees, in other words, in such a manner that the thin film of the liquid LQ is not formed on the upper surface Pa.

As shown in FIG. 35(C), the angle which the rear interface LGb and the upper surface Pa of the substrate P make with respect to each other is near 90 degrees, even when the lower end of the rear interface LGb is positioned on the upper surface Pa of the substrate P. That is, the forming of the thin film of the liquid LQ on the substrate P is suppressed.

Figure 36:
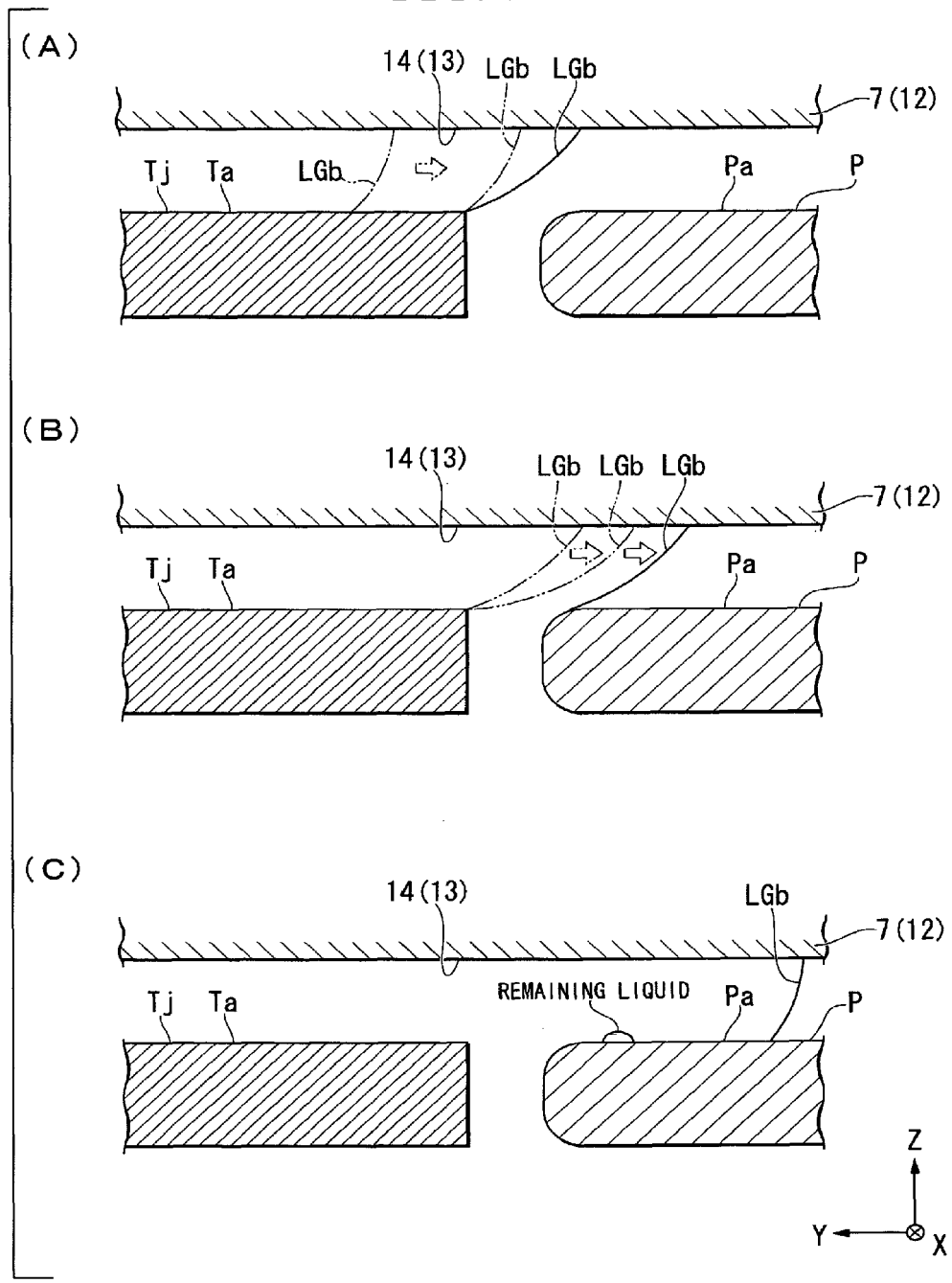
FIG. 36 is a view relating to a comparative example.

FIG. 36 illustrates a comparative example. In FIG. 36, a cover member Tj has the inside surface Tc. The inside surface Tc is substantially parallel with the Z axis.

FIGS. 36(A) to 36(C) are views illustrating one example of a state in which the substrate stage 2 moves in the positive Y direction in such a manner that the liquid immersion space LS moves from the cover member Tj to the substrate P. The liquid immersion space LS changes from a state shown in FIG. 36(A) through a state shown in FIG. 36(B) to a state shown in FIG. 36(C).

FIG. 36(A) illustrates the state in which the rear interface LGb of the liquid immersion space LS is positioned on the cover member Tj. FIG. 36(B) illustrates the state in which the rear interface LGb moves from the cover member Tj to the substrate P. FIG. 36 (C) illustrates the state in which the rear interface LGb is positioned on the substrate P.

As shown in FIG. 36 (A), when the lower end of the rear interface LGb is positioned on an edge of the upper surface Ta, the angle which the rear interface LGb and the upper surface Ta make with respect to each other is small. As shown in FIG. 36(B), even immediately after a lower end of the rear interface LGb moves from the upper surface Ta of the cover member Tj to the upper surface Pa of the substrate P, the angle which the rear interface LGb and the upper surface Pa make with respect to each other is small. That is, there is a high likelihood that the thin film of the liquid LQ is formed on the substrate P. As a result, as shown in FIG. 36(C), there is a high likelihood that the liquid LQ remains behind on the substrate P.

As is described above, according to the present embodiment, by the inside surface Tc including the second inside surface Tc2 inclined, the thinning of the liquid LQ is suppressed when the liquid immersion space LS moves from the cover member T8 to the substrate P. Therefore, the remaining of the liquid LQ on, for example, the substrate P is suppressed.

Furthermore, for example, a protruding portion of the cover member described referring to FIGS. 25, 28 to 33, and the like may have the second inside surface Tc2 described referring to FIG. 34 and the like. That is, the protruding portion of the cover member T may have an upper surface which is inclined in the direction of being separated with respect to the first holding portion 31 and in the upward direction, from the tip portion of the protruding portion.

Figure 37:
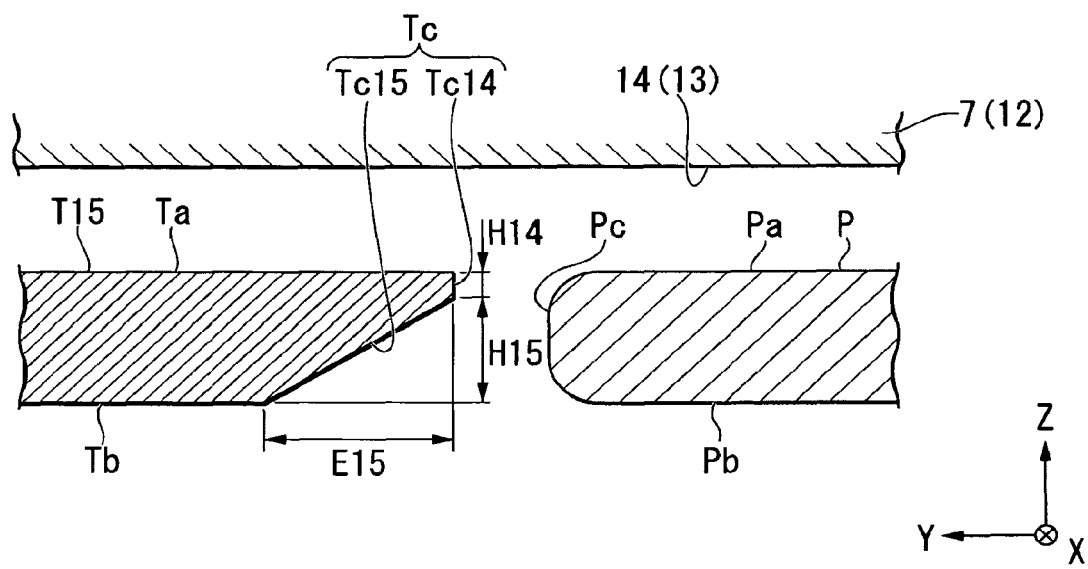
FIG. 37 is a view illustrating a part of the substrate stage relating to the fourteenth embodiment.

Furthermore, as shown in FIG. 37, at least a part of the inside surface Tc of a cover member T15 which the side surface Pc of the substrate P faces may be inclined downward in the outside direction with respect to the center of the first holding portion 31. In FIG. 37, the inside surface Tc of the cover member T15 includes a first inside surface Tc14, and a second inside surface Tc15 which is arranged below of the first inside surface Tc14, and which at least a part of the side surface Pc of the substrate P faces. The upper end of the second inside surface Tc15 is linked to the first inside surface Tc14 and the lower end is linked to the lower surface Tb of the cover member T15.

The first inside surface Tc14 and the second inside surface Tc15 are not in parallel. In relation to the normal direction (the Z axis direction) of the upper surface Ta of the cover member T15, a dimension H15 of the second inside surface Tc15 is greater than a dimension H14 of the first inside surface Tc14. In an example shown in FIG. 37, the second inside surface Tc15 is inclined downward in the outside direction with respect to the center of the first holding portion 31. The first inside surface Tc14 is substantially parallel with the Z axis.

Furthermore, the upper end of the first inside surface Tc14 is linked to the upper surface Ta of the cover member T15. The upper surface Ta and the lower surface Tb of the cover member T15 are substantially parallel. Furthermore, the upper surface Ta is substantially parallel with the XY plane.

A dimension E15 of the second inside surface Tc15 in relation to the Y axis direction (the radial direction with respect to the center of the first holding portion 31) is greater than the dimension H15 of the second inside surface Tc15 in relation to the Z axis direction. Furthermore, the angle which the second inside surface Tc15 makes with respect to the XY plane is, for example, in the range of 10 degrees to 45 degrees.

Even in a cover member T15 shown in FIG. 37, for example, the remaining of the liquid LQ is suppressed.

Figure 38:
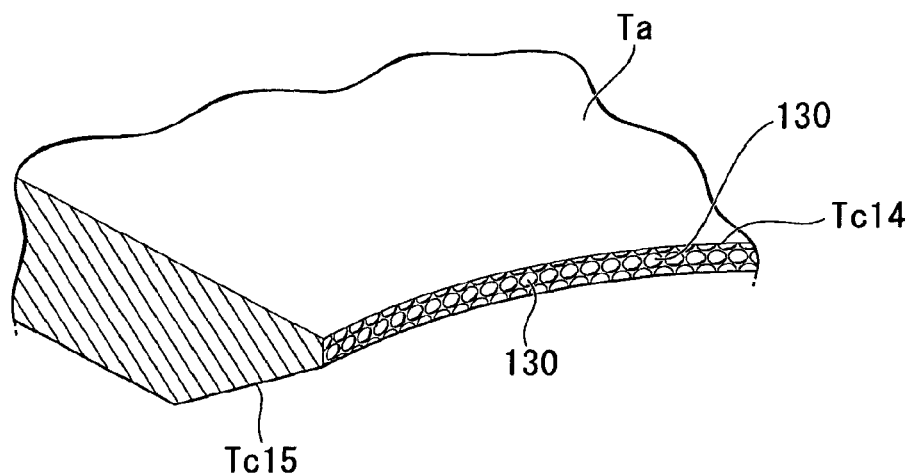
FIG. 38 is a view illustrating a part of the substrate stage relating to the fourteenth embodiment.

Furthermore, as shown in FIG. 38, a plurality of protruding portions 130 may be provided on the first inside surface Tc14. By the protruding portion 130, a contact angle of the first inside surface Tc14 with respect to the liquid LQ is adjusted.

Furthermore, for example, the protruding portion of the cover member described referring to FIGS. 25, 28 and 33 and the like may have the second inside surface Tc15 described referring to FIG. 37 and the like. That is, the protruding portion of the cover member T may have a lower surface which is inclined in the direction of being separated with respect to the first holding portion 31 and in the downward direction, from the tip portion of the protruding portion.

Furthermore, for example, the protruding portion 130 described referring to FIG. 38 and the like may be provided at the protruding portion of the cover member described referring to FIGS. 25, 28 to 33 and the like.

Fifteenth Embodiment

Next, a fifteenth embodiment is described. In the below-written description, the same component as or the equivalent component to the component of the above-described embodiment is given a like reference numeral and therefore its description is brief or omitted.

Figure 39:
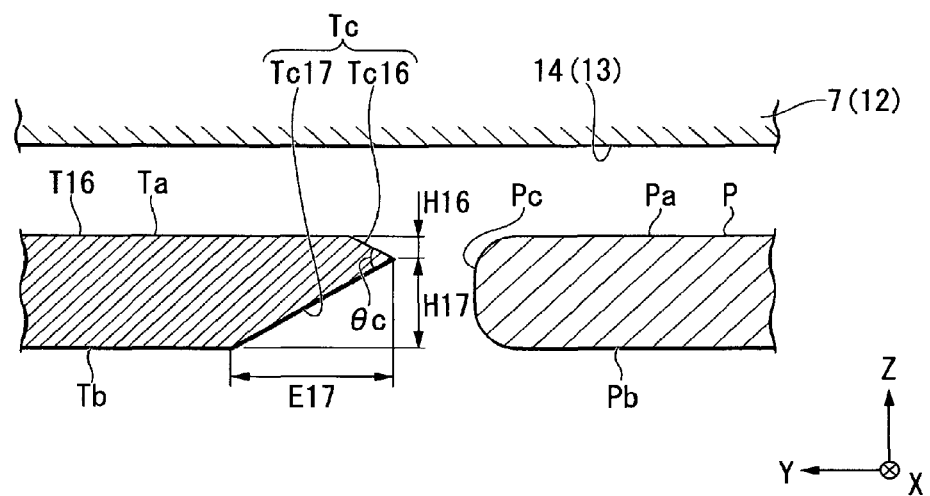
FIG. 39 is a view illustrating a part of a substrate stage relating to a fifteenth embodiment.

FIG. 39 is a cross-sectional view illustrating one example of a cover member T16 relating to the present embodiment. As shown in FIG. 39 a part of an inside surface Tc of a cover member T16 which a side surface Pc of a substrate P faces is inclined upward in the outside direction with respect to the center of the first holding portion 31 and another part is inclined downward.

In the present embodiment, an inside surface Tc of the cover member T16 includes a first inside surface Tc16 of which at least a part faces the side surface Pc of the substrate P, and a second inside surface Tc17, arranged below the first inside surface Tc16, which at least a part of the side surface Pc of the substrate P faces.

The upper end of the first inside surface Tc16 is linked to the upper surface Ta of the cover member T16. The lower end of the first inside surface Tc16 is linked to the upper end of the second inside surface Tc17. The lower end of the second inside surface Tc17 is linked to the lower surface Tb of the cover member T16.

The first inside surface Tc16 and the second inside surface Tc17 are not in parallel. In relation to a normal direction (the Z axis direction) of the upper surface Ta of the cover member T16, a dimension H17 of the second inside surface Tc17 is greater than a dimension H16 of the first inside surface Tc16. In the present embodiment, the first inside surface Tc16 is inclined upward in the outside direction with respect to the center of the first holding portion 31. The second inside surface Tc17 is inclined downward in the outside direction with respect to the center of the first holding portion 31.

The upper surface Ta and the lower surface Tb of the cover member T16 is substantially parallel. Furthermore, the upper surface Ta is substantially parallel with the XY plane.

In the present embodiment, a dimension E17 of the second inside surface Tc17 in relation to the Y axis direction (the radial direction with respect to the center of the first holding portion 31) is greater than a dimension H17 of the second inside surface Tc17 in relation to the Z axis direction. Furthermore, an angle which the second inside surface Tc17 makes with respect to the XY plane is, for example, in a range of 10 degrees to 45 degrees. Furthermore, an angle θc which the first inside surface Tc16 and the second inside surface Tc17 make with respect to each other is an acute angle. A corner portion which is formed with the first inside surface Tc16 and the second inside surface Tc17 is sharp.

In the present embodiment, for example, the remaining of the liquid LQ is also suppressed.

Furthermore, for example, the protruding portion of the cover member described referring to FIGS. 25, 28 to 33 and the like may have the first inside surface Tc16 and the second inside surface Tc17 described referring to FIG. 39 and the like. That is, the protruding portion of the cover member T may have a lower surface, which is inclined in the direction of being separated with respect to the first holding portion 31 and in the downward direction, from the tip portion of the protruding portion, and an upper surface which is inclined in the upward direction.

Sixteenth Embodiment

Next, a sixteenth embodiment is described. In the below-written description, the same component as or the equivalent component to the component of the above-described embodiment is given a like reference numeral and therefore its description is brief or omitted.

Figure 40:
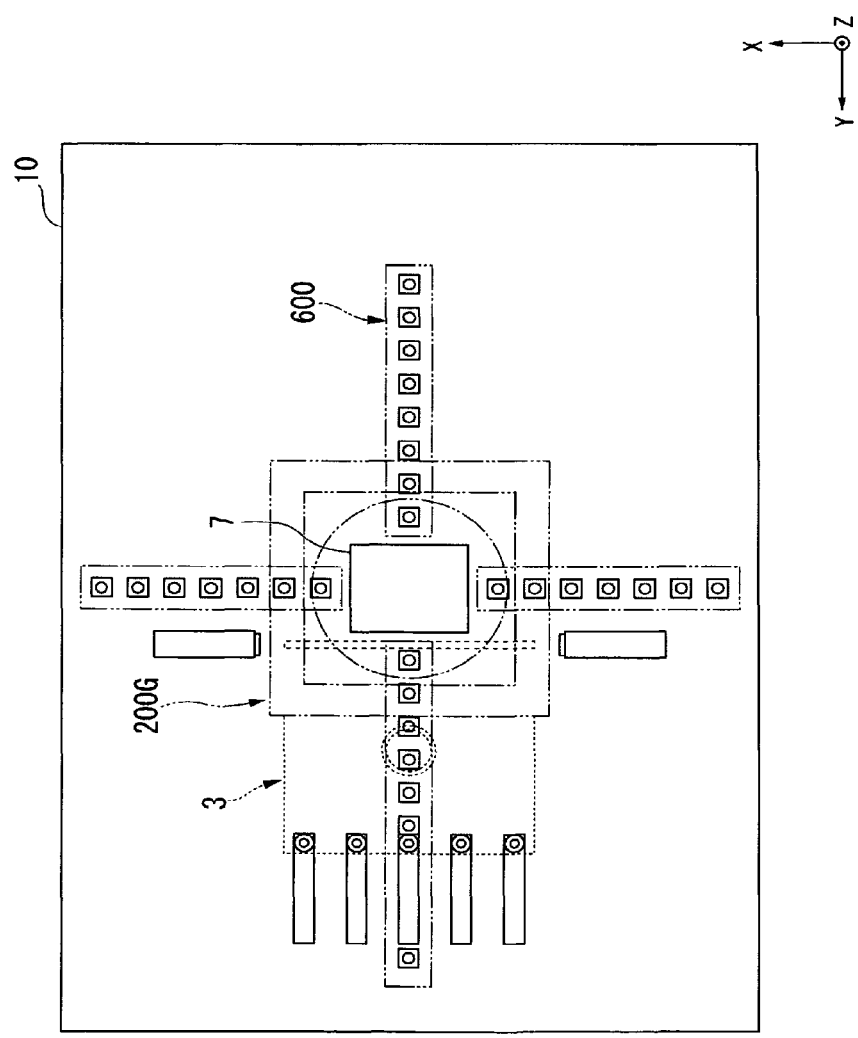
FIG. 40 is a view illustrating one example of an exposure apparatus relating to a sixteenth embodiment.
Figure 41:
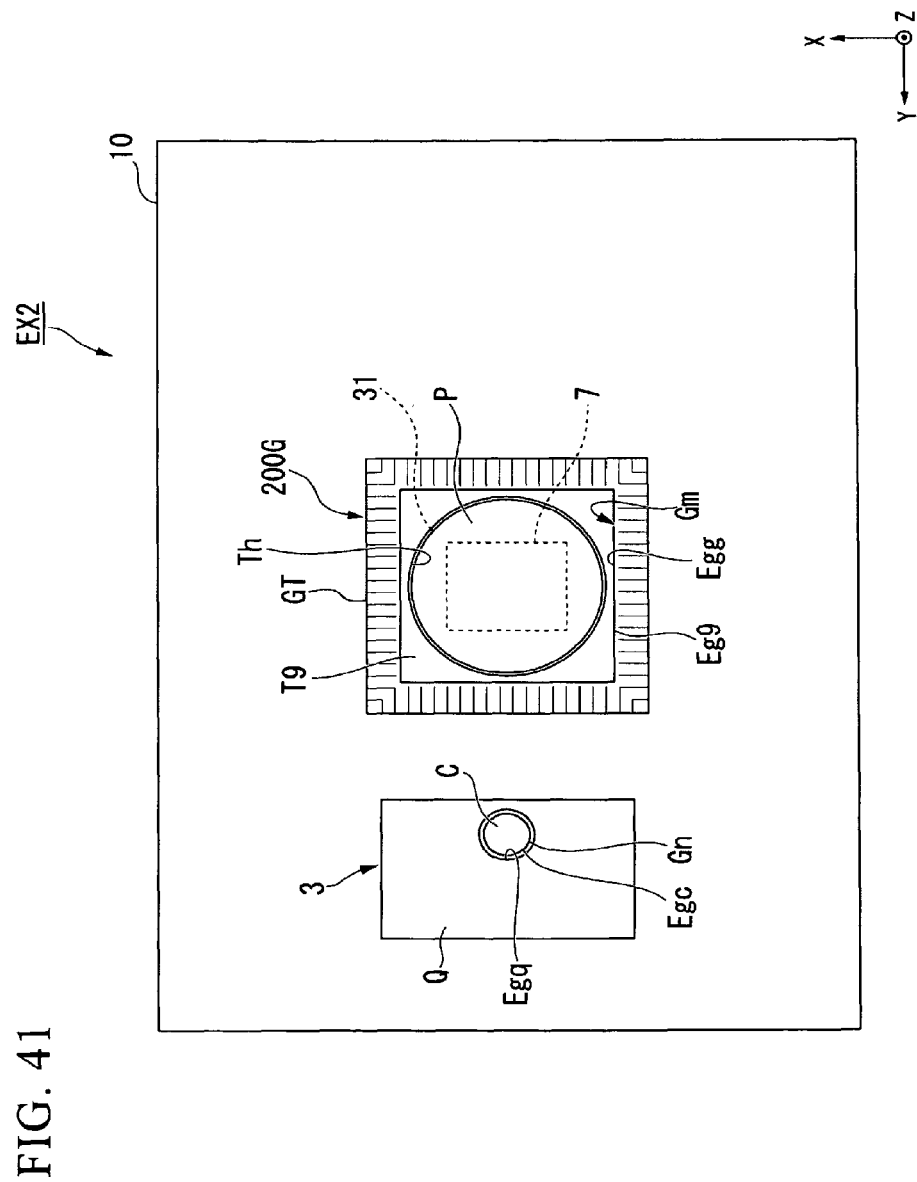
FIG. 41 is a view illustrating one example of the exposure apparatus relating to the sixteenth embodiment.

FIGS. 40 and 41 are views illustrating one example of an exposure apparatus EX2 relating to the present embodiment. The exposure apparatus EX2 of the present embodiment includes an encoder system 600 measuring a position of a substrate stage 200G, using a scale member GT which the substrate stage 200G has, as disclosed in, for example, the specification of United States Patent Application, Publication No. 2007/0288121. FIG. 40 is a view illustrating the encoder system 600, and FIG. 41 is a view illustrating the substrate stage 200G and a measurement stage 3.

In FIG. 41, the substrate stage 200G has a first holding portion 31 holding a lower surface of a substrate P in such a manner that the lower surface of the substrate P can be released, a scale member GT, arranged at at least a part of the vicinity of the first holding portion 31, where a liquid immersion space LS can be formed, and a cover member T2, arranged adjacent to the scale member GT, having an upper surface on which a liquid immersion space LS can be formed. In the present embodiment, a cover member T9 is arranged at the vicinity of the substrate P held by the first holding portion 31. The scale member GT is arranged at the vicinity of the cover member T9. Furthermore, the scale member GT may be arranged at the vicinity of the substrate P held by the first holding portion 31, and the cover member T9 may be in the vicinity of the scale member GT. The scale member GT has a lattice which is measured with an encoder head of the encoder system 600. The cover member T9 does not have the lattice.

In the present embodiment, a gap Gm is formed between the scale member GT and the cover member T9.

Furthermore, as shown in FIG. 41, in a measurement stage 3, a gap Gn is formed between the measurement member C and the cover member Q.

The cover member T9 has an upper surface which a last optical element 12 can face, and an edge portion Eg9 defining at least a part of an edge (an outer edge) of the upper surface. The scale member GT has an upper surface which the last optical element 12 can face, and an edge portion Egg defining at least a part of an edge (an inner edge) of the upper surface. An upper surface of the cover member T9 and an upper surface of the scale member GT are arranged side by side with the gap Gm in between. The upper surface of the scale member GT is arranged at the vicinity of the upper surface of the cover member T9.

By the substrate stage 200G moving, the cover member T9 and the scale member GT move below the last optical element 12. The cover member T9 moves below the last optical element 12 in such a manner that at least a part of the upper surface of the cover member T9 comes into contact with the liquid LQ of the liquid immersion space LS. The scale member GT moves below the last optical element 12 in such a manner that at least a part of the upper surface of the scale member GT comes into contact with the liquid LQ of the liquid immersion space LS.

The cover member Q has an upper surface which the last optical element 12 can face, and an edge portion Egq defining at least a part of an edge (an inner edge) of the upper surface. A measurement member C has an upper surface which the last optical element 12 can face, and an edge portion Egc defining at least a part of an edge (an outer edge) of the upper surface. An upper surface of the cover member Q and an upper surface of the measurement member C are arranged side by side with the gap Gn in between.

The upper surface of the cover member Q is arranged at the vicinity of the upper surface of the measurement member C.

By the movement of the measurement stage 3, the cover member Q and the measurement member C are moved below of the last optical element 12. The cover member Q is moved below of the last optical element 12 in such a manner that at least a part of the upper surface of the cover member Q comes into contact with the liquid LQ of the liquid immersion space LS. The measurement member C is moved below of the last optical element 12 in such a manner that at least a part of the upper surface of the measurement member C comes into contact with the liquid LQ of the liquid immersion space LS.

Figure 42:
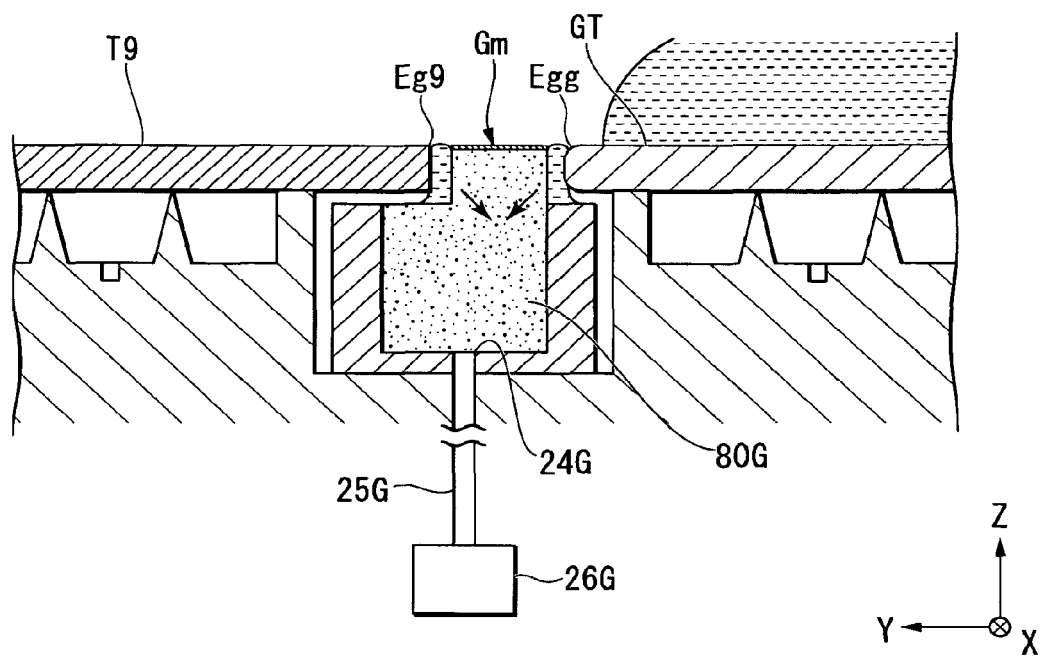
FIG. 42 is a view illustrating one example of the exposure apparatus relating to the sixteenth embodiment.

FIG. 42 is a sectional side view illustrating the vicinity of the gap Gm between the scale member GT and the cover member T9. The gap Gm includes a gap between the edge portion Egg of the scale member GT and the edge portion Eg9 of the cover member T9. In FIG. 42, the substrate stage 200G has a porous member 80G of which at least a part is arranged at the gap Gm between the scale member GT and the cover member T9, and which has an upper surface liquid-repellent with respect to the liquid LQ. The liquid LQ recovered by the porous member 80G is suctioned by a fluid suction apparatus 26G through a suction port 24G and a channel 25.

Furthermore, in the measurement stage 3, the porous member having the upper surface liquid-repellent with respect to the liquid LQ may be arranged at the gap Gn between the measurement member C and the cover member Q, and at least a part of the liquid LQ which flows into the gap Gn may be recovered through the porous member. Furthermore, the gap Gn includes a gap between an edge portion Egc of the measurement member C and an edge portion Egq of the cover member Q.

Figure 43:
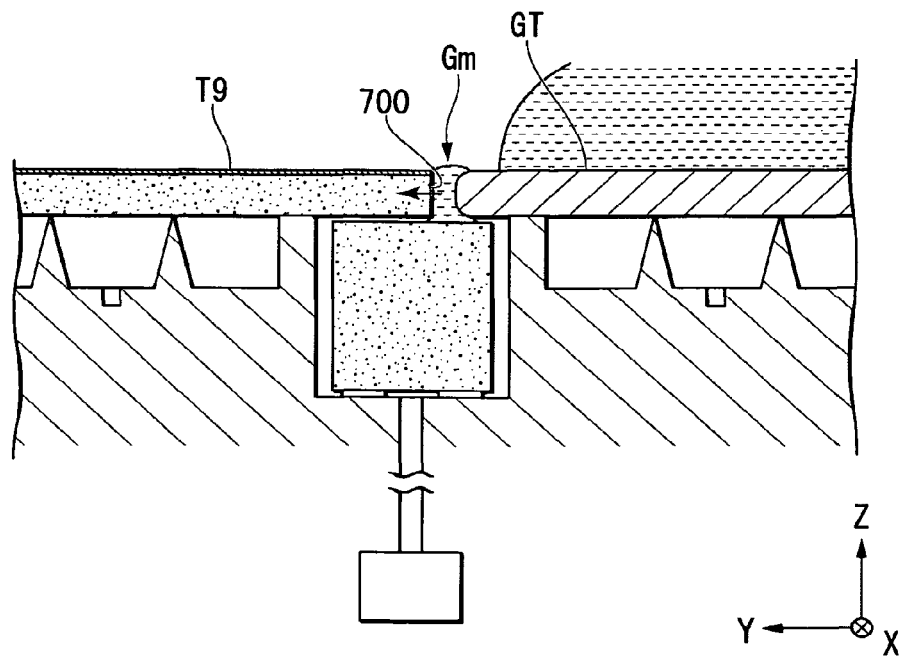
FIG. 43 is a view illustrating one example of the exposure apparatus relating to the sixteenth embodiment.

Furthermore, as shown in FIG. 43, at least a part of the liquid LQ which flows into the gap Gm may be recovered through a recovery port 700 which is arranged in such a manner as to face a side surface of the scale member GT. In an example shown in FIG. 43, the recovery port 700 is arranged at the cover member T9. Furthermore, at least a part of the liquid LQ which flows into the gap Gm may be recovered through the recovery port which is arranged in such a manner as to face a side surface of the cover member T9. The recovery port may be arranged at the scale member GT.

Furthermore, in the measurement stage 3, at least a part of the liquid LQ which flows into gap Gn may be recovered through the recovery port which is arranged in such a manner as to face a side surface of the measurement member C. Furthermore, the recovery port may be arranged at the cover member Q. Furthermore, at least a part of the liquid LQ which flows into the gap Gn may be recovered through the recovery port which is arranged in such a manner as to face a side surface of the cover member Q.

Furthermore, the recovery port may be arranged at the measurement member C.

Figure 44:
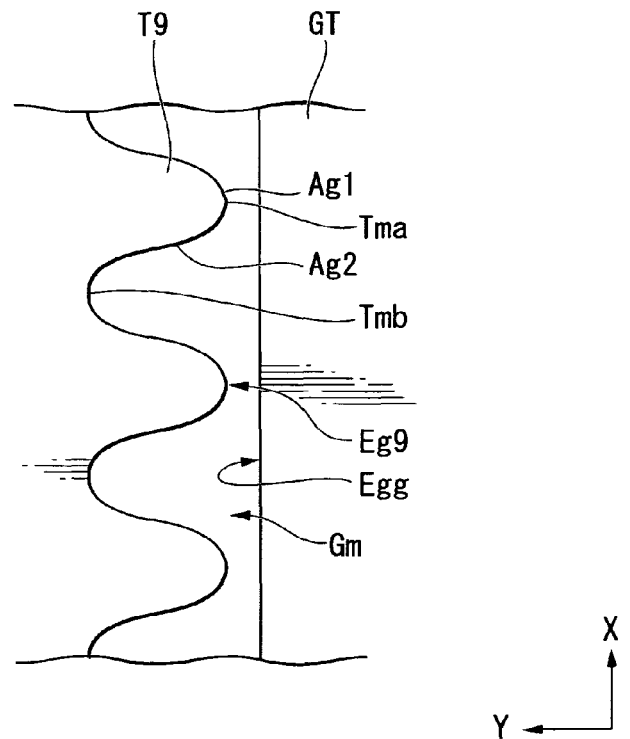
FIG. 44 is a view illustrating one example of the exposure apparatus relating to the sixteenth embodiment.

Furthermore, as shown in FIG. 44, a side surface (an edge portion Eg9) of the cover member T9 forming the gap Gm between the side surface of the cover member T9 and the scale member GT may be arranged at a first distance from the center of the scale member GT, and may include a first area Ag1 which the side surface of the scale member GT can face, and a second area Ag2 which is arranged adjacent to the first area Ag1 and is positioned at a second distance longer than the first distance from the center of the scale member GT.

As shown in FIG. 41 and the like, in the present embodiment, an outward appearance of the edge portion Egg of the scale member GT in the XY plane is substantially rectangular. The edge portion Egg includes a part extending in the X axis direction and a part extending in the Y axis direction. The part extending in the X axis direction is a straight line in parallel with the X axis. The part extending in the Y axis direction is a straight line in parallel with the Y axis.

Furthermore, the edge portion Eg9 of the cover member T9 includes a part extending in the X axis direction and a part extending in the Y axis direction as well.

In FIG. 44, the first area Ag1 and the second area Ag2 are alternately arranged at relation to the X axis direction. That is, the cover member T9 has a plurality of protruding portions Tma extruding with respect to the scale member GT and a plurality of recessed portions Tmb being recessed with respect to the scale member GT. The plurality of protruding portions Tma and the plurality of recessed portions Tmb are alternately arranged at relation to the X axis direction along with the edge portion Egg of the scale member GT. In the present embodiment, the first area Ag1 is a curved surface (a curved line) in the XY plane. The second area Ag2 is a curved surface (a curved line) in the XY plane.

That is, in the present embodiment, the edge portion Eg9 of the cover member T9 includes the plurality of protruding portions Tma formed along the X axis direction. The protruding portion Tma includes the first area Ag1. The recessed portion Tmb includes the second area Ag2. The plurality of protruding portions Tma include the first protruding portion Tma and the second protruding portion Tma which are adjacent to each other in the X axis direction. In the present embodiment, an upper surface of the cover member T9 includes an upper surface of the protruding portion Tma.

In the present embodiment, the plurality of protruding portions Tma is arranged at regular intervals along the X axis direction.

A distance in relation to the X axis direction between the first protruding portion Tma and the second protruding portion Tma which are adjacent to each other in the X axis direction is substantially equal to a distance in relation to the X axis direction between the second protruding portion Tma and a third protruding portion Tma.

Furthermore, FIG. 44 illustrates an example in which the protruding portion Tma is arranged at the X axis direction, but the same is also true for the Y axis direction.

Furthermore, the side surface of the scale member GT forming the gap Gm between the side surface of the scale member GT and the cover member T9 may include a first area which is positioned at a first distance from the center of the cover member T9, and which the side surface of the cover member T9 can face, and a second area which is arranged adjacent to the first area and is positioned at a second distance longer than the first distance from the center of the cover member T9. That is, the plurality of protruding portions may be arranged at the edge portion Egg of the scale member GT in relation to the X axis direction (the Y axis direction).

Furthermore, in the measurement stage 3, a side surface of the cover member Q forming the gap Gn between the side surface of the cover member Q and the measurement member C may include a first area which is positioned at the first distance from the center of the measurement member C, and which the side surface of the measurement member C can face, and a second area which is arranged adjacent to the first area and is positioned at the second distance longer than the first distance from the center of the measurement member C. That is, the plurality of protruding portions may be arranged at an edge portion Egq of the cover member Q. A plurality of protruding portions in the cover member Q may be arranged at the circumferential direction of the center of an opening in the cover member Q where the measurement member C is arranged.

Furthermore, the side surface of the measurement member C forming the gap Gn between the side surface of the measurement member C and the cover member Q may include a first area which is positioned at a first distance from the center of the measurement member C and which the side surface of the measurement member C can face, and a second area which is arranged adjacent to the first area and which is positioned at the second distance longer than the first distance from the center of the measurement member C. That is, the plurality of protruding portions may be arranged at an edge portion Egc of the measurement member C.

The plurality of protruding portions in the measurement member C is arranged at the circumferential direction of the center of the measurement member C.

Figure 45:
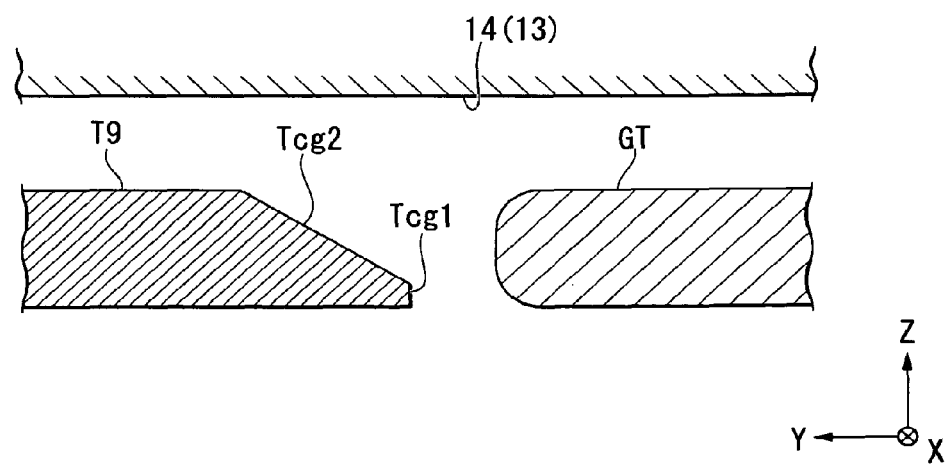
FIG. 45 is a view illustrating one example of the exposure apparatus relating to the sixteenth embodiment.

Furthermore, as shown in FIG. 45, an inside surface of the cover member T9 may include a first inside surface Tcg1, and a second inside surface Tcg2 which is arranged above of the first inside surface Tcg1, and which at least a part of the side surface of the scale member GT faces. The lower end of the second inside surface Tcg2 is linked to the first inside surface Tcg1 and the upper end of the second inside surface Tcg2 is linked to the upper surface of the cover member T9. The first inside surface Tcg1 and the second inside surface Tcg2 may be not in parallel, a dimension of the second inside surface Tcg2 may be greater than a dimension of the first inside surface Tcg1 in relation to the normal direction of the upper surface of the cover member T9, and at least the second inside surface Tcg2 may be inclined upward in the outside direction with respect to the center of the scale member GT.

Furthermore, an inside surface of the scale member GT may include a first inside surface and a second inside surface which is arranged above of the first inside surface and which at least a part of the side surface of the cover member T9 faces. The lower end of the second inside surface is linked to the first inside surface, and the upper end is linked to the upper surface of the scale member GT. The first inside surface and the second inside surface may be not in parallel, a dimension of the second inside surface may be greater than a dimension of the first inside surface in relation to the normal direction of the upper surface of the scale member GT, and at least the second inside surface may be inclined upward in the outside direction with respect to the center of the cover member T9.

Furthermore, in the measurement stage 3, the inside surface of the cover member Q may include a first inside surface, and a second inside surface which is arranged above of the first inside surface, and which at least a part of the side surface of the measurement member C faces. The lower end of the second inside surface is linked to the first inside surface and the upper end is linked to the upper surface of the cover member Q. The first inside surface and the second inside surface may be not in parallel, a dimension of the second inside surface may be greater than a dimension of the first inside surface in relation to the normal direction of the upper surface of the cover member Q, and at least the second inside surface may be inclined upward in the outside direction with respect to the center of the measurement member C.

Furthermore, the inside surface of the measurement member C may include a first inside surface, and a second inside surface which is arranged above of the first inside surface, and which at least a part of the side surface of the cover member Q faces. The lower end of the second inside surface is linked to the first inside surface and the upper end is linked to the upper surface of the measurement member C. The first inside surface and the second inside surface may be not in parallel, a dimension of the second inside surface may be greater than a dimension of the first inside surface in relation to the normal direction of the upper surface of the measurement member C, and at least the second inside surface may be inclined upward in the outside direction with respect to the center of the cover member Q.

Furthermore, the whole form (structure) of the cover member described above may be applied to the scale member GT, the measurement member C, the cover member Q, or the like.

Furthermore, the protruding portion of the cover member T9 described referring to FIG. 44 and the like may have the first inside surface Tcg1 and the second inside surface Tcg2 described referring to FIG. 45 and the like. That is, the protruding portion of the cover member T9 may have an upper surface which is inclined in the direction of being separated with respect to the first holding portion 31 and in the upward direction, from the tip portion of the protruding portion.

That is, the protruding portion of the cover member T9 may have a lower surface which is inclined in the direction of being separated with respect to the first holding portion 31 and in the downward direction, from the tip portion of the protruding portion.

That is, the protruding portion of the scale member GT may have an upper surface which is inclined in the direction of being separated with respect to the first holding portion 31 and in the upward direction, from the tip portion of the protruding portion.

That is, the protruding portion of the scale member GT can have a lower surface which is inclined at the side of being separated with respect to the first holding portion 31 and moreover in the downward direction, from the tip portion of the protruding portion.

Furthermore, a plurality of recovery ports may be provided through which at least a part of the liquid LQ which flows into the gap Gm between the scale member GT and the cover member T9 can be recovered. For example, the plurality of recovery ports can be provided in such a manner as to surround the first holding portion 31. Recovery of the liquid LQ through some of the recovery ports among the plurality of recovery ports may be performed based on any one of or both of a position of the gap Gm with respect to the liquid immersion space LS (the last optical element 12 and the liquid immersion member 7) and a movement condition of the gap Gm with respect to the liquid immersion space LS (the last optical element 12 and the liquid immersion member 7), when the scale member GT and the cover member T9 are moved, in a state in which the liquid immersion space LS is formed at the side of the emitting surface 13 of the last optical element 12.

Furthermore, in the measurement stage 3, a plurality of recovery ports may be provided through which at least a part of the liquid LQ which flows into the gap Gn between the measurement member C and the cover member Q can be recovered. For example, the plurality of recovery ports may be provided in such a manner as to surround the holding portion which holds the measurement member C. The recovery of the liquid LQ through some of the recovery ports among the plurality of recovery ports may be performed based on any one of or both of a position of the gap Gn with respect to the liquid immersion space LS (the last optical element 12 and the liquid immersion member 7) and a movement condition of the gap Gn with respect to the liquid immersion space LS (the last optical element 12 and the liquid immersion member 7), when the measurement member C and the cover member Q are moved, in a state in which the liquid immersion space LS is formed at the side of the emitting surface 13 of the last optical element 12.

Furthermore, in the substrate stage, the measurement member C irradiated by the exposure light EL may be arranged at at least a part of the vicinity of the first holding portion 31. Furthermore, the cover member (T or the like) may be arranged in such a manner as to be adjacent to the measurement member C. For example, the opening where the measurement member C is arranged may be provided at the cover member (T or the like) which the substrate stage has. Furthermore, in the substrate stage, the porous member of which at least a part is arranged at the gap between the measurement member C and the cover member, and which has an upper surface liquid-repellent with respect to the liquid LQ may be provided. Through the porous member, at least a part of the liquid LQ which flows into the gap may be recovered.

Furthermore, the plurality of recovery ports through which at least a part of the liquid LQ which flows into the gap between the measurement member C and the cover member can be recovered may be provided in such a manner as to surround the holding portion which holds the measurement member C, in a case where the measurement member C is provided at the substrate stage. The recovery of the liquid LQ through some of the recovery ports among a plurality of recovery ports may be performed based on any one of or both of a position of the gap between the measurement member C and the cover member with respect to the liquid immersion space LS and a movement condition of the gap being moved between the measurement member C and the cover member with respect to the liquid immersion space LS, in a case where the measurement member C and the cover member is moved, in a state in which the liquid immersion space LS is formed at the side of the emitting surface 13 of the last optical element 12.

Furthermore, in a case where the measurement member C is provided at the substrate stage, at least a part of the liquid LQ which flows into the gap between the measurement member C and the cover member may be recovered through the recovery port arranged in such a manner as to face the side surface of the measurement member C. The recovery port may be provided at, for example, the cover member.

Furthermore, in a case where the measurement member C is provided at the substrate stage, the side surface of the cover member forming a gap between the side surface of the cover member and the measurement member C may include a first area which is positioned at a first distance from the center of the measurement member C, and which the side surface of the measurement member C can face, and a second area which is arranged adjacent to the first area and is positioned at the second distance longer than the first distance from the center of the measurement member C. That is, the plurality of protruding portions may be provided at the edge portion of the cover member. Furthermore, the plurality of protruding portions may be provided at the edge portion of the measurement member.

Furthermore, in a case where the measurement member C is provided at the substrate stage, the inside surface of the cover member provided adjacent to the measurement member C may include a first inside surface and a second inside surface which is arranged above of the first inside surface and which at least a part of the side surface of the measurement member C faces. The lower end of the second inside surface is linked to the first inside surface, and the upper end is linked to the upper surface of the cover member. Furthermore, the first inside surface and the second inside surface may be not in parallel, a dimension of the second inside surface may be greater than a dimension of the first inside surface in relation to the normal direction of the upper surface of the cover member, and at least the second inside surface may be inclined upward in the outside direction with respect to the center of the measurement member.

Furthermore, the whole form (structure) of, for example, the cover member described above may be applied to at least one of a member B1 and a member B2 adjacent to each other inside of the exposure apparatus EX (EX2). That is, in a case where the exposure apparatus EX (EX2) may move below the last optical element 12 and includes two of the members B1 and B2, each of which has an upper surface where the liquid immersion space LS can be formed, a side surface of, the other member, the member B2, forming a gap between the side surface of the member B2 and the side surface of one member, the member B1, includes a first area which is positioned at the first distance from the side surface of the member B1, and which the side surface of the member B1 may face, and a second area which is arranged adjacent to the first area, and which is positioned at the second distance longer than the first distance from the side surface of the member B1.

The upper surface of the member B1 and the upper surface of the member B2 are arranged side by side with the gap in between. That is, the plurality of protruding portions may be provided along a predetermined direction on at least one of the edge portions of the members B1 and B2 which are arranged via the gap in between. Furthermore, the protruding portion may have an inclined lower surface.

As described above, in a case where one member, the member B1, is the scale member GT, the other member, the member B2, may be the cover member T9. In a case where one member, the member B1 is the cover member T9, the other member, the member B2, may be the scale member GT. In a case where one member, the member B1, is the cover member Q, the other member, the member B2, may be the measurement member C. In a case where one member, the member B1, is the measurement member C, the other member, the member B2, may be the cover member Q.

Furthermore, in a case where the substrate P is not a part of the exposure apparatus EX, but, one member, is defined as the substrate P, the other member, the member B2 may be the cover member (T or the like), or may be the scale member GT.

Furthermore, the exposure apparatus EX (EX2) can move the substrate stage and the measurement stage in the XY plane with respect to the last optical element 12 and the liquid immersion member 7, continuing to make at least one of the substrate stage and the measurement stage face the last optical element 12 and the liquid immersion member 7, in a state in which the upper surface of the substrate stage and the upper surface of the measurement stage are approached or contacted in such a manner that the liquid immersion space LS for the liquid LQ continues to be formed between the last optical element 12 and the liquid immersion member 7, and at least one of the substrate stage and the measurement stage, for example, as disclosed in United States Patent Application, Publication No. 2006/0023186 and United States Patent Application, Publication No. 2007/0127006. That is, the exposure apparatus EX (EX2) can move the substrate stage and the measurement stage in the XY plane in the state in which the substrate stage and measurement stage are made to be approached or contacted, in such a manner that the state in which the liquid immersion space LS is formed between the last optical element 12 and the liquid immersion member 7, and the substrate stage is changed to the state in which the liquid immersion space LS is formed between the last optical element 12 and the liquid immersion member 7, and the measurement stage, and vice versa. In such a case, when one member, the member B1, is a substrate stage, the other member, the member B2, may be a measurement stage. When one member, the member B1, is a measurement stage, the other member, the member B2 may be a substrate stage. Furthermore, the substrate stage includes at least one of the cover member (T or the like) and the scale member (GT or the like) which are held by the substrate stage. The measurement stage includes at least one of the cover member (Q or the like) and the measurement member (C or the like) which are held by the measurement stage.

Furthermore, in a case of a twin-stage-type exposure apparatus including the first and second substrate stages, when one member, the member B1 is the first substrate stage, the other member, the member B2 may be the second substrate stage, for example, as disclosed in U.S. Pat. No. 6,341,007, U.S. Pat. No. 6,208,407, and U.S. Pat. No. 6,262,796.

That is, the form of one member, the member B1 described above may be in a form shown in FIGS. 25, 28 to 34, 37 to 39, 44, 45, and the like. The form of the other member, the member B2 may be in a form shown in FIGS. 25, 28 to 34, 37 to 39, 44, 45, and the like. Both of the member B1 and the member B2 facing the member B1 may be in a form shown in FIGS. 25, 28 to 34, 37 to 39, 44, 45, and the like.

Figure 46:
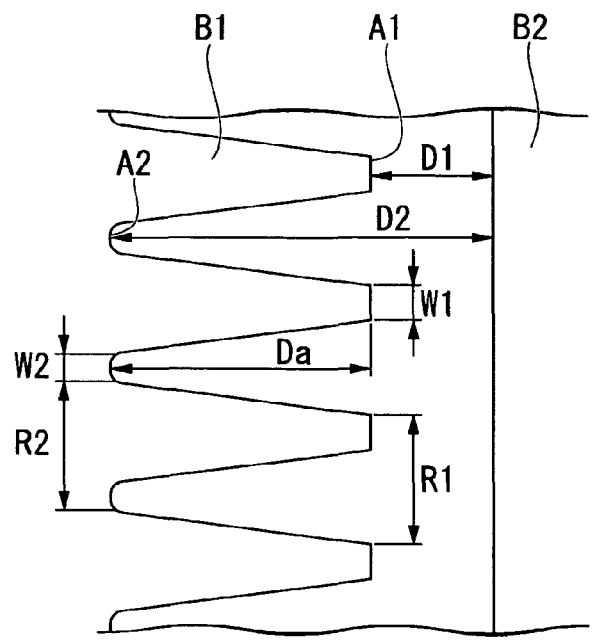
FIG. 46 is a view illustrating one example of the exposure apparatus relating to the sixteenth embodiment.
Figure 47:
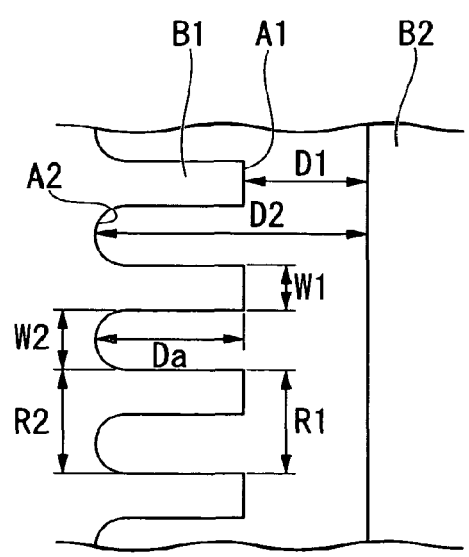
FIG. 47 is a view illustrating one example of the exposure apparatus relating to the sixteenth embodiment.

Furthermore, the member B1 may be in a form shown in FIG. 46, and may be in a form shown in FIG. 47. The member B1 can move below the last optical element 12, and has an upper surface on which the liquid immersion space LS can be formed. The side surface of the member B1 forms a gap between the side surface of the member B1 and the side surface of the member B2. The member B2 can move below the last optical element 12 with being adjacent to the member B1 and has an upper surface on which the liquid immersion space LS can be formed. The member B1 and the member B2 move in the vertical plane (in the XY plane) to the optical axis (the Z axis) of the last optical element 12.

The side surface of the member B1 includes a first area which is positioned at a first distance D1 from the side surface of the member B2, and which the side surface of the member B2 can face, and a second area A2 which is arranged adjacent to the first area A1 and is positioned at a second distance D2 longer than the first distance D1 from the side surface of the member B2. The first area A1 and the second area A2 are adjacent to each other in the XY plane. The first area A1 and the second area A2 are alternately arranged in the XY plane.

A dimension W1 of the first area A1 in the XY plane is smaller than a distance Da between the first area A1 and the second area A2. Furthermore, a dimension W2 of the second area A2 is smaller than the distance Da.

A distance (a pitch) R1 of the adjacent first area A1 is smaller than the distance Da. A distance (a pitch) R2 of the adjacent second area A2 is smaller than the distance Da.

Furthermore, the member B2 may have the first and second areas A1 and A2, and both of the member B1 and the member B2 may have the first and second areas A1 an A2.

As a result, even though the member B1 and the member B2 move in the XY plane with respect to the last optical element 12 and the liquid immersion member 7, for example, in such a manner that the liquid immersion space LS moves from the member B1 to the member B2, the remaining of the liquid LQ on the members B1 and B2 is suppressed. Furthermore, even though the member B1 and the member B2 move in the XY plane with respect to the last optical element 12 and the liquid immersion member 7, in such a manner that the liquid immersion space LS moves from the member B2 to the member B1, the remaining of the liquid LQ on the members B1 and B2 is suppressed.

Here, a cleaning sequence for cleaning the porous member 80 described above is described. Furthermore, it goes without saying that the following cleaning sequence can be applied in the same way to the porous member (for example, the porous member 800D and the like) in each embodiment described above. Furthermore, the cleaning sequence can be used, when cleaning the cover member (T and the like) and the scale member (GT and the like) which are held by the substrate stage, the cover member (Q and the like) and the measurement member (C and the like) which are held by the measurement stage, and the like.

The cleaning sequence of the present embodiment may be performed when necessary, for example, such as in a case where defects in the pattern formed on the substrate P by the exposure increase, or in a case where the liquid remaining behind on an outer edge portion of the upper surface of the exposed substrate P increases.

The cleaning sequence of the present embodiment includes a process of supplying liquid LC for cleaning, and a process of supplying liquid for rinse (flushing) after performing the cleaning using the liquid LC. Furthermore, processes other than the process of supplying the liquid LC for cleaning and the process of supplying the liquid for rinse may be properly added. Furthermore, the process of supplying the liquid for rinse may be omitted.

Alkaine liquid may be used as the liquid LC for cleaning. For example, the liquid LC may include tetramethyl ammonium hydroxide (TMAH:tetramethyl ammonium hydroxide). For example, tetramethyl ammonium hydroxide (TMAH:tetramethyl ammonium hydroxide) water solution may be used as the liquid LC.

Furthermore, acid liquid may be used as the liquid LC. For example, the liquid LC may include hydrogen peroxide. For example, hydrogen peroxide water solution (hydrogen peroxide water) may be as the liquid LC.

Furthermore, inorganic alkali solution, such as sodium hydroxide, and potassium hydroxide, and organic alkali solution, such as trimethyl hydroxide (2-hydroxyethyl), may be used as the liquid LC. Furthermore, ammonia water may be used as the liquid LC. Furthermore, the liquid LC may include buffered hydrofluoric acid solution. Furthermore, the liquid LC may include buffered hydrofluoric acid and hydrogen peroxide. Buffered hydrofluoric acid (buffer hydrofluoric acid) is a mixture of hydrofluoric acid and ammonium fluoride. Furthermore, ozone liquid including ozone may be used as the liquid LC. Furthermore, a solution including hydrogen peroxide and ozone may be used as the liquid LC. Furthermore, the liquid LQ for exposure, described above may be used as the liquid for cleaning.

The same liquid as the liquid LQ used for exposure, described above, may be used as the liquid for rinse. In the present embodiment, water (purified water) is used as the liquid for rinse.

When the cleaning sequence in the present embodiment is performed, a dummy substrate DP may be held by the first holding portion 31. The dummy substrate DP is a substrate from which a contaminating material is more unlikely to be released than the substrate P for manufacturing the device. For example a semiconductor wafer may be used as the dummy substrate DP. For example, the semiconductor wafer may be used on which a photo-sensitive film is not formed, and on which a film liquid-repellent with respect to the liquid LC (LQ) is formed. Furthermore, for example, a metal substrate may be used as the dummy substrate DP.

In the above-described cleaning sequence, the liquid LC is supplied to a space which the lower surface 14 of the liquid immersion member 7 faces, in such a manner that the liquid immersion space of the liquid LC for cleaning is formed between the liquid immersion member 7 and the porous member (for example, the porous member 80). The control apparatus 8 performs the operation of supplying the liquid LC for a predetermined time. The predetermined time is, for example, a time period during which a sufficient amount liquid LC is supplied to clean the porous member 80 which is an object to be cleaned. In the present embodiment, when the liquid LC is supplied to a space which the lower surface 14 faces, the dummy substrate DP is held by the first holding portion 31 and the cover member T is held by the second holding portion 32. The liquid LC is supplied to a space which the lower surface 14 faces, in a state in which at least a part of the porous member 80 is arranged at a gap between the dummy substrate DP and the cover member T.

At that time, at least a part of the liquid LC supplied from the liquid immersion member 7 may be recovered through the porous member 80. For example, the control apparatus 8 recovers the liquid LC through pores in the porous member 80 by controlling the fluid suction apparatus 26. As a result, the inside surfaces (the inside of the porous member 80) of the pores in the porous member 80 are cleaned with the liquid LC.

The control apparatus 8 stops supplying the liquid LC after the predetermined time passes from the start of the supply of the liquid LC. As a result, the cleaning using the liquid LC is finished. After the supply of the liquid LC is stopped, the control apparatus 8 continues the recovery using the porous member 80 for the predetermined time and recovers the liquid LC remaining behind in, for example, the gap described above.

After the liquid LC is recovered, the control apparatus 8 supplies the liquid for rinse. In the present embodiment, the liquid LQ for rinse is supplied from the liquid immersion member 7. For example, the liquid LQ may be supplied through the supply port 15 in the liquid immersion member 7, the liquid LQ may be supplied through the recovery port 16, and the liquid LQ may be supplied through the opening provided at the liquid immersion member 7 separately from the supply port 15 and the recovery port 16. When the liquid LQ for rinse is supplied through the liquid immersion member 7, the dummy substrate DP is held by the first holding portion 31.

Furthermore, in the cleaning sequence described above, the object to be cleaned is not limited to the object described above. That is, the cleaning sequence in the present embodiment can be applied to a member which has a possibility to come into contact with the liquid LQ flowing from the gap between the substrate P and the cover member T into the space below the gap.

Furthermore, as described above, the control apparatus 8 includes a computer system including, for example, a CPU and the like.

Furthermore, the control apparatus 8 includes an interface through which communication between the computer system and an outside apparatus can be performed. The storage apparatus 8R includes, for example, a storage medium including memory such as RAM, a hard disk, CD-ROM, and the like. In the storage apparatus 8R, an operating system (OS) controlling the computer system is installed, and a program for controlling the exposure apparatus EX is stored.

Furthermore, an input apparatus to which an input signal can be input can be connected to the control apparatus 8. The input apparatus includes, for example, an input device such as a keyboard and a mouse, or a communication device through which data can be input from an outside apparatus. Furthermore, a display device such as a liquid crystal display device can be provided.

A variety of information including the program, stored in the storage apparatus 8R can be read by the control apparatus 8 (the computer system). In the storage apparatus 8R, the program is stored which causes the control apparatus 8 to perform control of the exposure apparatus EX exposing the substrate P with exposure light EL through the liquid LQ.

According to the above-described embodiment, the program stored in the storage apparatus 8R may cause the control apparatus 8 to perform exposing a substrate, in a state in which a liquid immersion space is formed with the liquid in between an optical member having an emitting surface from which exposure light is emitted and at least one of an upper surface of the substrate which is held by a first holding portion which holds a lower surface of the substrate in such a manner that the lower surface of the substrate can be released, and an upper surface of the first member which defines an opening where the substrate can be arranged and of which at least a part is arranged at the vicinity of the substrate in a state in which the substrate is held by the first holding portion, and recovering at least one of liquid which flows into a gap through a porous member of which at least a part is arranged at the gap between the substrate and a first member, and which has an upper surface liquid-repellent with respect to the liquid.

Furthermore, according to the above-described embodiment, the program stored in the storage apparatus 8R can cause the control apparatus 8 to perform exposing the substrate, moving a substrate which is held by a first holding portion holding a lower surface of the substrate in such a manner that the lower surface of the substrate can be released, and a first member which defines an opening where the substrate can be arranged and of which at least a part is arranged at the vicinity of the substrate in a state in which the substrate is held by a first holding portion, in a state in which a liquid immersion space for liquid is formed with an optical member having an emitting surface from which exposure light is emitted, at the side of the emitting surface of the optical member, and recovering at least part of the liquid which flows into a gap through some of recovery ports among a plurality of recovery ports arranged at the vicinity of at least one of the substrate and the first holding portion, based on any one of or both of a position of the gap between the substrate and the first member with respect to the liquid immersion space and a condition for the gap being moved with respect to the liquid immersion space.

Furthermore, according to the above-described embodiment, the program stored in the storage apparatus 8R can cause the control apparatus 8 to perform exposing a substrate, in a state in which a liquid immersion space is formed with liquid between an optical member having an emitting surface from which exposure light is emitted and at least one of an upper surface of the substrate which is held by a first holding portion holding a lower surface of the substrate in such a manner that the lower surface of the substrate can be released and an upper surface of the first member which defines an opening where the substrate can be arranged and of which at least a part is arranged at the vicinity of the substrate in a state in which the substrate is held by the first holding portion, and recovering at least part of liquid which flows into a gap between the substrate and the first member, through a recovery port arranged at such a manner as to face a side surface of the substrate.

Furthermore, according to the above-described embodiment, the program stored in the storage apparatus 8R can cause the control apparatus 8 to perform exposing a substrate, in a state in which a liquid immersion space is formed with liquid between an optical member having an emitting surface from which exposure light is emitted and at least one of an upper surface of the substrate which is held by a first holding portion holding a lower surface of the substrate in such a manner that the lower surface of the substrate can be released, and an upper surface of the first member which defines an opening where the substrate can be arranged and of which at least a part is arranged at the vicinity of the substrate in a state in which the substrate is held by the first holding portion. In this case, the opening of the first member can include a first area which is positioned at a first distance from the center of the first holding portion, and which a side surface of the substrate held by the first holding portion can face, and a second area which is arranged adjacent to the first area, and is positioned at a second distance longer than the first distance from the center of the first holding portion.

Furthermore, according to the above-described embodiment, the program stored in the storage apparatus 8R can cause the control apparatus 8 to perform exposing a substrate, in a state in which a liquid immersion space is formed with liquid between an optical member having an emitting surface from which exposure light is emitted and at least one of an upper surface of the substrate which is held by a first holding portion holding a lower surface of the substrate in such a manner that the lower surface of the substrate can be released, and an upper surface of the first member which defines an opening where the substrate can be arranged and of which at least a part is arranged at the vicinity of the substrate in a state in which the substrate is held by the first holding portion. In this case, an inside surface of the first member can include a first inside surface and a second inside surface which is arranged above of the first inside surface and which at least a part of the side surface of the substrate faces. The lower end of the second inside surface is linked to the first inside surface, and the upper end is linked to the upper side of the first member. The first inside surface and the second inside surface can be not in parallel, a dimension of the second inside surface can be greater than a dimension of the first inside surface in relation to a normal direction of the upper surface of the first member, and at least the second inside surface can be inclined upward in the outside direction with respect to the center of the first holding portion.

Furthermore, according to the above-described embodiment, the program stored in the storage apparatus 8R can cause the control apparatus 8 to perform exposing a substrate, in a state in which a liquid immersion space is formed with liquid between an optical member having an emitting surface from which exposure light is emitted and at least an upper surface of the substrate which is held by a first holding portion holding a lower surface of the substrate in such a manner that the lower surface of the substrate can be released, and an upper surface of a first member having an upper surface and an edge portion which defines a part of an outer edge of the upper surface. In this case, the edge portion of the first member extends in a predetermined direction in such a manner the edge portion of the substrate held by the first holding portion 31 runs along, and a plurality of protruding portions are formed along the predetermined direction, in the edge portion of the first member.

Furthermore, according to the above-described embodiment, the program stored in the storage apparatus 8R can cause the control apparatus 8 to perform exposing a substrate, in a state in which a liquid immersion space is formed with liquid between an optical member having an emitting surface from which exposure light is emitted and at least one of an upper surface of the substrate which is held by a first holding portion holding a lower surface of the substrate in such a manner that the lower surface of the substrate can be released, and an upper surface of the first member which defines an opening where the substrate can be arranged and of which at least a part is arranged at the vicinity of the upper surface of the substrate in a state in which the substrate is held by the first holding portion. In a case where an inside surface of the first member includes a first inside surface which a side surface of the substrate can face, and a second inside surface which is arranged below the first inside surface and is further separated than the first inside surface with respect to the first holding portion, the program causes the control apparatus 8 to perform recovering at least a part of the liquid which flows into a gap between the substrate and the first member through a porous member of which at least a part is arranged at such a manner as to face the second inside surface.

Furthermore, according to the above-described embodiment, the program stored in the storage apparatus 8R can cause the control apparatus 8 to perform exposing a substrate, in a state in which a liquid immersion space is fonned with liquid between an optical member having an emitting surface from which exposure light is emitted and at least one of an upper surface of the substrate which is held by a first holding portion holding a lower surface of the substrate in such a manner that the lower surface of the substrate can be released, an upper surface of a measurement member which is arranged at at least a part of the vicinity of the first holding portion, and an upper surface of a first member which is provided adjacent to the measurement member, and recovering at least part of the liquid which flows into a gap, and recovering at least a part of the liquid which flows into the gap, through a porous member of which at least a part is arranged at the gap between the measurement member and the first member, and which has a upper surface liquid-repellent with respect to the liquid.

Furthermore, according to the above-described embodiment, the program stored in the storage apparatus 8R can cause the control apparatus 8 to perform exposing the substrate, moving the substrate which is held by a first holding portion holding a lower surface of the substrate in such a manner that the lower surface of the substrate can be released, a measurement member arranged at at least a part of the vicinity of the first holding portion, and a first member provided adjacent to the measurement member, in a state in which a liquid immersion space is formed with an optical member have an emitting surface from which exposure light is emitted, at the side of the emitting surface of the optical member, and recovering at least part of the liquid which flows into a gap through some of recovery ports among a plurality of recovery ports arranged at the gap, based on any one of or both of a position of the gap between the measurement member and the first member with respect to the liquid immersion space, and a condition for the gap being moved with respect to the liquid immersion space.

Furthermore, according to the above-described embodiment, the program stored in the storage apparatus 8R can cause the control apparatus 8 to perform exposing a substrate, in a state in which a liquid immersion space is formed with liquid between an optical member having an emitting surface from which exposure light is emitted and at least one of an upper surface of the substrate which is held by a first holding portion holding a lower surface of the substrate in such a manner that the lower surface of the substrate can be released, an upper surface of a measurement member which is arranged at at least a part of the vicinity of the first holding portion, and an upper surface of a first member which is provided adjacent to the measurement member, and recovering at least part of the liquid which flows into a gap between the measurement member and the first member through a recovery port arranged at such a manner as to face the side surface of the measurement member.

Furthermore, according to the above-described embodiment, the program stored in the storage apparatus 8R can cause the control apparatus 8 to perform exposing a substrate, in a state in which a liquid immersion space is formed with liquid between an optical member having an emitting surface from which exposure light is emitted and at least one of an upper surface of the substrate which is held by a first holding portion holding a lower surface of the substrate in such a manner that the lower surface of the substrate can be released, an upper surface of a measurement member which is arranged at at least a part of the vicinity of the first holding portion, and an upper surface of a first member which is provided adjacent to the measurement member. In this case, a side surface of the first member forming the gap between the side surface of the first member and the measurement member can include a first area which is arranged at a first distance from the center of the measurement member, and which the side surface of the measurement member can face, and a second area which is arranged at a second distance longer than the first distance from the center of the measurement member.

Furthermore, according to the above-described embodiment, the program stored in the storage apparatus 8R can cause the control apparatus 8 to perform exposing a substrate, in a state in which a liquid immersion space is formed with liquid between an optical member having an emitting surface from which exposure light is emitted and at least one of an upper surface of the substrate which is held by a first holding portion holding a lower surface of the substrate in such a manner that the lower surface of the substrate can be released, an upper surface of a measurement member which is arranged at at least a part of the vicinity of the first holding portion, and an upper surface of a first member which is provided adjacent to the measurement member. In this case, an inside surface of the first member can include a first inside surface and a second inside surface which is arranged above of the first inside surface and which at least a part of a side surface of the measurement member faces. The lower end of the second inside surface is linked to the first inside surface, and the upper end is linked to the upper side of the first member. The first inside surface and the second inside surface can be not in parallel, a dimension of the second inside surface can be greater than a dimension of the first inside surface in relation to a normal direction of the upper surface of the first member, and at least the second inside surface can be inclined upward in the outside direction with respect to the center of the measurement member.

Furthermore, according to the above-described embodiment, the program stored in the storage apparatus 8R can cause the control apparatus 8 to perform moving a first member including a first upper surface and a first edge portion defining a part of an outer edge of the first upper surface, below the optical member, in such a manner that at least a part of the first upper surface comes into contact with a liquid immersion space, and moving a second member including a second upper surface and a second edge portion defining a part of an outer edge of the second upper surface, below the optical member. In this case, the first edge portion and the second edge portion extend in a predetermined direction, and a gap can be formed between the first edge portion and the second edge portion and a plurality of protruding portions can be formed at the first edge portion, along the predetermined direction.

By the program stored in the storage apparatus 8R being read by the control apparatus 8, a variety of apparatuses of the exposure apparatus EX, such as the substrate stage 2, the liquid immersion member 7, the drive system 5, and the fluid suction apparatus 26 cooperate to perform a variety of operations such as the liquid immersion exposure of the substrate P, in a state in which the liquid immersion space LS is formed.

Furthermore, in each embodiment described above, a light path K in the emitting direction (at the side of an image surface) of the last optical element 12 of the optical projection system PL is filled with the liquid LQ, but the optical projection system PL can be an optical projection system in which the light path in the incidence direction (at the side of a surface of an object) of the last optical element 12 can be filled with the liquid LQ, for example, as disclosed in PCT International Publication No. 2004/019128.

Furthermore, in each embodiment described above, water is used as the liquid LQ for the exposure, but liquid other than water can be used. As the liquid LQ, the liquid is preferable which has transparency with respect to the exposure light EL, has high refractivity with respect to the exposure light EL, is stable with respect to a film of, for example, photo-sensitive material (a photoresist) forming the surface of the optical projection system PL or the substrate P. For example, hydrofluoroether (HFE), perfluoropolyether (PFPE), or Fomblin (registered trademark) oil can be used as the liquid LQ. Furthermore, a variety of liquid, for example, supercritical fluid can be used as the liquid LQ.

Furthermore, the substrate P in each embodiment described above includes not only a semiconductor wafer for manufacturing a semiconductor device, but also a glass substrate for a display device, a ceramic wafer for a thin film magnetic head, or an original plate (a synthetic quartz and silicon wafer) of a mask or a reticle for use in the exposure apparatus.

In addition to a projection exposure apparatus (a stepper), which uses a step and repeat method in which an entire exposure is performed on a pattern of the mask M in a state in which the mask M and the substrate P are stopped, and the substrate P is moved in a sequential step manner, the exposure apparatus EX can include a scan type exposure apparatus (a scanning stepper), which uses a step and scan method in which a scan exposure is performed on a pattern of the mask M by moving the mask M and the substrate P in a synchronized manner.

Furthermore, in the exposure using the step and repeat method, after a reduction image of a first pattern is transferred onto the substrate P using an optical projection system in a state in which the first pattern and the substrate P are substantially stopped, the entire exposure can be performed on the substrate P, by making a reduction image of a second pattern partly overlap the first pattern using the optical projection system, in a state in which the second pattern and the substrate P are substantially stopped (the entire exposure apparatus using the stitch method). Furthermore, the exposure apparatus using a stitch method can include an exposure apparatus using a step and stitch method in which at least two of the patterns are transferred onto the substrate P in a partly-overlapping manner and the substrate P is sequentially moved.

The present invention can be applied to the exposure apparatus which synthesizes two mask patterns on the substrate through the optical projection system and performs double exposure one shot area on the substrate at substantially the same time by the one-time scan exposure, for example, as disclosed in, the specification of U.S. Pat. No. 6,611,316. Furthermore, the present invention can be applied to a proximity-type exposure apparatus, a mirror projection aligner and the like.

Figure 48:
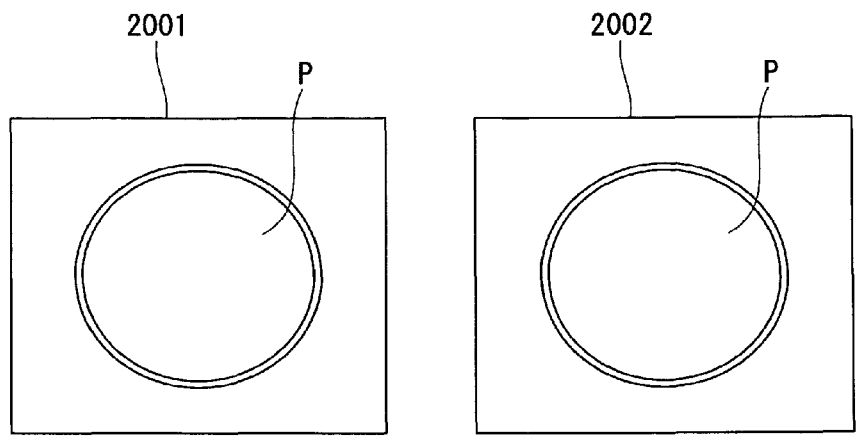
FIG. 48 is a view illustrating one example of a substrate stage.

Furthermore, the present invention can be applied to a twin-stage-type exposure apparatus which includes a plurality of substrate stages, for example, as disclosed in the specification of U.S. Pat. No. 6,341,007, the specification of U.S. Pat. No. 6,208,407, and the specification of U.S. Pat. No. 6,262,796. For example, as shown in FIG. 48, the exposure apparatus EX can include two substrate stages 2001 and 2002. In such a case, an object, which can be arranged in such a manner as to face an emitting surface 13, includes at least one of one substrate stage, the substrate held by the one substrate stage, the other substrate stage, and the substrate held by the other substrate stage.

Furthermore, the present invention can be applied to an exposure apparatus including a plurality of substrate stages and measurement stages.

A variety of exposure apparatuses EX can broadly include an exposure apparatus for manufacturing a liquid crystal display element or a display, an exposure apparatus for manufacturing a thin film head, an imaging element (a CCD), a micro machine, MEMS, a DNA chip, or a reticle or a mask, without being limited to an exposure apparatus for manufacturing a semiconductor element, exposing a semiconductor element pattern on the substrate P.

Furthermore, in the above-described embodiment, an optical transparency mask which forms a predetermined light-blocking pattern (or, a phase pattern light-reduction pattern) on the substrate with optical transparency is used, but instead of this mask, a variable formation mask (also referred to as an electronic mask, an active mask, or an image generator) can be used which forms a transparency pattern or a reflection pattern, or a light-emission pattern based on electronic data on a pattern which has to be exposed, for example, as disclosed in the specification of U.S. Pat. No. 6,778,257. Furthermore, a pattern formation apparatus can be provided which includes a light-emission-type image display element, instead of the variable formation mask including a non-light-emission-type image display element.

In each embodiment described above, the exposure apparatus including the optical projection system PL is described as an example, but the present invention can be applied to an exposure apparatus and an exposure method not using the optical projection system PL. For example, the liquid immersion space can be formed between the optical member such as a lens, and the substrate and the exposure light can expose the substrate with the optical member in between.

Furthermore, the present invention can be applied to an exposure apparatus (a lithography system) which exposes a line and space pattern on the substrate P by forming an interference fringe on the substrate P, as disclosed in PCT Publication No. 2001/035168 pamphlet.

The exposure apparatus EX of the above-described embodiment is manufactured by assembling a variety of sub-systems including each of components in such a manner as to maintain given mechanical precision, electrical precision, and optical precision. To secure various precision, adjustments of various optical systems, adjustments of various mechanical systems, and adjustments of various electrical systems are made to accomplish optical precision, to accomplish mechanical precision and to accomplish electrical precision, respectively, before and after the assembly. A process of assembling various sub-systems into the exposure apparatus includes mechanical connections, wiring connections of electric circuits, pipe connections of atmospheric pressure circuits and the like, for interrelationship among the various sub-systems. It goes without saying that there is an assembly process for each subsystem prior to a process of assembling various subsystems into the exposure apparatus. When the process of assembling the various sub systems into the exposure apparatus is finished, a comprehensive adjustment is made to secure each precision in terms of the whole exposure apparatus. Furthermore, it is preferable that the manufacturing of the exposure apparatus to be done in a cleaning room of which the temperature and cleanness are managed.

Figure 49:
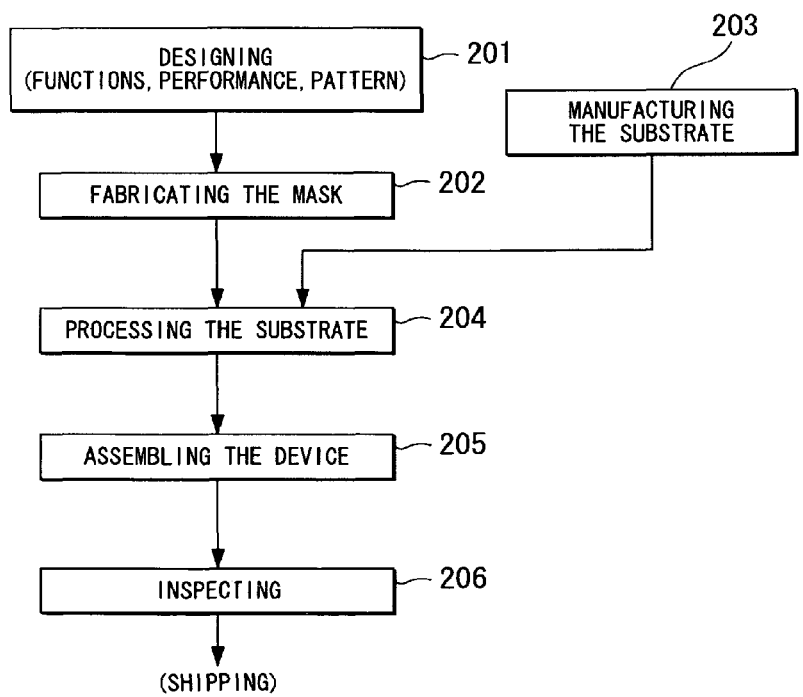
FIG. 49 is a flow chart illustrating one example of a process of manufacturing a device.

As shown in FIG. 49, a micro device such as a semiconductor device is manufactured by performing a step 201 of performing a function performance design, a step 202 of manufacturing a mask (a reticle) based on this design step, a step 203 of manufacturing a substrate which is a base material of the device, a substrate process step 204 of including a substrate process (an exposure process) including exposing the substrate with the exposure light from a pattern of a mask and developing the exposed substrate, a device assembly step 205 (including a process such as a dicing process, a bonding step, and a package step), an inspection step 206 and the like.

Furthermore, requirements for each embodiment described above can be properly combined. Furthermore, some of the components cannot be used. Furthermore, as long as the law permits, all of the disclosures of the Unexamined Publications and U.S Patents as for each embodiment described above and the apparatus referred to as a variation example are incorporated herein by reference into this description.

What is claimed is:

1. An exposure apparatus for exposing an upper surface of a substrate with exposure light through liquid, the exposure apparatus comprising:
   an optical member that has an emitting surface from which the exposure light is emitted; and
   a substrate holding apparatus having a holding portion that releasably holds a lower surface of the substrate, and an upper surface provided around the holding portion, wherein
   the upper surface of the substrate holding apparatus is configured such that the upper surface of the substrate holding apparatus and the upper surface of the substrate held by the holding portion are substantially in a plane,
   the upper surface of the substrate holding apparatus has a jagged edge portion, and
   the substrate is held by the holding portion such that an edge portion of the substrate held by the holding portion is located adjacent to the jagged edge portion of the upper surface of the substrate holding apparatus.

2. An exposure apparatus for exposing an upper surface of a substrate with exposure light through liquid, the exposure apparatus comprising:
   an optical member that has an emitting surface from which the exposure light is emitted; and
   a substrate holding apparatus having a holding portion that releasably holds a lower surface of the substrate, and an upper surface provided around the holding portion, wherein
   the upper surface of the substrate holding apparatus is configured such that the upper surface of the substrate holding apparatus and the upper surface of the substrate held by the holding portion are substantially in a plane,
   the upper surface of the substrate holding apparatus has an undulating edge portion, and
   the substrate is held by the holding portion such that an edge portion of the substrate held by the holding portion is located adjacent to the undulating edge portion of the upper surface of the substrate holding apparatus.

3. The exposure apparatus according to claim 1, wherein the jagged edge portion includes a series of alternating peaks and valleys.

4. The exposure apparatus according to claim 3, wherein the peaks are located a first distance from a center of the holding portion,
   the valleys are located a second distance from the center of the holding portion, and
   the second distance is greater than the first distance.

5. The exposure apparatus according to claim 1, wherein the jagged edge portion is configured to form a gap between the jagged edge portion and the edge portion of the substrate held by the holding portion.

6. The exposure apparatus according to claim 2, wherein the undulating edge portion includes a series of alternating peaks and valleys.

7. The exposure apparatus according to claim 6, wherein the peaks are located a first distance from a center of the holding portion,
   the valleys are located a second distance from the center of the holding portion, and
   the second distance is greater than the first distance.

8. The exposure apparatus according to claim 6, wherein the peaks include a curved surface.

9. The exposure apparatus according to claim 6, wherein the peaks include a flat surface.

10. The exposure apparatus according to claim 6, wherein the peaks are defined by two side surfaces that intersect each other.

11. The exposure apparatus according to claim 6, wherein a first distance between adjacent ones of the peaks is greater than a second distance between each of the peaks and each of the valleys.

12. The exposure apparatus according to claim 6, wherein the valleys include a curved surface.

13. The exposure apparatus according to claim 6, wherein the valleys include a flat surface.

14. The exposure apparatus according to claim 6, wherein the valleys are defined by two side surfaces that intersect each other.

15. The exposure apparatus according to claim 6, wherein side surfaces extend between each of the peaks and each of the valleys.

16. The exposure apparatus according to claim 15, wherein the side surfaces are straight.

17. The exposure apparatus according to claim 15, wherein the side surfaces are curved.

18. The exposure apparatus according to claim 15, wherein the side surfaces that define each of the valleys are parallel to each other.

19. The exposure apparatus according to claim 15, wherein the side surfaces that define each of the valleys extend in intersecting directions.

20. The exposure apparatus according to claim 2, wherein the undulating edge portion is configured to form a gap between the undulating edge portion and the edge portion of the substrate held by the holding portion.

21. An exposure apparatus for exposing an upper surface of a substrate with exposure light through liquid, the exposure apparatus comprising:
an optical member that has an emitting surface from which the exposure light is emitted; and
a substrate holding apparatus having a holding portion that releasably holds a lower surface of the substrate, and an upper surface provided around the holding portion, wherein
the upper surface of the substrate holding apparatus is configured such that the upper surface of the substrate holding apparatus and the upper surface of the substrate held by the holding portion are substantially in a plane,
an edge of the upper surface of the substrate holding apparatus that is adjacent to the substrate held by the holding portion is shaped so as to form a gap between the edge and a periphery of the substrate held by the holding portion, and
a size of the gap varies around the periphery of the substrate.

22. The exposure apparatus according to claim 21, wherein the edge of the upper surface of the substrate holding apparatus includes a plurality of protrusions arranged at a regular interval along the edge.

23. The exposure apparatus according to claim 21, wherein the edge of the upper surface of the substrate holding apparatus is arranged at a vicinity of the holding portion.

24. The exposure apparatus according to claim 21, wherein the edge of the upper surface of the substrate holding apparatus defines an opening where the substrate can be arranged.

25. The exposure apparatus according to claim 21, wherein the upper surface of the substrate holding apparatus is arranged at a vicinity of the upper surface of the substrate held by the holding portion.

26. The exposure apparatus according to claim 22, wherein the protrusions alternate with valleys.

27. An exposure apparatus for irradiating an upper surface of a substrate with exposure light through liquid in a liquid immersion space formed at an emitting surface of an optical member, the exposure apparatus comprising:
a first member having a first upper surface with a first edge, the first member is movable below the optical member so that at least a part of the first upper surface comes into contact with the liquid immersion space; and
a second member having a second upper surface with a second edge, the second member is movable below the optical member so that at least a part of the second upper surface comes into contact with the liquid immersion space, wherein
the first edge and the second edge oppose each other and extend in a predetermined direction,
a gap is formed between the first edge and the second edge, and
the first edge includes a plurality of protrusions that protrude toward the second edge.

28. The exposure apparatus according to claim 27, wherein the plurality of protrusions are arranged at a regular interval along the first edge.

29. The exposure apparatus according to claim 27, wherein the first upper surface and the second upper surface are arranged side-by-side with the gap between the first upper surface and the second upper surface.

30. The exposure apparatus according to claim 29, wherein the predetermined direction is a straight line.

31. The exposure apparatus according to claim 29, wherein the second upper surface is arranged at a vicinity of the first upper surface.

32. The exposure apparatus according to claim 27, wherein the first member is a measurement member.

33. The exposure apparatus according to claim 27, wherein the second member is a measurement member.

34. The exposure apparatus according to claim 27, wherein the upper surface of the first member comprises an upper surface of the protrusions.

35. The exposure apparatus according to claim 27, wherein the protrusions alternate with valleys.

36. The exposure apparatus according to claim 27, wherein a second plurality of protrusions are formed at the second edge.

37. An exposure method of irradiating an upper surface of a substrate with exposure light through liquid, the method comprising:
exposing the substrate, in a state in which a liquid immersion space of the liquid is formed between an optical member that has an emitting surface from which the exposure light is emitted, and at least one of (i) the upper surface of the substrate held by a first holding portion that releasably holds a lower surface of the substrate and (ii) an upper surface of a first member that surrounds the first holding portion, the upper surface of the first member having an edge that extends around and opposes an outer periphery of the substrate held by the first holding portion,
wherein the edge of the upper surface of the first member includes a plurality of protrusions that protrude toward the first holding portion.

38. An exposure method of irradiating an upper surface of a substrate with exposure light through liquid in a liquid immersion space formed at an emitting surface of an optical member, the method comprising:

moving a first member having a first upper surface with a first edge below the optical member so that at least a part of the first upper surface comes into contact with the liquid immersion space; and moving a second member having a second upper surface with a second edge below the optical member so that at least a part of the second upper surface comes into contact with the liquid immersion space, wherein the first edge and the second edge oppose each other and extend in a predetermined direction, a gap is formed between the first edge and the second edge, and the first edge includes a plurality of protrusions that protrude toward the second edge.

39. An exposure apparatus for exposing an upper surface of a substrate with exposure light through liquid, the exposure apparatus comprising:

an optical member that has an emitting surface from which the exposure light is emitted; and a substrate holding apparatus having a holding portion that releasably holds a lower surface of the substrate, and an upper surface of the substrate holding apparatus provided around the holding portion, wherein the upper surface of the substrate holding apparatus is configured such that the upper surface of the substrate holding apparatus and the upper surface of the substrate held by the holding portion are substantially in a plane, an edge of the upper surface of the substrate holding apparatus extends around and opposes an outer periphery of the substrate held by the holding portion, and the edge of the upper surface of the substrate holding apparatus includes a plurality of protrusions that protrude toward the holding portion.

40. The exposure apparatus according to claim 39, wherein the plurality of protrusions are arranged at a regular interval along the edge of the upper surface of the substrate holding apparatus.

41. The exposure apparatus according to claim 39, wherein the edge of the upper surface of the substrate holding apparatus is configured to form a gap between the edge of the upper surface of the substrate holding apparatus and the outer periphery of the substrate held by the holding portion.

42. The exposure apparatus according to claim 39, wherein the edge of the upper surface of the substrate holding apparatus is arranged at a vicinity of the holding portion.

43. The exposure apparatus according to claim 39, wherein the edge of the upper surface of the substrate holding apparatus defines an opening where the substrate can be arranged.

44. The exposure apparatus according to claim 39, wherein the upper surface of the substrate holding apparatus is arranged at a vicinity of the upper surface of the substrate held by the holding portion.

45. The exposure apparatus according to claim 39, wherein the protrusions alternate with valleys.

46. An exposure method of exposing an upper surface of a substrate with exposure light through liquid, the exposure method comprising:

exposing the substrate, in a state in which a liquid immersion space of the liquid is formed between an optical member that has an emitting surface from which the exposure light is emitted, and at least one of (i) the upper surface of the substrate held by a holding portion of a substrate holding apparatus that releasably holds a lower surface of the substrate and (ii) an upper surface of the substrate holding apparatus that surrounds the holding portion, the upper surface of the substrate holding apparatus having an edge that extends around and opposes an outer periphery of the substrate held by the holding portion, wherein the upper surface of the substrate holding apparatus is configured such that the upper surface of the substrate holding apparatus and the upper surface of the substrate held by the holding portion are substantially in a plane, and the edge of the upper surface of the substrate holding apparatus includes a plurality of protrusions that protrude toward the holding portion.

47. The exposure method according to claim 46, wherein the plurality of protrusions are arranged at a regular interval along the edge of the upper surface of the substrate holding apparatus.

48. The exposure method according to claim 46, wherein the edge of the upper surface of the substrate holding apparatus is configured to form a gap between the edge of the upper surface of the substrate holding apparatus and the outer periphery of the substrate held by the holding portion.

49. The exposure method according to claim 46, wherein the edge of the upper surface of the substrate holding apparatus is arranged at a vicinity of the holding portion.

50. The exposure method according to claim 46, wherein the edge of the upper surface of the substrate holding apparatus defines an opening where the substrate can be arranged.

51. The exposure method according to claim 46, wherein the upper surface of the substrate holding apparatus is arranged at a vicinity of the upper surface of the substrate held by the holding portion.

52. The exposure method according to claim 46, wherein the protrusions alternate with valleys.

* * * * *